US007402374B2

(12) United States Patent
Oohashi et al.

(10) Patent No.: US 7,402,374 B2
(45) Date of Patent: Jul. 22, 2008

(54) METHOD FOR COLORED IMAGE FORMATION

(75) Inventors: Hidekazu Oohashi, Shizuoka (JP); Kazuto Kunita, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/138,538

(22) Filed: May 27, 2005

(65) Prior Publication Data

US 2005/0271981 A1 Dec. 8, 2005

(30) Foreign Application Priority Data

May 31, 2004 (JP) .......................... P.2004-161778
May 31, 2004 (JP) .......................... P.2004-161823

(51) Int. Cl.
*G03F 7/00* (2006.01)
*G03F 7/004* (2006.01)

(52) U.S. Cl. ..................... 430/270.1; 430/302; 430/303

(58) Field of Classification Search .............. 430/270.1, 430/302, 303
See application file for complete search history.

(56) References Cited

U.S. PATENT DOCUMENTS

| | | | | |
|---|---|---|---|---|
| 6,228,559 | B1 * | 5/2001 | Oda | 430/272.1 |
| 6,303,267 | B1 * | 10/2001 | Benzing et al. | 430/270.1 |
| 6,703,185 | B2 * | 3/2004 | Hoshi | 430/302 |
| 6,808,863 | B2 * | 10/2004 | Kita | 430/273.1 |
| 6,846,614 | B2 * | 1/2005 | Timpe et al. | 430/281.1 |
| 6,864,040 | B2 * | 3/2005 | Muller et al. | 430/287.1 |
| 2001/0039116 | A1 * | 11/2001 | Takeshima et al. | 438/689 |
| 2003/0068575 | A1 | 4/2003 | Yanaka | |
| 2003/0184613 | A1 * | 10/2003 | Nakamura et al. | 347/40 |
| 2006/0269874 | A1 * | 11/2006 | Huang et al. | 430/302 |

FOREIGN PATENT DOCUMENTS

| | | | |
|---|---|---|---|
| EP | 0 794 055 | A2 | 9/1997 |
| EP | 1 036 654 | A1 | 9/2000 |
| JP | 2000-211262 | A | 8/2000 |
| JP | 2001-277740 | A | 10/2001 |
| JP | 2002-29162 | A | 1/2002 |
| JP | 2002-137562 | A | 5/2002 |
| WO | WO-03/062924 | A1 | 7/2003 |

* cited by examiner

*Primary Examiner*—Amanda C. Walke
(74) *Attorney, Agent, or Firm*—Birch, Stewart, Kolasch & Birch, LLP

(57) ABSTRACT

A method for forming a colored image with good visibility on a lithographic printing plate precursor by exposure to a laser light, particularly, a method for forming a colored image with good visibility on a lithographic printing plate precursor which is developable on a printing press, the method for forming a colored image comprising: exposing a lithographic printing plate precursor to a laser light; and heating or exposing the entire lithographic printing plate to form a colored image, wherein the lithographic printing precursor comprises a support and a photosensitive-thermosensitive layer capable of recording an image by exposure to an infrared laser, the photosensitive-thermosensitive layer containing an infrared absorbent and a discoloring material that undergoes color change upon exposure.

17 Claims, No Drawings

METHOD FOR COLORED IMAGE FORMATION

BACKGROUND OF THE INVENTION

1. Field of the Invention

The present invention relates to a method for colored image formation by which a colored image is formed on a lithographic printing plate precursor. More specifically, the invention relates to a method for forming a colored image having good visibility on a lithographic printing plate precursor, and in particular, to a method for colored image formation to form a colored image having good visibility on a lithographic printing plate that is capable of being developed on a printing press.

2. Background Art

A lithographic printing plate in general consists of an oleophilic image area of receiving an ink in the printing process and a hydrophilic non-image area of receiving a fountain solution. Conventional lithographic printing plates are usually produced by mask-exposing a PS plate which has a layer of an oleophilic photosensitive resin provided on a hydrophilic support through a lith film, and then removing by dissolution the non-image area in a developer.

In recent years, image is electronically processed, saved and output by a computer as digital information. Thus, the processing of image formation in accordance with digitized image information is preferably carried out such that an image is directly formed by scan-exposing lithographic printing plate precursor using a highly oriented active radiant ray such as laser light, with no intervention of a lith film. This technique of plate-making a printing plate from digitized image information as such with no intervention of a lith film is referred to as the computer-to-plate (CTP) technique.

When the method for making a printing plate by means of a conventional PS plate is attempted in the way of the CTP technique, there is a problem that the wavelength range of the laser light and the photosensitive wavelength range of the photosensitive resin do not match.

Further, in a conventional PS plate, the step of dissolving and removing the non-image area after exposure (development processing) is indispensable. Moreover, there has been required a post-treatment step of washing the developed printing plate, treating the plate with a rinsing solution containing surfactants, or treating the plate with a desensitizing solution containing gum arabic or a starch derivative. This problem of necessitating such additional wet processing has been a significant problem for the conventional PS plate to be solved. Even though the first half of the plate-making process (image forming process) has been simplified by the digital processing, the effect of simplification is still insufficient with the later half involving the complicated wet processing (development processing).

In particular, consideration for global environment is recently a great concern to the entire industry. In view of consideration for global environment, too, the post-treatment involving wet processing should be preferably simplified or modified to dry processing.

Therefore, as one way of dispensing the treatment steps, a method called on-press development has been proposed, wherein an exposed printing plate precursor is loaded on the cylinder of a printing press, and a fountain solution and an ink are supplied while rotating the cylinder, to remove the non-image area of the printing plate precursor. That is, it is a method in which an exposed printing plate precursor is loaded on a printing press as such, and the processing is completed in the course of conventional printing operation.

The lithographic printing plate precursor suitable for such on-press development is required to have a photosensitive layer which is soluble in a fountain solution or an ink solvent, and to have lightroom handlability appropriate for developing on a printing press placed in lightroom.

It has been substantially impossible to satisfy such requirements with the conventional PS plates.

Therefore, in order to satisfy such requirements, there has been proposed a lithographic printing plate precursor having a photosensitive layer in which fine particles of a thermoplastic hydrophobic polymer are dispersed in a hydrophilic binder polymer, provided on a hydrophilic support (for example, see Patent Document 1: Japanese Patent Laid-Open No. 2001-277740). The printing precursor can be subjected to image formation through coalescence (fusion) of the thermoplastic hydrophobic polymer fine particles with the heat generated by photo-thermal transition upon exposure to an infrared laser during the plate-making process, subsequently loaded on the cylinder of a printing press, and then on-press developed supplying at least one of a fountain solution and an ink. Since this lithographic printing plate precursor has its photosensitive band in the region of infrared, it shows handlability in lightroom.

However, the image formed through coalescence (fusion) of the thermoplastic hydrophobic polymer fine particles has insufficient strength and thus has a problem in the press life as a printing plate.

Further, in place of thermoplastic fine particles, a lithographic printing plate precursor containing microcapsules which encapsulate a polymerizable compound has been proposed (for example, see Patent Documents 2 to 7: Japanese Patent Laid-Open No. 2000-211262, Japanese Patent Laid-Open No. 2001-277740, Japanese Patent Laid Open No. 2002-29162, Japanese Patent Laid-Open No. 2002-46361, Japanese Patent Laid-Open No. 2002-137562, and Japanese Patent Laid-Open No. 2002-326470, respectively). The printing precursor according to such proposal is advantageous in that the polymeric image formed by reaction of the polymerizable compound has higher strength than the image formed by fusion of fine particles.

In addition, since the polymerizable compound has high reactivity, there have been proposed a number of methods to segregate the compound using microcapsules (for example, see Patent Documents 2 to 7). It has been also proposed to use a thermodegradable polymer for the microcapsule shell.

However, with the lithographic printing plate precursor of the background art as described in Patent Documents 2 to 7, it has been difficult to confirm the image formed by exposure to laser light on the printing plate. For this reason, there has been the possibility of having a problem that the top and the bottom of the printing plate is reversed on the printing press, or that it is not known whether there would be a displacement in the image until printing is completed. Thus, it is desired to further improve the visibility.

SUMMARY OF THE INVENTION

Therefore, it is an object of the invention to provide a method for forming a colored image with good visibility on a lithographic printing plate precursor by exposure to laser light, and in particular, a method for colored image formation to form a colored image having good visibility on a lithographic printing plate precursor that is capable of being developed on a printing press.

The inventors have made extensive studies on the above-described problem and have found that the problem can be solved by a method of using a lithographic printing plate precursor having a photosensitive-thermosensitive layer and coping with an infrared laser, characterized in that the layer contains, on a hydrophilic support, at least 1) an infrared absorbent and 2) a discoloring material which generates color changes in the exposed area and the unexposed area, to form a colored image by heating or exposing the entire printing precursor after exposure to a laser light, thus achieving the invention.

Therefore, the invention provides the following:

1. A method for colored image formation, which comprises: exposing a lithographic printing plate precursor to a laser light; and heating the entire lithographic printing plate to form a colored image, wherein the lithographic printing precursor comprises a support and a photosensitive-thermosensitive layer capable of recording an image by exposure to an infrared laser, the photosensitive-thermosensitive layer containing an infrared absorbent and a discoloring material that undergoes color change upon exposure.

2. A method for colored image formation, which comprises: exposing a lithographic printing plate precursor to a laser light; and exposing the entire lithographic printing plate to form a colored image, wherein the lithographic printing precursor comprises a support and a photosensitive-thermosensitive layer capable of recording an image by exposure to an infrared laser, the photosensitive-thermosensitive layer containing an infrared absorbent and a discoloring material that undergoes color change upon exposure.

3. The method for colored image formation according to the above item 1, wherein the photosensitive-thermosensitive layer comprises a radical-polymerizable compound and a radical polymerization initiator.

4. The method for colored image formation according to the above item 2, wherein the photosensitive-thermosensitive layer comprises a radical-polymerizable compound and a radical polymerization initiator.

5. The method for colored image formation according to the above item 1, which comprises a radical-polymerizable compound and a radical polymerization initiator between the support and the photosensitive-thermosensitive layer.

6. The method for colored image formation according to the above item 2, which comprises a radical-polymerizable compound and a radical polymerization initiator between the support and the photosensitive-thermosensitive layer.

7. The method for colored image formation according to the above item 1, wherein the lithographic printing plate precursor is a lithographic printing plate precursor capable of performing a printing by loading on a printing press without passing through a development processing step after recording an image, or by recording an image after loading on a printing press.

8. The method for colored image formation according to the above item 2, wherein the lithographic printing plate precursor is a lithographic printing plate precursor capable of performing a printing by loading on a printing press without passing through a development processing step after recording an image, or by recording an image after loading on a printing press.

9. The method for colored image formation according to the above item 1, wherein the discoloring material contains an acid generator, an acid amplifier and an acid discoloring agent.

10. The method for colored image formation according to the above item 1, wherein the discoloring material contains a base generator, a base amplifier and a base discoloring agent.

11. The method for colored image formation according to the above item 2, wherein the discoloring material contains a radical discoloring agent and a thermodegradable radical generator precursor.

According to the method for colored image formation of the invention, it is possible to form a colored image having good visibility on a lithographic printing plate by means of exposure to a laser light and in particular, to form a colored image having good visibility on a lithographic printing plate precursor that is capable of being developed on a printing press.

DETAILED DESCRIPTION OF THE INVENTION

Hereinafter, the method for colored image formation of the invention will be explained in detail.

The method for colored image formation of the invention is characterized in that a colored image is formed by imagewise exposing to a laser light, a lithographic printing plate precursor (hereinafter, occasionally referred to as only "plate precursor") which comprises a support and a photosensitive-thermosensitive layer containing an infrared absorbent and a discoloring material that undergoes color change upon exposure and is capable of recording an image by exposure to an infrared laser, and then heating or exposing the entire plate to form a colored image.

Now, explanations will be first given on the process of exposing a printing precursor to a laser light, the process of heating the entire plate and the process of exposing the entire plate, and further on the printing method, and an explanation on the lithographic printing plate precursor used in the invention.

[Exposure to a Laser Light]

The term exposure to a laser light as used in the invention means exposure to an infrared laser, and imagewise exposure is carried out by laser irradiation.

The infrared laser used in this case is not particularly limited, but it may suitably include solid lasers and semiconductor lasers radiating an infrared ray at a wavelength of from 760 to 1200 nm. The output of the infrared laser is preferably 100 mW or more. Also, in order to shorten the exposure time, it is preferred to use a multi-beam laser device.

The exposure time per one picture element is preferably 20 μs or less. Further, the amount of energy irradiated is preferably from 10 to 300 $mJ/cm^2$.

[Heating of the Entire Plate]

According to one embodiment of the method of the invention, the entire printing plate precursor is heated after exposure to an infrared laser. This operation results in the formation of a clear colored image on the printing plate precursor. This leads to good visibility, and thus the exposed image on the printing plate can be confirmed prior to printing.

Although this heating of the entire plate can be carried out under any conditions (temperature and time) as long as the above-mentioned effect can be obtained, the heating temperature is preferably 80° C. or higher, and more preferably 100° C. or higher. When this temperature is 80° C. or higher, clear colored images can be formed. Also, the upper limit temperature of the heating is preferably a temperature at which the components constituting the printing plate precursor do not generate any unnecessary thermal decomposition or thermal reaction, or lower. The temperature is preferably 200° C. or lower, and more preferably 180° C. or lower.

Meanwhile, the heating time is preferably 5 seconds or longer, and more preferably 10 seconds or longer. Heating for 5 seconds or longer allows the formation of a clear colored image. Although there is no upper limit for the heating time, since too long time is not desirable for the processes of plate-making and printing, the time is preferably 5 minutes or shorter, and more preferably 4 minutes or shorter.

Such heating temperature and heating time are appropriately selected so as to make the colored images maximally clear.

The heating of the entire plate may be carried out using any heating apparatus as long as the printing plate precursor can be heated as a whole; however, an apparatus that can heat the entire printing plate uniformly to some degree is preferred. For such heating apparatus, mention may be made of an oven, a hot plate, a thermal head, or a printing press cylinder equipped with a heating unit.

[Exposure of the Entire Plate]

According to another embodiment of the method of the invention, the entire printing plate precursor is exposed after exposure to an infrared laser. This operation results in the formation of a clear colored image on the printing plate precursor. This leads to good visibility, and thus the exposed image on the printing plate can be confirmed prior to printing.

This exposure of the entire plate can be carried out under any conditions (exposure wavelength, amount of exposure and exposure time) as long as the above-mentioned effect can be obtained, and as the components other than the discoloring system of the printing plate precursor are not affected. The exposure wavelength, amount of exposure and exposure time are appropriately selected to maximally exhibit the effect of emphasizing colored images. Inter alia, the exposure wavelength is preferably from 200 nm to 700 nm. The amount of exposure is preferably from 0.1 $mJ/cm^2$ to 500 $mJ/cm^2$, and more preferably from 1 to 400 $mJ/cm^2$. The exposure time may not be defined, given that the amount of exposure is defined. However, it is preferably 5 minutes or shorter, and more preferably 4 minutes or shorter, in connection with the processing time for a printing plate. Exposure of the entire plate may be carried out using any exposing apparatus as long as the printing plate precursor can be exposed as a whole; however, it is preferred to use an apparatus that can expose the entire printing plate uniformly. For the light source for exposure, mention may be made of light energy sources represented by various light sources such as a low-pressure mercury lamp, an intermediate-pressure mercury lamp, a high-pressure mercury lamp, an ultra-high-pressure mercury lamp, a xenon arc lamp, a carbon arc lamp, a metal halide lamp, a fluorescent lamp, a tungsten lamp, an excimer-lamp, an excimer-laser, a nitrogen laser, an argon ion laser, a helium-cadmium laser, a helium-neon laser, a krypton ion laser, various semiconductor lasers, a YAG laser, an emitting diode laser, a CRT light source, a plasma light source or the like, an electron beam source generated by an EB generating apparatus; or the like.

[Printing Method]

According to the invention, it is possible to carry out printing, after the formation of a colored image as described in the above, using a plate precursor having a colored image formed thereon, by supplying an oily ink and an aqueous component without passing through any development processing step.

Specifically, printing can be carried out by a method of exposing the lithographic printing plate precursor to an infrared laser, then heating or exposing the entire plate, and loading the plate on a printing press without passing through a development processing step; a method of loading the lithographic printing plate precursor on a printing press, subsequently exposing the plate precursor to the above-mentioned laser light on the printing press, heating or exposing the entire plate, and then printing without passing through any development processing step; or the like.

For instance, in an embodiment of the negative on-press development type lithographic printing plate precursor, when the lithographic printing plate precursor is imagewise exposed with an infrared laser, the entire plate is heated or exposed, and then printing is performed by supplying an aqueous component and an oily ink without passing through a development processing step such as wet development, etc., the photosensitive-thermosensitive layer cured by exposure forms an oily ink-receiving part having an oleophilic surface in the exposed area of the photosensitive-thermosensitive layer. On the other hand, in the unexposed area, the uncured photosensitive-thermosensitive layer is removed by dissolution or dispersion in the supplied aqueous component and/or oily ink and a hydrophilic surface is revealed in this portion.

As a result, the aqueous component adheres to the revealed hydrophilic surface, and the oily ink adheres to the photosensitive-thermosensitive layer in the exposed region, thereby initiating the printing. Here, the first to be supplied to the plate surface may be either the aqueous component or the oily ink; however, the oily ink preferably supplied first in order to prevent the aqueous component from being contaminated by the photosensitive-thermosensitive layer in the unexposed area. As the aqueous component mid oily ink, a fountain solution and a printing ink for conventional lithographic printing are used, respectively.

Further, since the exposed portion undergoes color change, the visibility is excellent.

As such, the lithographic printing plate precursor according to the invention is on-press developed on an off-set printing press and is used as it is for printing of a plurality of sheets.

[Lithographic Printing Plate Precursor]

Next, an explanation will be given on the lithographic printing plate precursor used in the method for colored image formation of the invention.

The lithographic printing plate precursor used in the invention is, for example, a lithographic printing plate precursor coping with an infrared laser, which comprises a hydrophilic support and a photosensitive-thermosensitive layer formed thereon having an infrared absorbent and a discoloring material that undergoes color change upon exposure.

The above-mentioned lithographic printing plate precursor may be exemplified by a printing plate precursor capable of forming a printing plate without passing through a development processing step, that is, (1) an on-press development type lithographic printing plate precursor and (2) a non-processing (non-development type) lithographic printing plate precursor described below, which is preferably capable of printing as the plate precursor is loaded on a printing press without passing through a development processing step after image recording, or as an image is recorded after loading of the plate precursor on a printing press.

(1) On-press Type Lithographic Printing Plate Precursor:

A lithographic printing plate precursor which has a photosensitive-thermosensitive layer that undergoes a change in the solubility or dispersibility in fountain solution and/or ink upon exposure, or a change in the adhesion to an adjacent layer of different affinity to fountain solution or ink upon exposure, and which is developable by supplying a fountain solution and/or an ink to the plate surface on a printing press after imagewise exposure.

(2) Non-processing (Non-development Type) Lithographic Printing Plate Precursor:

A lithographic printing plate precursor which has a photosensitive-thermosensitive layer that undergoes a change in the affinity to fountain solution or ink at the surface upon exposure, and which is capable of printing without removal of the photosensitive-thermosensitive layer after imagewise exposure.

The above-described lithographic printing plate precursor is not particularly limited, as long as it is one of the preferred lithographic printing plate precursors of (1) and (2) above, However, as described later, since the on-press development type lithographic printing plate precursor does not necessarily have a cross-linked structure in the photosensitive-thermosensitive layer, the discoloring system which generates color change in the photosensitive-thermosensitive layer upon exposure has higher mobility, and thus it is likely that the reactivity of color change be improved. Accordingly, the (1) on-press development type lithographic printing plate precursor is preferred to the (2) non-processing (non-development type) which has a cross-linked structure in the photosensitive-thermosensitive layer.

Specifically, the fundamental structure of the plate material can be employed as described in the specification of Japanese Patent No. 2938397, the publications of JP-A Nos. 2001-277740, 2001-277742, 2002-287334, 2001-96936, 2001-96938, 2001-180141 and 2001-162960, the pamphlets of International Publication Nos. WO 00/16987 and 01/39985, the specifications of EP-A Nos. 990517 and 1225041, and U.S. Pat. No. 6,465,152, the publication of JP-A No. 6-317899, the pamphlet of International Publication No. WO 96/35143, the specification of EP-A No. 652483, the publications of JP-A Nos. 10-10737 and 11-309952, the specifications of U.S. Pat. Nos. 6,017,677 and 6,413,694, and the like.

Next, the constituents of the above-described lithographic printing plate precursor will be explained in detail.

The above-described lithographic printing plate precursor undergoes color change due to heat generation of the infrared absorbent upon exposure to an infrared laser. This color change generates the color difference or the lightness difference, between the exposed are and the unexposed area, or so-called printout image, to obtain good visibility.

(Photosensitive-thermosensitive Layer)

First, the photosensitive-thermosensitive layer will be explained. The photosensitive-thermosensitive layer comprises an infrared absorbent and a discoloring material as the essential constituents, and this layer may be used as the image forming layer, or as some other layer such as the overcoat layer or the like. Preferably, it is a layer having the elements for forming a printed image as described later as the components for image formation.

Hereinafter, the constituents of the photosensitive-thermosensitive layer will be explained.

<Infrared Absorbent>

The infrared absorbent used in the photosensitive-thermosensitive layer of the invention is a component used to enhance the sensitivity to an infrared laser. This infrared absorbent has the function of converting the absorbed infrared ray to heat. The infrared absorbent used in the invention is preferably a dye or a pigment having an absorption maximum at a wavelength range of 760 to 1200 nm.

As for the dye, use can be made of commercially available dyes and those known in the art, for example, those described in publications such as "Handbook of Dyes" (the Society of Organic Synthetic Chemistry, Ed. (1970)), etc. Specifically, mention may be made of azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, metal-thiolate complexes and the like.

Preferred examples of the dye include the cyanine dyes as described in the publications of JP-A Nos. 58-125246, 59-84356 and 60-78787, and the like; the methine dyes as described in JP-A Nos. 58-173696, 58-181690 and 58-194595, and the like; the naphthoquinone dyes as described in the publications of JP-A Nos. 58-112793, 58-224793, 5948187, 59-73996, 60-52940 and 60-63744, and the like; the squarylium dyes as described in the publication of JP-A No. 58-112792 and the like; and the cyanine dyes as described in the specification of GBP No. 434,875; or the like.

Further, the near infrared absorbing sensitizers as described in the specification of U.S. Pat. No. 5,156,938 are suitably used, and also preferably used are the substituted arylbenzo(thio)pyrylium salts as described in the specification of U.S. Pat. No. 3,881,924; the trimethinethiapyrylium salts as described in the publication of JP-A No. 57-142645 (the specification of U.S. Pat. No. 4,327,169); the pyrylium-based compounds as described in the publications of JP-A Nos. 58-181051, 58-220143, 59-41363, 59-84248, 59-84249, 59-146063 and 59-146061; the cyanine dyes as described in the publication of JP-A No. 59-216146; the pentamethinethiopyrylium salts as described in the specification of U.S. Pat. No. 4,283,475 and the like; or the pyrylium compounds as described in the publications of JP-B Nos. 5-13514 and 5-19702. Further, other preferred examples of the dye include the near infrared absorbing dyes represented by Formula (I) and Formula (II) as described in the specification of U.S. Pat. No. 4,756,993.

Further, other preferred examples of the infrared absorbing dyes of the invention include specific indolenine cyanine dyes as described in the publication of JP-A No. 2002-278057, which are illustrated below.

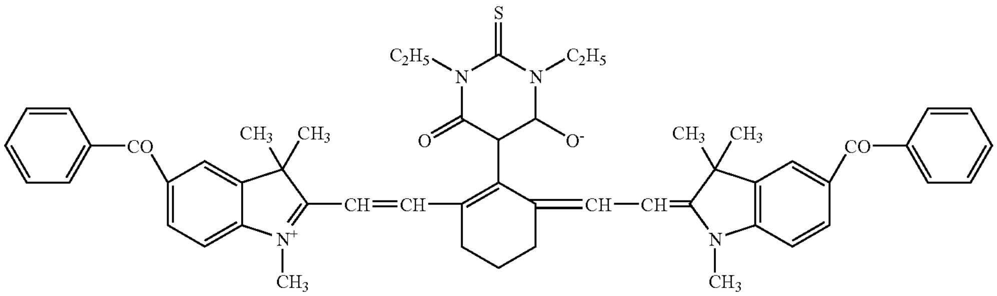

-continued

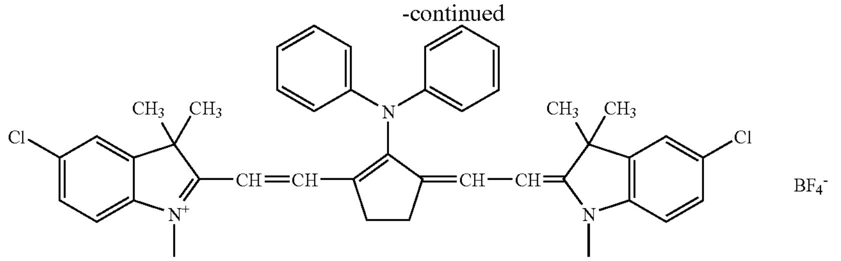

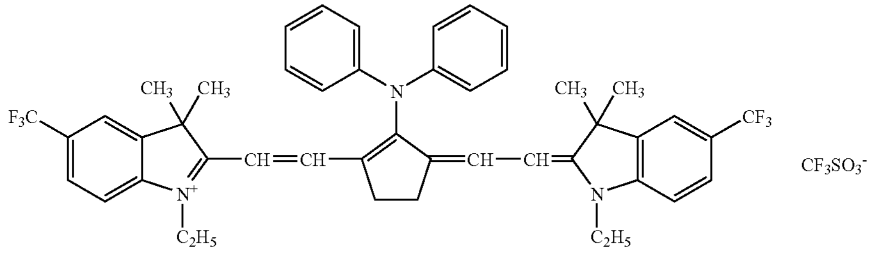

Among these dyes, particularly preferred are cyanine dyes, squarylium dyes, pyrylium salts, nickel thiolate complexes and indolence cyanine dyes. More preferred are cyanine dyes or indolenine cyanine dyes, and still more preferred are cyanine dyes represented by the following Formula (I):

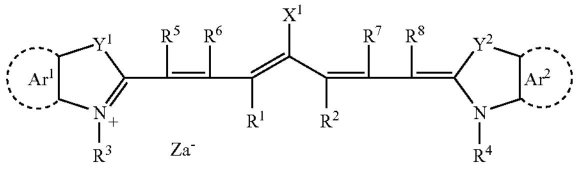

In Formula (I), $X^1$ represents a hydrogen atom, a halogen atom, —$NPh_2$, $X^2$-$L^1$ or a group shown below, wherein $X^2$ represents an oxygen atom, a nitrogen atom or a sulfur atom; $L^1$ represents a hydrocarbon group having 1 to 12 carbon atoms, an aromatic ring having a heteroatom, an a hydrocarbon group having 1 to 12 carbon atoms and containing a heteroatom. In addition, the heteroatom as used herein means N, S, O, a halogen atom or Sc. $Xa^-$ has the same definition as $Za^-$ as described later, and $R^a$ represents a substituent selected from a hydrogen atom, an alkyl group, an aryl group, a substituted or unsubstituted amino group, or a halogen atom.

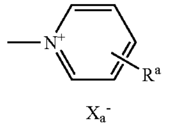

$R^1$ and $R^2$ each independently represent a hydrocarbon group having 1 to 12 carbon atoms. From the perspective of the storage stability of the coating solution for recording layer, $R^1$ and $R^2$ each is preferably a hydrocarbon group having two or more carbon atoms, and $R^1$ and $R^2$ particularly preferably combine with each other to form a 5- or 6-membered ring.

$Ar^1$ and $Ar^2$, which may be the same or different, each represent an optionally substituted aromatic hydrocarbon group. Preferred aromatic hydrocarbon group may be exemplified by a benzene ring and a naphthalene ring. Also, preferred substituent may be exemplified by a hydrocarbon group having up to 12 carbon atoms, a halogen atom, or an alkoxy group having up to 12 carbon atoms. $Y^1$ and $Y^2$, which may be the same or different, each represent a sulfur atom or a dialkylmethylene group having up to 12 carbon atoms. $R^3$ and $R^4$, which may be the same or different, each represent an optionally substituted hydrocarbon group having up to 20 carbon atoms. A preferred substituent may be exemplified by an alkoxy group having up to 12 carbon atoms, a carboxyl group or a sulfo group. $R^5$, $R^6$, $R^7$ and $R^8$, which nay be the same or different, each represent a hydrogen atom or a hydrocarbon group having up to 12 carbon atoms. In view of availability of the material, the substituent is a hydrogen atom. Also, $Za^-$ represents a counter anions but when the cyanine dye represented by Formula (I) has an anionic substituent in the structure and does not require neutralization of electric charge, $Za^-$ is absent. In the aspect of storage stability of the coating solution for recording layer, preferred $Za^-$ is a halogen ion, a perchlorate ion, a tetrafluoroborate ion, a hexafluorophosphate ion and a sulfonate ion, and particularly preferred is a perchlorate ion, a hexafluorophosphate ion and an arylsulfonate ion.

Specific examples of the cyanine dye represented by Formula (I) that can be used suitably in the invention include those described in paragraphs [0017] to [0019] of JP-A No. 2001-133969.

Other particularly preferred examples include the above-mentioned specific indolenine cyanine dyes as described in JP-A No. 2002-278057.

As for the pigment used in the invention, use can be made of commercially available pigments and the pigments described in the Color Index (C.I.) Handbook, (Japan Association of Pigment Technology, ed. (1977)), "Newest Pigment Application Technology" (published by CMC (1986)) and "Printing Ink Technology" (published by CMC (1984)).

The kinds of pigment include black pigments, yellow pigments, orange pigments, brown pigments, red pigments, violet pigments, blue pigments, green pigments, fluorescent pigments, metal powder pigments and polymer bound pigments. Specifically, insoluble azo pigments, azo lake pigments, condensed azo pigments, chelate azo pigments, phthalocyanine-based pigments, anthraquinone-based pigments, perylene- and perynone-based pigments, thioindigo-based pigments, quinacridone-based pigments, dioxazine-based pigments, isoindolidone-based pigments, quinophtlalone-based pigments, dyed lake pigments, azine pigments, nitroso pigments, nitro pigments, natural pigments, fluorescent pigments, inorganic pigments, carbon black or the like may be used. Among these pigments, preferred is carbon black.

These pigments may or may not be surface-treated before use. As the method for surface treatment, a method of coating the surface with a rein or a wax, a method of attaching a surfactant, a method of binding a reactive substance (e.g., a silane coupling agent, an epoxy compound, polyisocyanate, etc.) to the pigment surface or the like may be envisaged. The above-mentioned methods for surface treatment are described in "Properties and Application of Metal Soap" (Saiwai Shobo), "Printing ink Technology" (published by CMC Shuppan (1984)) and "Newest Pigment Application Technology" (published by CMC Shuppan (1986)).

The particle size of the pigment is preferably in a range of from 0.01 μm to 10 μm, more preferably in a range of from 0.05 μm to 1 μm, and particularly preferably in a range of from 0.1 μm to 1 μm. Within these ranges, good stability of the pigment dispersion in the coating solution for photosensitive-thermosensitive layer and good uniformity of the photosensitive-thermosensitive layer can be obtained.

For the method of dispersing the pigment, known dispersion techniques used in the manufacture of an ink, a toner or the like can be used. For the dispersing machine, mention may be made of an ultrasonic dispersing machine, a sand mill, an attritor, a pearl mill, a super-mill, a ball mill, an impeller, a disperser, a KD mill, a colloid mill, a dynatron, a three-roll milt a pressurized kneader and the like. Detailed descriptions can be found in "Newest Pigment Application Technology" (published by CMC Shuppan (1986)).

Such infrared absorbent may be added together with other components in the same layer, or may be added to a layer provided separately from other components in the case where the photosensitive-thermosensitive layer is composed of two or more layers. Also, the infrared absorbent may be encapsulated in a microcapsule and then added.

As for the amount added, the infrared absorbent is added such that when a negative lithographic printing plate precursor is produced, the absorbancy of the photosensitive-thermosensitive layer at the maximum absorption wavelength in the wavelength range of from 760 to 1200 nm preferably is in a range of from 0.3 to 1.2, and more preferably in a range of from 0.4 to 1.1, as measured by a reflection measurement technique. Within these ranges, polymerization reaction proceeds uniformly in the depth direction of the photosensitive-thermosensitive layer, and good film strength in the image area and good adhesion to the support can be achieved.

The absorbancy of the photosensitive-thermosensitive layer can be adjusted by the amount of the infrared absorbent added to the photosensitive-thermosensitive layer and the thickness of the photosensitive-thermosensitive layer. Measurement of the absorbency may be implemented by an ordinary method Examples of such measuring method include a method of forming on a reflective support such as aluminum or the like, a photosensitive-thermosensitive layer of a thickness appropriately decided within a range to yield a dry coated amount required from a lithographic printing plate precursor, and measuring the reflection density with an optical densitometer; a method of measuring the absorbancy by means of spectroscopy according to a reflection technique using an integrating sphere; or the like.

<Discoloring Material Causing Color Change in the Exposed Area and the Unexposed Area>

The discoloring material used in the photosensitive-thermosensitive layer of the invention is a material to cause color change in the exposed area and the unexposed area, and a material which undergoes color change upon exposure to a laser light and subsequent heating of the entire plate or exposure of the entire plate, and thereby generates color change in the exposed area and the unexposed area As long as this requirement is satisfied, a variety of discoloring materials can be used. In the case of beating the entire plate after exposure to a laser light, preferred examples of such discoloring material include (1) a discoloring material including an acid generator, an acid amplifier and an acid discoloring agent, and (2) a discoloring material including a base generator, a base amplifier and a base discoloring agent. In the case of exposing the entire plate after exposure to a laser light, preferred examples of such discoloring material include (3) a discoloring material including a radical discoloring agent and a thermodegradable radical generator precursor.

According to the invention, this component may be contained in the photosensitive-thermosensitive layer, or may be contained in a layer other than the photosensitive-thermosensitive layer, such as an overcoat layer as described later. When the component is contained in a layer other than the photosensitive-thermosensitive layer in a lithographic printing plate precursor, the layer is particularly preferably an overcoat layer. Also, the component can be contained in both the photosensitive-thermosensitive layer and the overcoat layer.

Preferred discoloring materials will be explained below.

(1) Discoloring Material Containing an Acid Generator, an Acid Amplifier and an Acid Discoloring Agent

[Acid Generator]

The acid generator used in the invention is a compound which generates an acid under the action of light or heat, and may be exemplified by the compounds as described in, for example, the paragraphs [0039] to [0063] of the publication of JP-A No. 10-282644.

Specifically, mention may be made of onium salts such as the diazonium salts as described in S. I. Schlesinger, Photogr. Sci. Eng., 18, 387 (1974), T. S. Bal et al., Polymer, 21, 423 (1980) and the like; the ammonium salts as described in the specifications of U.S. Pat. Nos. 4,069,055 and 4,069,056, the publication of JP-A No. 3-140,140 and the like; the phosphonium salts as described in D. C. Necker et al, Macromolecules, 17, 2468 (1984), C. S. Wen et al, Teh Proc. Conf. Rad. Curing ASIA, p. 478, Tokyo, October (1988), the specifications of U.S. Pat. Nos. 4,069,055 and 4,069,056, and the like; the iodonium salts as described in J. V. Crivello et al, Macromolecules, 10(6), 1307 (1977), Chem. & Eng. News, November 28, p. 31 (1988), the specifications of EP 104,143, U.S. Pat. Nos. 339,049 and 410,201, the publications of JP-A Nos. 2-150,848 and 2-296,514, and the like; the sulfonium salts as described in J. V. Crivello et al, Polymer J. 17, 73 (1985), J. V. Crivello et al, J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al Macromolecules, 14(5), 1141 (1981), J. V. Crivello et al, J. Polymer Sci., Polymer Chem. Ed., 17, 2877 (1979), the specifications of IP No. 370,693, U.S. Pat. No. 3,902,114, EP Nos. 233,567, 297,443 and 297,442, U.S. Pat. Nos. 4,933,377, 410,201, 339,049, 4,760,013, 4,734,444 and 2,833,827, DE 2,904,626, 3,604,580 and 3,604,581, and the like; the celenonium salts as described in J. V. Crivello et al, Macromolecules, 10(6), 1307 (1977), J. V. Crivello et al, J. Polymer Sci., Polymer Chem. Ed., 17, 1047 (1979) or the like; the arsonium salts as described in C. S. Wen et al, Teh Proc. Conf. Rad.

Curing ASIA, p. 478, Tokyo, October (1988); the organic halogenated compounds as described in the specification of U.S. Pat. No. 3,905,815, the publications of JP-B No. 46-4605, JP-A Nos. 48-36281, 55-32070, 60-239736, 61-169835, 61-169837, 62-58241, 62-212401, 63-70243 and 63-298339, and the like; the organic metal/organic halogenated compounds as described in K. Meier et al, J. Rad. Curing, 13(4), 26 (1986), T. P. Gill et al, Inorg. Chem., 19, 3007 (1980), D. Astruc, Acc. Chem. Res., 19(12), 377 (1896), the publication of JP-A No. 2-161445 or the like; the photo-acid generators having a protective group of the o-nitrobenzyl type as described in S. Hayase et al, J. Polymer Sci., 25, 753 (1987), E. Reichmanis et al, J. Polymer Sci., Polymer Chem. Ed., 23, 1 (1985), Q. Q. Zhu et al, J. Photochem., 36, 85, 39, 317 (1987), B. Amit et al, Tetrahedron Lett., (24) 2205 (1973), D. H. R Barton et al, J. Chem. Soc., 3571 (1965), P. M. Collins et al, J. Chem. Soc., Perkin I, 1695 (1975), M. Rudinstein et al, Tetrahedron Lett., (17), 1445 (1975), J. W. Walker et al, J. Am. Chem. Soc., 110, 7170 (1988), S. C. Busman et ad, J. Imaging Technol., 11(4), 191 (1985), H. M. Houlihan et al, Macromolecules, 21, 2001 (1988), P. M. Collins et al, J. Chem. Soc., Chem. Commun, 532 (1972), S. Hayase et al, Macromolecules, 18, 1799 (1985), E. Reichmanis et al, J. Electrochem. Soc., Solid State Sci. Technol., 130 (6), F. M. Houihan et al, Macromolecules, 21, 2001 (1988), the specifications of EP Nos. 0,290,750, 046,083, 156,535, 271,851 and 0,388,343, U.S. Pat. Nos. 3,901,710 and 4,181,531, the publications of JP-A Nos. 60-198538 and 53-133022 and the like; the compounds generating sulfonic acid by photodegradation as represented by iminosulfonate or the like as described in M. TUNOOKA et al, Polymer Preprints Japan, 35(8), G. Berner et al, J. Rad. Curing, 13(4), W. J. Mijs et al, Coating Technol., 55(697), 45 (1983), Akzo, H. Adachi et al, Polymer Preprints, Japan, 37(3), the specifications of EP Nos. 0,199,672, 84515, 199,672, 044,115 and 0,101,122, U.S. Pat. Nos. 4,618,564, 4,371,605 and 4,431,774, the publications of JP-A Nos. 64-18143, 2-245756 and 4-365048 and the like; the disulfone compounds as described in the publication of JP-A No. 61-166544 and the like; o-naphthoquinonediazide-4-sulfonic acid halide as described in the publication of JP-A No. 50-36209 (specification of U.S. Pat. No. 3,969,118); or an o-naphthoquinoneazide compound as described in the publication of JP-A No. 55-62444 (specification of GB No. 2038801) or JP-A No. 1-11935.

As other acid generators, cyclohexyl citrate, sulfonic acid alkyl esters such as p-acetaminobenzene sulfonic acid cyclohexyl ester, p-bromobenzene sulfonic acid cyclohexyl ester or the like, and the alkyl sulfonic acid ester represented by the following formula:

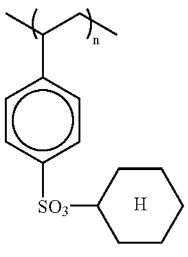,
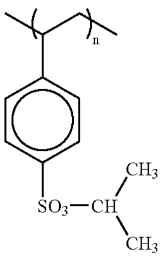

Among the compounds that degrade by the action of light, heat or irradiation and generate an acid, those particularly effectively used ones are listed below.

(1) Oxazole derivatives substituted by a trihalomethyl group represented by the following Formula (PAG1) or S-triazine derivatives represented by Formula (PAG2)

(PAG1)

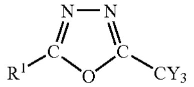

(PAG2)

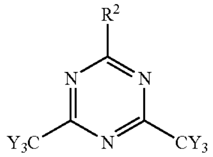

wherein $R^1$ represents a substituted or unsubstituted aryl group or alkenyl group, and $R^2$ represents a substituted or unsubstituted aryl group, alkenyl group, alkyl group or $—CY_3$. Y represents a chlorine atom or a bromine atom. Specific examples of the compound include the following compounds, which are not intended to limit the invention.

(PAG1-1)

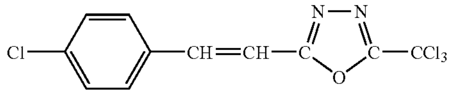

(PAG1-2)

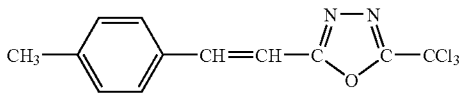

(PAG2-1)

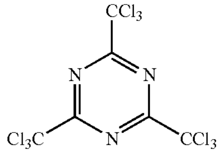

(PAG2-2)

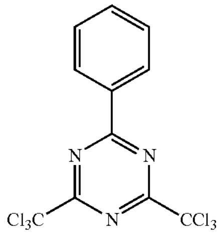

-continued (PAG2-3)

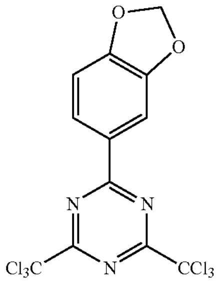

(PAG2-4)

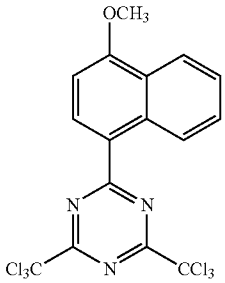

(PAG2-5)

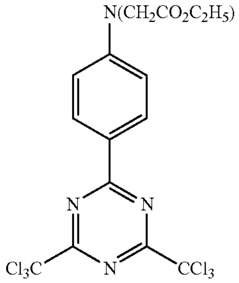

(2) Iodonium salts represented by the following Formula (PAG3), or sulfonium salts represented by Formula (PAG4) or diazonium salts (PAG3)

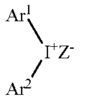

(PAG4)

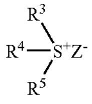

wherein $Ar^1$ and $Ar^2$ each independently represent a substituted or unsubstituted aryl group. Preferred substituents include an alkyl group, a haloalkyl group, a cycloalkyl group, an aryl group, an alkoxy group, a nitro group, a carboxyl group, an alkoxycarbonyl group, a hydroxyl group, a mercapto group and a halogen atom.

$R^3$, $R^4$ and $R^5$ each independently represent a substituted or unsubstituted alkyl group or aryl group, preferably an aryl group having 6 to 14 carbon atoms, an alkyl group having 1 to 8 carbon atoms and substituted derivatives thereof. Preferred substituents for the aryl group include an alkoxy group having 1 to 8 carbon atoms, an alkyl group having 1 to 8 carbon atoms, a nitro group, a carboxyl group, a hydroxyl group and a halogen atom, and preferred substituents for the alkyl group include an alkoxy group having 1 to 8 carbon atoms, a carboxyl group and an alkoxycarbonyl group.

Also, two among $R^3$, $R^4$ and $R^5$, and $Ar^1$ and $Ar^2$ may combine with each other through a single bond or a substituent.

$Z^-$ represents a counter anion and may be exemplified by $BF_4^-$, $AsF_6^-$, $PF_6^-$, $SbF_6^-$, $SiF_6^{2-}$, $ClO_4^-$, a perfluoroalkane sulfonate anion such as $CF_3SO_3^-$, $C_4F_9SO_3^-$, a pentafluorobenzene sulfonate anion, fused multinuclear aromatic sulfonate anion such as a naphthalene-1-sulfonate anion and the like, an anthraquinone sulfonate anion, a dye containing a sulfonic acid group, without being limited to these.

Specific examples include the following compounds, without being limited to these.

(PAG3-1)

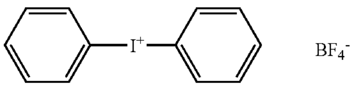

(PAG3-2)

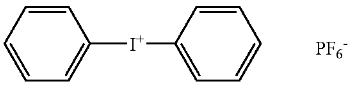

(PAG4-1)

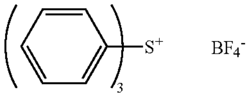

(PAG4-2)

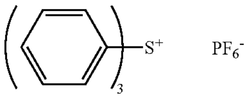

(PAG4-3)

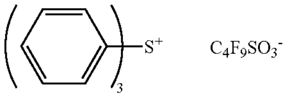

The above-mentioned onium salts represented by Formulae (PAG3) and (PAG4) are known in the art and can be synthesized according to the methods described in, for example, J. W. Knapczyk et al, J. Am. Chem. Soc., 91, 145 (1969), A. L. Maycok et al, J. Org. Chem., 35, 2532, (1970), B. Goethas et al, Bull. Soc. Chem. Belg., 73, 546 (1964), H. M. Leicester, J. Am. Chem. Soc., 51, 3587 (1929), J. V. Crivello et al, J. Polym. Chem. Ed., 18, 2677 (1980), U.S. Pat. Nos. 2,807,648 and 4,247,473, JP-A No. 53-101331, and the like.

(3) Disulfone derivatives represented by the following Formula (PAG5) or iminosulfonate derivatives represented by Formula (PAG6)

$$Ar^3—SO_2—SO_2—Ar^4 \quad \text{(PAG5)}$$

(PAG6)

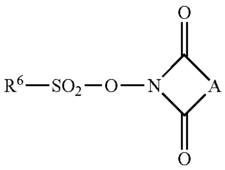

wherein $Ar^3$ and $Ar^4$ each independently represent a substituted or unsubstituted aryl group. $R^6$ represents a substituted or unsubstitute alkyl group or aryl group. A represents a substituted or unsubstituted alkylene group, alkenylene group or arylene group.

Specific examples include the following compounds, without being limited to these.

(PAG5-1)

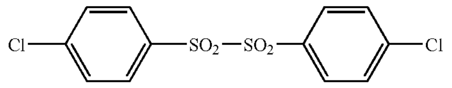

(PAG5-2)

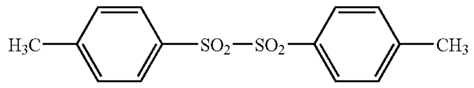

(PAG6-1)

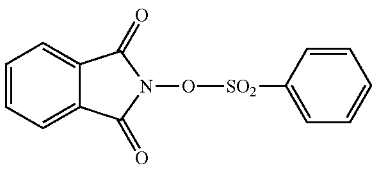

(PAG6-2)

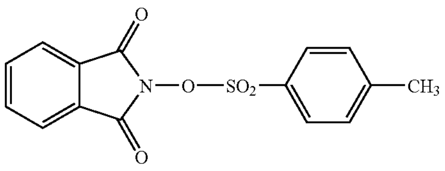

The amount of the acid generator to be used is typically from 0.1 to 50% by weight, and preferably from 1 to 40% by weight, relative to the total solids content of the photosensitive-thermosensitive layer. Within these ranges, the sensitivity and image strength are enhanced.

[Acid Amplifier]

The acid amplifier used in the invention is a compound which can generate more acid through an acid-catalyzed reaction and increase the acid concentration in the reaction system, and which exists stably in the absence of acid. As for such compound, since one occurrence of the reaction leads to an increment of one or more acid molecules, proceeding of the reaction is associated with acceleration of the reaction. However, since the once generated acid molecule itself causes self-decomposition, the strength of the acid generated herein is preferably 3 or less, and particularly preferably 2 or less, in terms of the acid dissociation constant, pKa.

Specific examples of the acid amplifier include the compounds described in paragraphs [0203] to [0223] of JP-A No. 10-1508, paragraphs [0016] to [0055] of JP-A No. 10-282642, and page 39, line 12 to page 47, line 2 of JP-B No. 9-512498, and more specifically the following.

The acid amplifier that can be used in the invention may be exemplified by the compounds which decompose by the acid generated by an acid generator and generate an acid having a pKa of 3 or less such as dichloroacetic acid, trichloroacetic acid, methane sulfonic acid, benzene sulfonic acid, trifluoromethane sulfonic acid, phenylphosphonic acid or the like. Specific examples include the following low-molecular-weight compounds. First, mention may be made of the organic acid ester compound represented by Formula (14).

Formula (14)

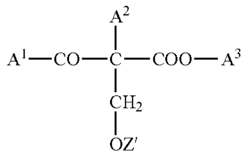

wherein $A^1$ represents an alkyl group having 1 to 6 carbon atoms or an aryl group having 6 to 20 aromatic carbon atoms, $A^2$ represents an alkyl group having 1 to 6 carbon atoms, $A^3$ represents a group selected from a bis(p-alkoxyphenyl)methyl group, a 2-alkyl-2-propyl group, a 2-aryl-2-propylene group, a cyclohexyl group or a tetrahydropyranyl group, and Z' represents an acid residue represented by Z'OH, with an acid dissociation constant (pKa) of 3 or less.

When an acid acts on this compound, the ester group decomposes to a carboxylic acid. This further undergoes decarboxylation, and then (Z'OH) is detached easily. Specific examples are presented below.

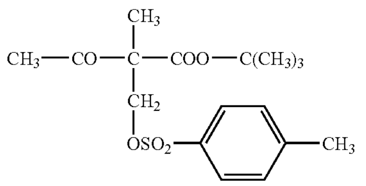

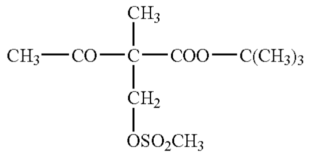

Secondly, an organic acid ester having an acetal or ketal group represented by Formula (15) may be mentioned.

Formula (15)

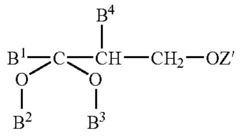

wherein Z' has the same meaning as described above, $B^1$ is a hydrogen atom, an alkyl group having 1 to 6 carbon atoms or an aryl group having 6 to 20 aromatic carbon atoms, $B^2$ and $B^3$ form an ethylene or propylene group from a methyl, an ethyl group or both, and $B^4$ represents a hydrogen atom or a methyl group.

In this compound, acetal or ketal decomposes under the action of acid to β-aldehyde or ketone, and then Z'OH is detached easily. Specific examples are presented below.

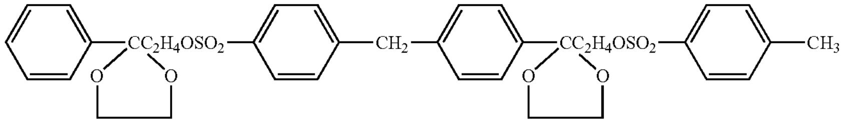

Thirdly, an organic acid ester represented by Formula (16) may be mentioned.

Formula (16)

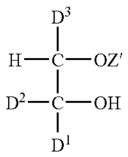

wherein Z' has the same meaning as described above, $D^1$ and $D^2$ each represent a hydrogen atom, an alkyl group having 1 to 6 carbon atoms or an aryl group having 6 to 20 aromatic carbon atoms, $D^3$ represents an alkyl group having 1 to 6 carbon atoms, and $D^2$ and $D^3$ represent an alkylene or substituted alkylene group forming an alicyclic structure.

It is inferred that in this compound, a hydroxyl group leaves under the action of acid catalyst to form a carbocation, and hydrogen is transferred to generate Z'OH. Specific examples are presented below.

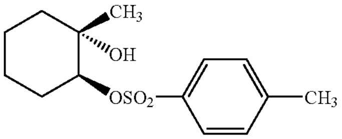

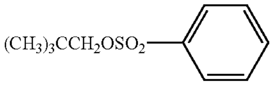

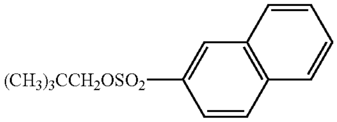

Fourthly, an organic acid ester having an epoxy group represented by Formula (17) may be mentioned.

Formula (17)

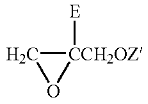

wherein Z' has the same meaning as described above, and E represents an alkyl group having 1 to 6 carbon atoms or a phenyl group.

It is inferred that when an acid acts on this compound, a cation is formed on the β-carbon in association with ring-opening of the epoxy ring, and as a result of hydrogen transfer, an organic acid is generated. Specific examples are presented below.

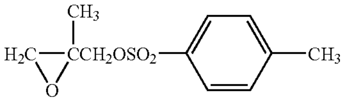

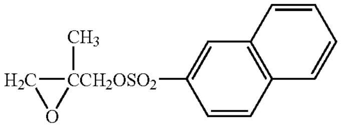

These compounds exist stably at room temperature as long as there is no action of acid. In order to initiate acid-catalyzed decomposition of such compounds, a certain degree of acid strength is required, and the acid dissociation constant pKa is preferably about 3 or less. When the acid dissociation constant is higher than the value, that is, when the acid is a weaker acid, it is not possible to generate the reaction of the acid amplifier.

When such low-molecular-weight compound is used as the acid amplifier, the amount to be used is preferably from 100 to 2000 parts by weight, and more preferably from 150 to 1500 parts by weight, relative to 100 parts by weight of the acid generator, in view of rendering the color difference between the exposed area and the unexposed area clearer.

In addition, according to the invention, a polymeric compound having an acid-degradable terminal group and a sulfonic acid generating group in the side chain can be used as the acid amplifier.

This polymeric compound has in its side chain, a terminal group degradable by an acid, which is selected from an ester group, a ketal group, a thioketal group, an acetal group and a tertiary alcohol group, and a group which is adjacent to the foregoing terminal group, and which is degraded upon degradation of the terminal group and thereby generates sulfonic acid. A more specific structure of the side chain is preferably the structure represented by the following Formula (II).

$$-L-SO_3—W^1 \qquad \text{[Formula (II)]}$$

wherein $W^1$ represents a group degradable by an acid, which is selected from an ester group, a ketal group, a thioketal group, an acetal group and a tertiary alcohol group, L represents a linking group including polyvalent non-metallic atoms, which is necessary in linking the structure represented by Formula (II) to the polymer backbone. That is, in the above-shown Formula (II), the moiety represented by $-L-SO_3—$ represents a group that is degraded in association with the degradation of the acid-degradable group represented by $W^1$ at the terminal and thereby generates sulfonic acid, and L is a polyvalent linking group including nonmetallic atoms, which may be more specifically exemplified by constitutional combinations of the following structural units.

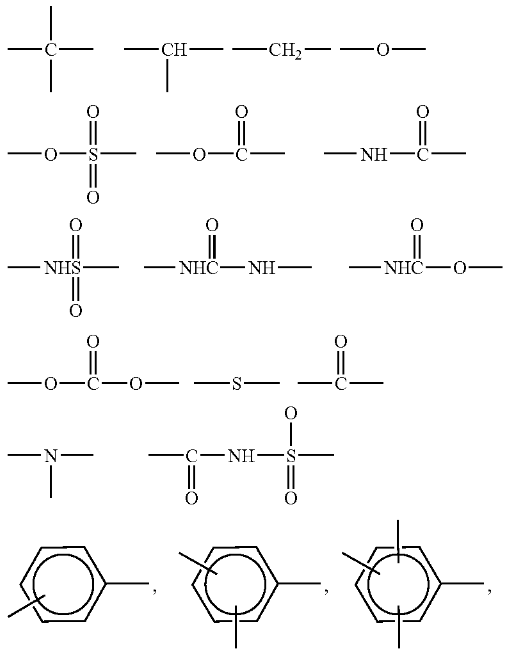

polyvalent naphthalene, and polyvalent anthraquinone

When the polyvalent linking group has a substituent, the substituent may be an alkyl group having 1 to 20 carbon atoms such as methyl or ethyl, an aryl group having 6 to 16 carbon atoms such as phenyl, naphthyl and the like, a hydroxyl group, a carboxyl group, a sulfonamido group, an N-sulfonylamido group, an acyloxy group having 1 to 6 carbon atoms such as acetoxy, an alkoxy group having 1 to 6 carbon atoms such as methoxy, ethoxy mid the like a halogen atom such as chlorine, bromine and the like, an alkoxycarbonyl group having 2 to 7 carbon atoms such as methoxycarbonyl, ethoxycarbonyl, cyclohexyloxycarbonyl and the like, a cyano group, a carbonic acid ester group such as t-butylcarbonate and the like. Further, $W^1$ represents a terminal group which is degraded by an acid and is selected from an ester group, a ketal group, a thioketal group, an acetal group and a tertiary alcohol group. Formula (II) for the polymeric compound having the structural unit preferably represented by Formula (II) in the side chain as described above (hereinafter, appropriately referred to as the sulfonic acid-generating type polymeric compound), preferably represents a polymeric compound having the structural units represented by the following Formulae (1) to (4) in the side chain.

(1)

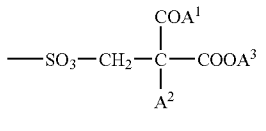

wherein $A^1$ represents an alkyl group or an aryl group, $A^2$ represents a hydrogen atom, an alkyl group or an aryl group, and $A^3$ represents a protective group for the carboxyl group degraded by the action of acid.

(2)

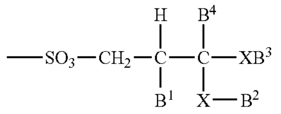

wherein $B^1$ and $B^4$ each represent a hydrogen atom, an alkyl group or an aryl group, X represents an oxygen atom or a sulfur atom, and $B^2$ and $B^3$ each represent an alkyl group or an aryl group.

(3)

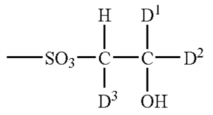

wherein $D^1$ and $D^2$ each represent a hydrogen atom, an alkyl group or an aryl group, and $D^3$ represents an alkyl group or an aryl group.

(4)

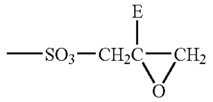

wherein E represents a hydrogen atom, an alkyl group or an aryl group.

First, an explanation will be given on the compound represented by Formula (I).

In the above-mentioned Formula (I), $A^1$ represents an alkyl group or an aryl group, $A^2$ represents a hydrogen atom, an alkyl group or an aryl group, and $A^3$ represents a protective group for the carboxyl group which is degraded by the action of acid. Here, $A^1$ represents an alkyl group having 1 to 20 carbon atoms such as methyl or ethyl, and an aryl group having 6 to 20 carbon atoms such as phenyl or 4-methoxyphenyl. $A^2$ represents a hydrogen atom, an alkyl group having 1 to 20 carbon atoms such as methyl or ethyl, or an aryl group having 6 to 20 carbon atoms such as phenyl or 4-methoxyphenyl. Also, $A^1$ or $A^2$ may be substituted by a substituent such as an alkyl group, an aryl group, a halogen atom, a cyano group, an amino group, an alkoxy group, a phenoxy group, a carboxyl group, an alkoxycarbonyl group, an acyl group or an amido group. $A^3$ is a group that is degraded by the action of acid, and in general, use can be effectively made of those atomic groups used as the protective group for a carboxyl group. Such atomic groups include the atomic groups as described in T. W. Greene, "Protective Groups in Organic Synthesis," John Wiley & Sons, Inc. (1991), which act as the protective group for a carboxyl group and are deprotected under the action of acid. Among these atomic groups, particularly preferred specific examples of $A^3$ include the structures of Formulae (1A) to (1D) of the following.

$$—C(—R^1)(—R^2)(—X—R^3) \qquad \text{Formula (1A)}$$

wherein $R^1$ represents a hydrogen atom, or an alkyl group having 1 to 20 carbon atoms such as methyl or ethyl; a group forming a ring together with $—X—R^3$ such as tetrahydrofuranyl; or a group forming a ring together with $—R^2$ such as 1-methoxycyclohexyl. $R^2$ has the same meaning as $R^1$, or represents an alkoxy group having 1 to 20 carbon atoms such as methoxy, ethoxy or 2-chloroethoxy. X represents an oxygen atom or a sulfur atom, and $R^3$ represents an alkyl group having 1 to 20 carbon atoms such as methyl, ethyl, 2-chloroethyl, benzyl, 4-methoxybenzyl, 2-(trimethylsilyl)ethyl or 2-(t-butyldimethylsilyl)ethyl group, or an aryl group having 6 to 20 carbon atoms such as phenyl or 4-methoxyphenyl. Here, $R^1$ to $R^3$ may be substituted by a substituent such as an alkyl group, an aryl group, a halogen atom, a cyano group, an amino group, an alkoxy group, a phenoxy group, a carboxyl group, an alkoxycarbonyl group, an acyl group, an amido group or the like. Specific examples of the atomic group represented by Formula (1A) include substituted methyl ethers such as methoxymethyl, methoxythiomethyl, benzyloxymethyl, p-methoxybenzyloxymethyl, (4-methoxyphenoxy)methyl, guaiacolmethyl, t-butoxymethyl, 4-pentenoylmethyl, t-butyl-dimethylsilyloxymethyl, 2-ethoxymethoxymethyl, 2,2,2-trichloroethoxymethyl, bis(2-chloroethoxy)methyl, 2-(trimethylsilyl)ethoxymethyl, tetrahydropyranyl, 3-bromotetrahydropyranyl, tetrahydrothiopyranyl, 1-methoxycyclohexyl, 4-methoxytetrahydropyranyl, 4-methoxytetrahydrothiopyranyl, S,S-dioxido-4-methoxytetrahydrothiopyranyl, 1[(2-chloro-4-methyl)phenyl]-4-methoxypiperidin-4-yl, 1,4-dioxan-2-yl, tetrahydrofuranyl, tetrahydrothiofuranyl, 2,3,3a,4,5,6,7,7a-octahydro-7,8,8-trimethyl-4,7-methanobenzofuran-2-yl or the like.

$—C(—R^4)(—R^5)(—R^6)$ Formula (1B)

wherein $R^4$, $R^5$ and $R^6$ each independently represent an alkyl group having 1 to 20 carbon atoms such as methyl, ethyl, 2-chloroethyl or 2-phenethyl. This alkyl group may be substituted by a substituent such as an aryl group, a halogen atom, a cyano group, an amino group, an alkoxy group, a phenoxy group, a carboxyl group, an alkoxycarbonyl group, an acyl group or an amido group. Specific examples of the atomic group represented by Formula (1B) include t-butyl, t-octyl or the like.

$—C(—R^7)(—R^8)(—R^9)$ Formula (1C)

wherein $R^7$ and $R^8$ each independently represent a hydrogen atom, an alkyl group having 1 to 20 carbon atoms such as methyl or ethyl, or an aryl group having 6 to 20 carbon atoms such as phenyl or 4-methoxyphenyl, and $R^9$ represents an aryl group having 6 to 20 carbon atoms such as phenyl or 4-methoxyphenyl. $R^1$ to $R^9$ may be each substituted by a substituent such as an alkyl group, an aryl group, a halogen atom, a cyano group, an amino group, an alkoxy group, a phenoxy group, a carboxyl group, an alkoxycarbonyl group, an acyl group or an amido group. Specific examples of the atomic group represented by Formula (1C) include 4-methoxybenzyl, 3,4-dimethoxybenzyl, 2-picolyl, diphenylmethyl, 5-dibenzosuberyl, triphenylmethyl, α-naphthyldiphenylmethyl, p-methoxyphenyldiphenylmethyl, 4,4',4"-tris(benzoyloxyphenyl)methyl, 3-(imidazol-1-ylmethyl)bis(4',4"-dimethoxyphenyl)methyl, 9-anthryl, 9-(9-phenyl)xanthenyl, 9-(9-phenyl-10-oxo)anthryl, α-methylcinnamyl or the like.

$—Si(—R^{10})(—R^{11})(—R^{12})$ Formula (1D)

wherein $R^{10}$, $R^{11}$ and $R^{12}$ represent an alkyl group having 1 to 20 carbon atoms such as methyl or ethyl, or an aryl group having 6 to 20 carbon atoms such as phenyl, 4-bromophenyl or 4-methoxyphenyl. $R^{10}$ to $R^{12}$ may be each substituted by a substituent such as an alkyl group, an aryl group, a halogen atom a cyano group, an amino group, an alkoxy group, a phenoxy group, a carboxyl group, an alkoxycarbonyl group, an acyl group, an amido group or the like. Specific examples of the atomic group represented by Formula (1D) include trimethylsilyl, triethylsilyl, t-butyldimethylsilyl, t-butyldiphenylsilyl, tribenzylsilyl, triphenylsilyl, diphenylmethylsilyl, t-butylmethoxyphenylsilyl or the like.

Next, an explanation will be given on the compound represented by Formula (2).

In the above-mentioned Formula (2), $B^1$ and $B^4$ represent a hydrogen atom, an alkyl group or an aryl group, X represents an oxygen atom or a sulfur atom, and $B^2$ and $B^3$ represent an alkyl group or an aryl group. The alkyl group and aryl group for $B^1$ to $B^4$ may be exemplified by an alkyl group having 1 to 20 carbon atoms such as methyl or ethyl, and an aryl group having 6 to 20 carbon atoms such as phenyl or 4-methoxyphenyl. $B^2$ and $B^3$ may join together to form a ring. $B^1$ to $B^4$ may be each substituted by a substituent such as an alkyl group, an aryl group, a halogen atom, a cyano group, an amino group, an alkoxy group, a phenoxy group, a carboxyl group, alkoxycarbonyl group, an acyl group, an amido group or the like. Specific examples of the structure including $—C(—XB^2)(—XB^3)$ include ketals and acetals such as dimethylacetal, dimethylketal, bis(2,2,2-trichloroethyl)ketal, dibenzylacetal, dibenzylketal, 1,3-dioxolane, 4-phenyl-1,3-dioxolandioxolane, 4-bromo-1,3-dioxolane, 1,3-dioxane, 4-phenyl-1,3-dioxane 4-bromo-1,3-dioxane, 1,3-oxathiolane or the like.

Further, in Formula (3), $D^1$ and $D^2$ represent a hydrogen atom, an alkyl group or an aryl group, and $D^3$ represents an alkyl group or an aryl group. The alkyl group and the aryl group for $D^1$ and $D^3$ may be exemplified by an alkyl group having 1 to 20 carbon atoms such as methyl or ethyl, or an aryl group having 6 to 20 carbon atoms such as phenyl or 4-methoxyphenyl. $D^1$ and $D^2$ may join together to form a ring. The alkyl group and the aryl group for $D^1$ to $D^3$ may be each substituted by a substituent such as an alkyl group, an aryl group, a halogen atom, a cyano group, an amino group, an alkoxy group, a phenoxy group, a carboxyl group, an alkoxycarbonyl group, an acyl group, an amido group or the like.

In the above-described Formula (4), E represents a hydrogen atom, an alkyl group or an aryl group. The alkyl group and the aryl group for E may be exemplified by an alkyl group having 1 to 20 carbon atoms such as methyl or ethyl, or an aryl group having 6 to 20 carbon atoms such as phenyl or 4-methoxyphenyl. The alkyl group and the aryl group for E may be substituted by a substituent such as an alkyl group, an aryl group, a halogen atom, a cyano group, an amino group, an alkoxy group, a phenoxy group, a carboxyl group, an alkoxycarbonyl group, an acyl group, an amido group or the like.

More specific examples of the sulfonic acid generating type polymeric compound as represented by the polymeric compound useful for the invention, which has the functional groups indicated by Formula (1) to (4) in the side chain include the polymeric compounds that are obtained by radical polymerization of the monomers shown below. This monomer can be specifically exemplified by the following compounds, without being limited to these.

(1)

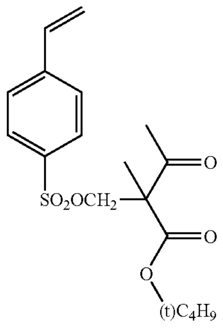

-continued
(2)
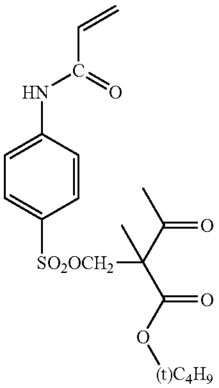
(3)
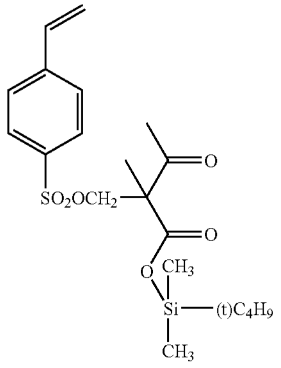
(4)
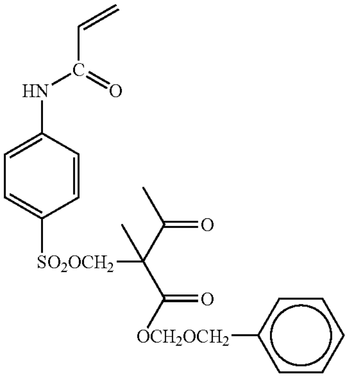
(5)
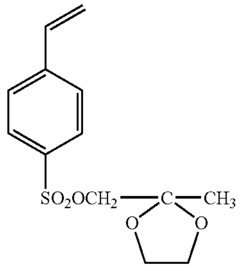
-continued
(6)
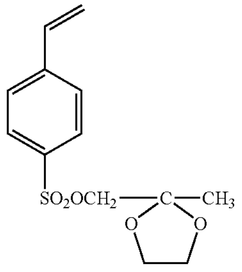
(7)
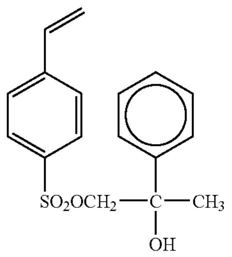
(8)
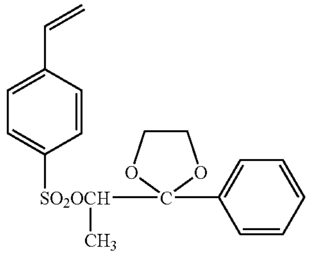
(9)
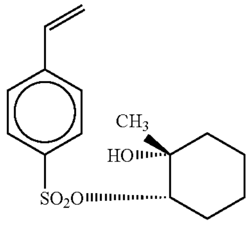
(10)
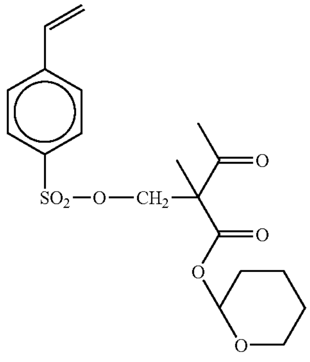

-continued (11)

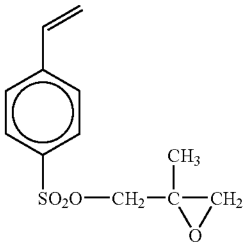

(12)

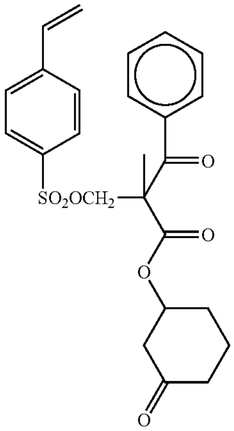

(13)

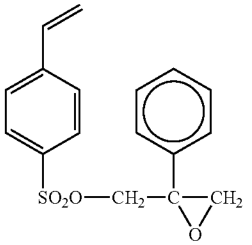

(14)

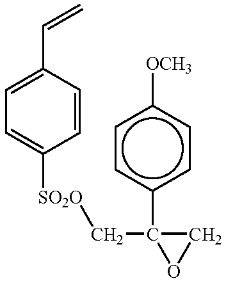

(15)

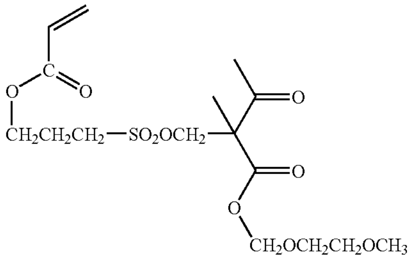

-continued (16)

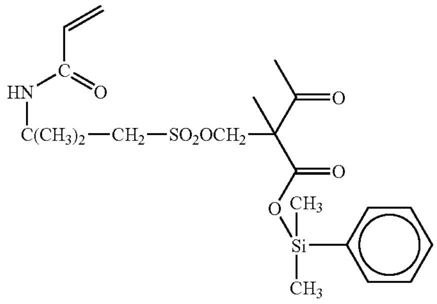

Among the foregoing polymeric compounds, those obtainable by radical polymerization of the above-described monomers are preferably used. Such sulfonic acid generating type polymeric compound may be also a copolymer of a monomer having the sulfonic acid generating structural unit represented by Formula (1) and of another monomer, as long as the effect of the invention is not impaired. The sulfonic acid generating type polymeric compound used even more appropriately in the invention is a copolymer that can be obtained by radical polymerization of the monomer having the structural unit represented by Formula (1) and another known monomer.

As for the above-described other monomer used in the copolymer, mention may be made of, for example, monomers known in the art such as acrylic acid esters, methacrylic acid esters, acrylamides, methacrylamides, vinyl esters, styrenes, acrylic acid, methacrylic acid, acrylonitrile, maleic anhydride, maleic acid imide or the like. Specific examples of acrylic acid esters include methyl acrylate ethyl acrylate, (n- or i-)propylacrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropylacrylate, 5-hydroxypentylacrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, 2-hydroxyphenylcarbonyloxy)ethyl acrylate and the like.

Specific examples of methacrylic acid esters include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, glycidyl methacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, 2-(hydroxyphenylcarbonyloxy)ethyl methacrylate and the like.

Specific examples of acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-sulfamoylphenyl)acrylamide, N-(phenylsulfonyl)acrylamide, N-(tolylsulfonyl)acrylamide, N,N-dimethylacrylamide, N-methyl-N-phenylacrylamide, N-hydroxyethyl-N-methylacrylamide and the like.

Specific examples of methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl)methacrylamide, N-(phenylsulfonyl)methacrylamide, N-(tolylsulfonyl)methacrylamide, N,N-dimethylmethacrylamide, N-methyl-N-phenylmethacrylamide, N-hydroxyethyl-N-methylmethacrylamide and the like.

Specific examples of vinyl esters include vinyl acetate, vinyl butyrate, vinyl benzoate and the like. Specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene and the like.

Among these other monomers, in particular, those used very appropriately include acrylic acid esters, methacrylic acid esters, acrylamides, methacrylamides, vinyl esters, styrenes, all having up to 20 carbon atoms, and acrylic acid, methacrylic acid and acrylonitrile. Also, apart from these monomers, copolymerization can be performed with monomers having crosslinking reactivity. Those monomers having crosslinking reactivity that can be used preferably include glycidyl methacrylate, N-methylolmethacrylamide, ω-(trimethoxysilyl)propyl methacrylate, 2-isocyanate ethyl acrylate, and the like. The proportion of the constituent unit (monomer) containing the sulfonic acid generating group which are contained in the copolymers using the above compounds is preferably 5% by weight or more, and more preferably 10% by weight or more. When the proportion is less than 5% by weight, development cannot be carried out appropriately; and when it is less than 10% by weight, there is a risk of developed residual film appearing after development, which is not preferable. Also, the molecular weight of the sulfonic acid generating type polymeric compound used in the invention is, as the weight average molecular weight, preferably 2,000 or more, and more preferably in a range of from 5,000 to 300,000, and as the number average molecular weight, preferably 800 or more, and more preferably in a range of from 1,000 to 250,000. The polydispersity (weight average molecular weight/number average molecular weight) is preferably 1 or greater, and more preferably in a range of from 1.1 to 10. Such polymeric compound may be any of random polymer, block polymer, graft polymer and the like, and it is preferably a random polymer.

For the solvent which can be used suitably for the synthesis of the above-described polymeric compound, mention may be made of, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide, water or the like. Such solvent can be used individually or as a mixture of two or more species.

The radical polymerization initiator used for the synthesis of the above-described polymeric compound may be selected from any compounds that are known in the art as polymerization initiator, such as azo-based initiators, peroxide initiators or the like.

The above-mentioned polymeric compounds may be used individually or as a mixture These polymeric compounds are employed in an amount of preferably from 100 to 10,000 parts by weight, and more preferably from 150 to 5,000 parts by weight, relative to 100 parts by weight of the acid generator, in view of rendering the color difference between the exposed area and the unexposed area clearer.

Specific examples of the polymeric compound used in the invention are illustrated below, but they are not intended to limit the invention in any way.

(1)

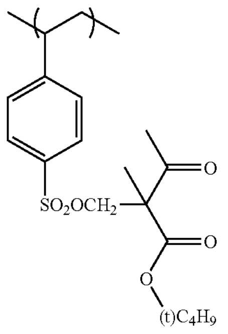

(2)

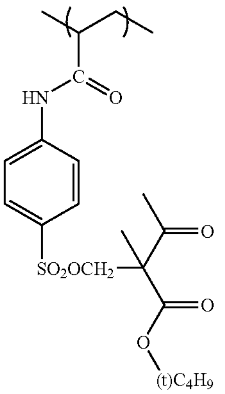

(3)

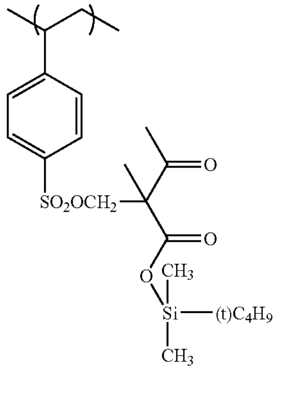

-continued (4)

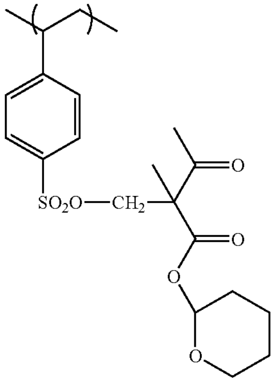

(5)

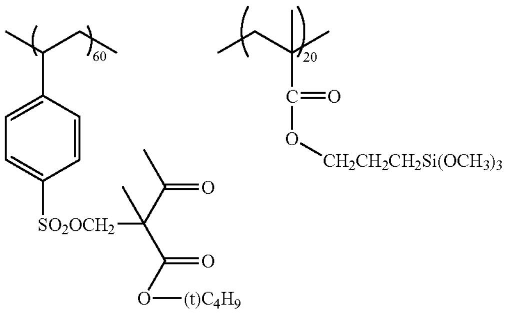

(6)

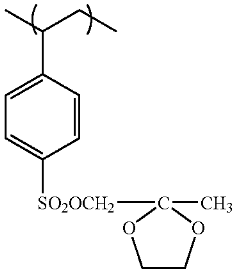

(7)

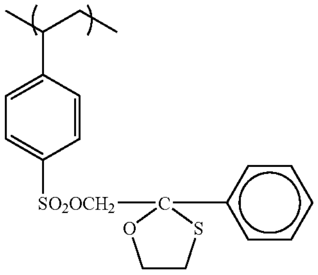

(8)

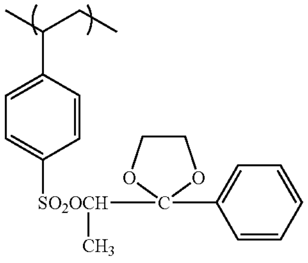

-continued (9)

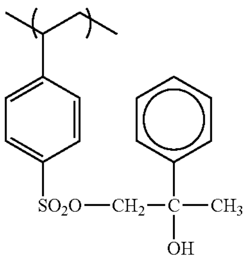

(10)

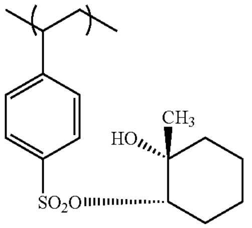

(11)

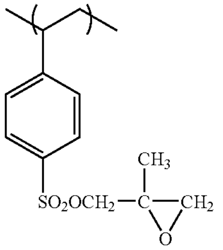

(12)

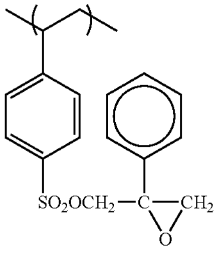

Furthermore, 3,4-disubstituted-cyclobut-3-ene-1,2-dione (hereinafter, optionally referred to as a "squaric acid derivative") can be used as the acid amplifier in the invention. This squaric acid derivative is a powerful acid which is suitable for generating color change in an acid-sensitive substance and can be preferably used. Particularly preferred squaric acid derivatives are those having an oxygen atom, an alkyl group or an alkylene group, a partially hydrogenated aryl group or arylene group, or an aralkyl group is bonded to a squaric acid ring. Acid-catalyzed degradation of such squaric acid derivative causes substitution of the original alkoxy, alkyleneoxy, aryloxy, aryleneoxy or aralkoxy group of the derivative with a hydroxyl group, and thereby generates a squaric acid or squaric acid derivative having one hydroxyl group.

A squaric acid ester that can be used in the invention as the squaric acid derivative may be exemplified by the following.

(a) A primary ester or secondary ester of squaric acid, which is an ester having a non-alkaline cation stabilizing group on the $\alpha$-carbon atom (that is, the carbon atom directly bonded to the —O— atom of the squaric acid ring). This cation stabilizing group may be, for example, an $sp^2$- or sp-hybridized carbon atom or an oxygen atom;

(b) A tertiary ester of squaric acid, in which the α-carbon atom of the ester does not have an $sp^2$- or sp-hybridized carbon atom directly attached thereto; and (c) A quaternary ester of squaric acid, in which the α-carbon atom of the ester has an $sp^2$- or sp-hybridized carbon atom directly attached thereto, provided that this $sp^2$- or sp-hybridized carbon atom (alternatively, when more than one such atoms are directly bonded to the α-carbon atom, at least one of such $sp^2$- or sp-hybridized carbon atom) is bonded to an electron withdrawing group.

The mixing ratio of such acid amplifier is preferably from 100 to 2,000 parts by weight, and more preferably from 150 to 1,500 parts by weight, relative to 100 parts by weight of the acid generator, in view of rendering the color difference between the exposed area and the unexposed area clearer.

[Acid Discoloring Agent]

As for the acid discoloring agent used in the invention, any compound causing either coloration (change from achromatic state to chromatic state), decoloration (change from chromatic state to achromatic state), or discoloration (change from one color to another color) under the action of acid can be all used appropriately. Examples of such dyes include triarylmethane compounds, bisphenylmethane compounds, xanthene compounds, fluoran compounds, thiazine compounds, spiropyrane compounds, and the compounds described in JP-A No. 2001-277730. Among them, particularly preferred are triarylmethane compounds, xanthene compounds, fluoran compounds, spiropyrane compounds and the compounds described in JP-A No. 2001-277730. Examples of the acid discoloring agent will be described in the following, which are not intended to limit the invention in any way.

Brilliant Green, cosin, Ethyl Violet, Erythyosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengal, Methanyl Yellow, Thymolsulfophthalein, Xylenol Blue, Methyl Orange, Orange IV, diphenyl thiocarbazone, 2,7-dichlorofluorescein, Paramethyl Red, Congo Red, Benzopurpurine 4B, α-Naphthyl Red, Nile Blue 2B, Nile Blue A, phenacetarin, Methyl Violet, Malachite Green, Parafuchsine, Victoria Pure Blue BOH, Nile Blue #603, Oil Pink #312, Oil Red 5B, Oil Scarlet #308, Oil Red OG, Oil Red RR, Oil Green #502, Spiron Red BEH Special, m-Cresol Purple, Cresol Red, Rhodamine B, Rhodamine 6G, Fast Acid Violet R, Sulforhodamine B, auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone and 1-β-naphthyl-4-p-diethylaminophenylimino-5-pyrazolone, Pentamethoxy Red, Heptamethoxy Red, Crystal Violet Lactone, 3-diethylamino-6-methyl-7-anilinofluoran, compounds represented by the following formulae, or the like.

B-1

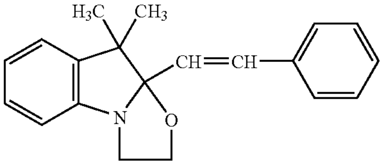

B-2

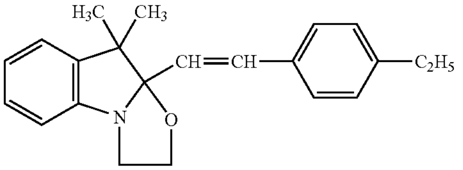

B-3

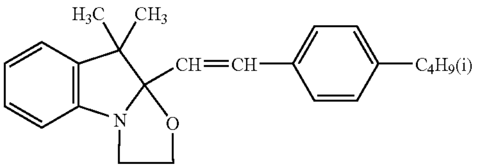

B-4

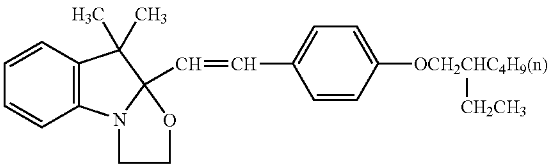

B-5

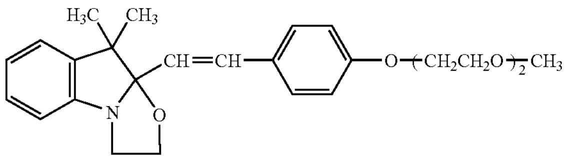

B-6

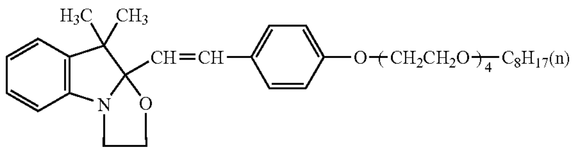

B-7

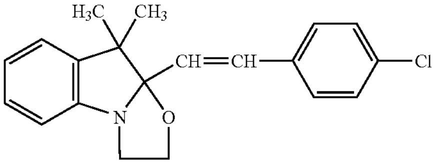

B-8

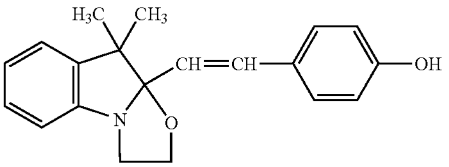

-continued
B-9
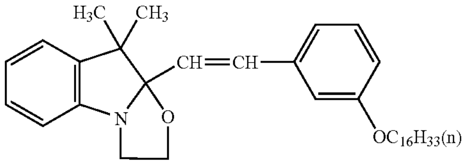
B-10
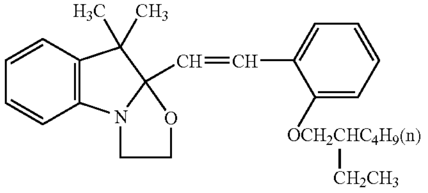
B-11
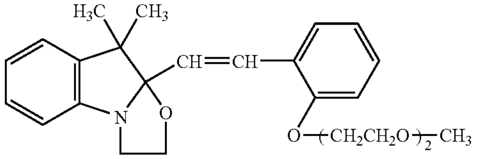
B-12
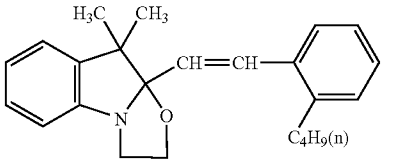
B-53
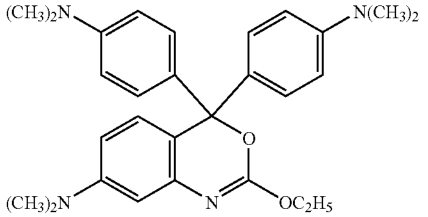
B-54
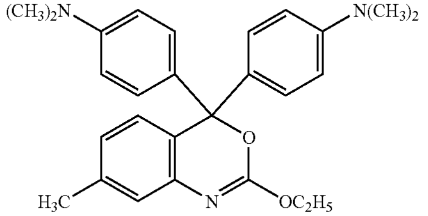
B-55
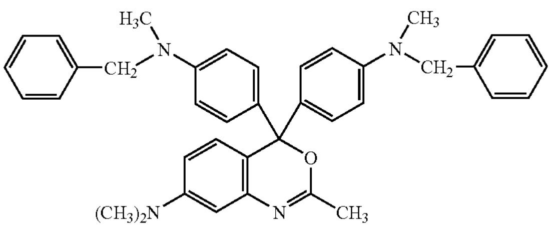
-continued
B-56
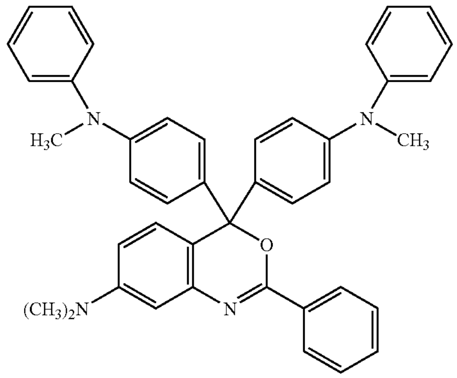
B-57
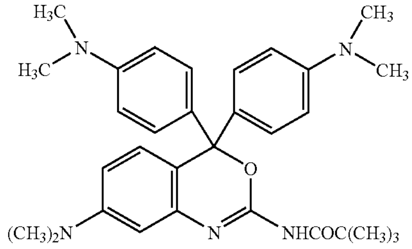
B-58
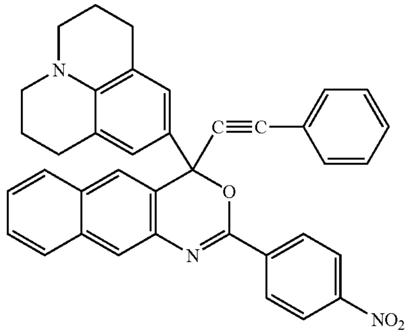
B-59
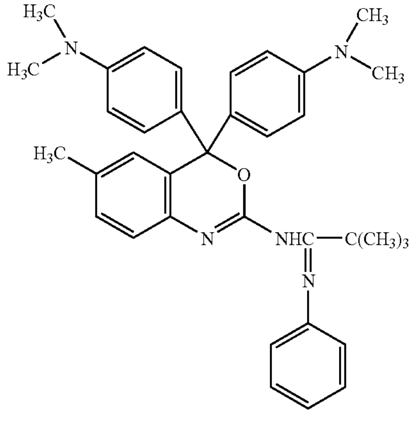

-continued

B-60

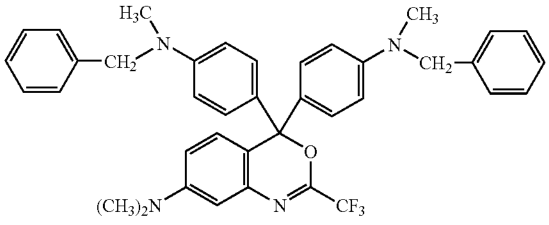

B-109

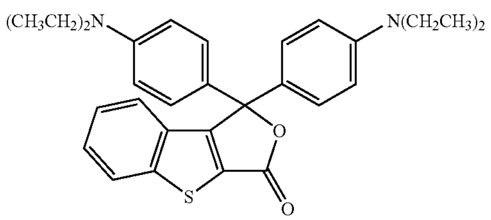

B-110

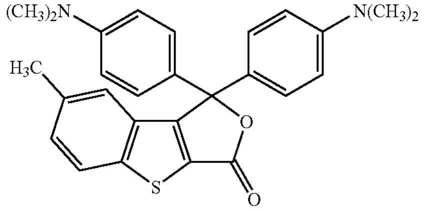

B-111

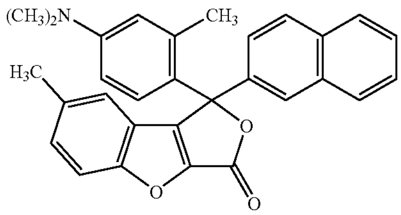

B-112

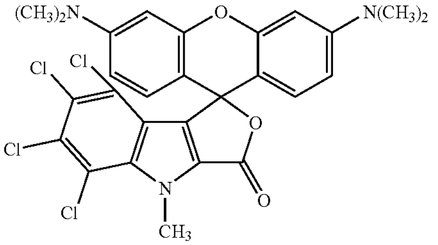

B-113

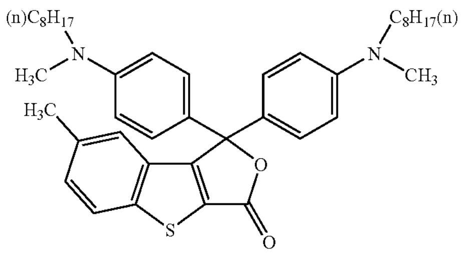

-continued

B-114

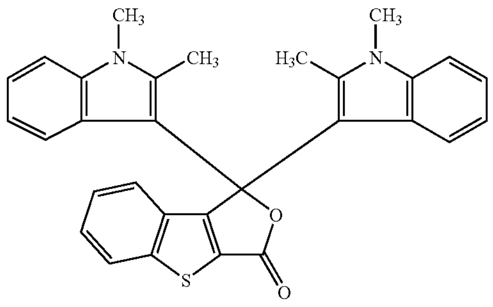

B-115

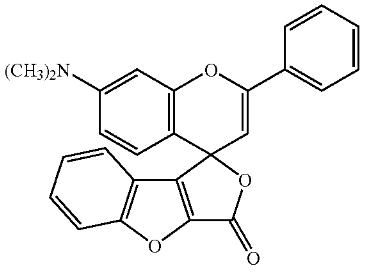

B-116

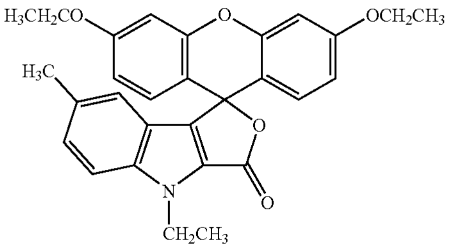

According to the invention, the mixing ratio of the acid discoloring agent is preferably from 100 to 2,000 parts by weight, and more preferably from 150 to 1,500 parts by weight, relative to 100 parts by weight of the acid generator, in view of rendering the color difference between the exposed area and the unexposed area clearer.

(2) Discoloring Material Including a Base Generator, a Base Amplifier and a Base Discoloring Agent

[Base Generator]

As for the base generator used in the invention, use can be preferably made of the compounds as described in page 6, upper left column, line 2 to upper right column, line 15 of JP-A No. 2-166450, and in particular, those releasing a base as a result of some reaction upon heating, such as a salt of an organic acid which undergoes decarboxylation upon heating and of a base; a compound releasing amine as a result of an intramolecular nucleophilic substitution reaction, Lossen rearrangement, Beckmann rearrangement or the like.

Specifically, an acid salt of a base may be mentioned, wherein the base may be exemplified by guanidine, triphenylguanidine, tricyclohexylguanidine, piperizine, morpholine, p-toluidine, 2-picoline or the like, and the base may be exemplified by acetic acid, trichloroacetic acid, phenylsulfonyl acetic acid, 4-methylsulfonyl phenylsulfonyl acetic acid, 4-acetylaminomethyl propionic acid, oxalic acid, maleic acid, succinic acid, fumaric acid, carbonic acid, bicarbonic acid or the like.

Such base generator may be introduced to the photosensitive-thermosensitive layer as a particulate in the solid state dispersed in the composition for the above-mentioned layer, or may be introduced as being encapsulated in a microcapsule described later.

Further, the amount of the base generator to be added is preferably from 10 to 1,000 parts by weight, and more preferably from 30 to 800 parts by weight, relative to 100 parts by weight of the infrared absorbent, from the viewpoint of visibility in the exposed area.

[Base Amplifier]

The base amplifier used in the invention has the feature such that it generates a base as a result of degradation under the action of base, and when a base which is identical with the base generated thereupon is brought into action, the base amplifier is degraded again to generate a base. Therefore, this base amplifier is degraded in a self-amplifying fashion by bringing into action of a base only in an equivalent less than a certain amount, to finally result in degradation of the entire amount, and thus base in a large quantity corresponding to the amount of the base amplifier can be generated. Such base amplifier may be exemplified by those compounds described in (0010 to (0032) of JP-A No. 2000-330270.

Specifically, preferred examples of the base amplifier include urethane-based compounds having the above-described feature. Such base amplifier consists of a urethane-based compound containing at least one urethane bond, and this urethane-based compound is degraded by the action of a base (ammonia or amine) derived from the amino group forming the urethane bond and generates a base (ammonia or amine) derived from the urethane bond. Of course, even when a base different from the base derived from the amino group forming the urethane bond is brought into action, the compound undergoes degradation to generate a base.

In determining as to whether such urethane compound has the function of a base amplifier or not, the following simple preliminary testing can be used.

(Determination of base amplification) To a 2 wt % methanol-$d_4$ solution of a urethane-based compound, a base $HNR^1R^2$ identical to the base derived from the amino group $NR^1R^2$ which forms the urethane bond (—$OCONR^1R^2$) of the foregoing urethane-based compound is added to 0.1 wt %. This solution is charged into a test tube for NMR spectroscopic measurement, and the tube is sealed and heated to 100° C. Then, the NMR spectrum is measured. The increase in the NMR signal for the olefin generated from the degradation of the urethane compound indicates the base-amplifying function of the urethane-based compound.

The base amplifier including the urethane compound may be, in general, exemplified by the urethane-based compound represented by the following Formula (5).

(5)

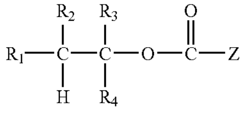

wherein $R_1$ and $R_2$ each is a hydrogen atom, a substituent or an electron-withdrawing group, and at least one of them is an electron-withdrawing group. $R^3$ and $R^4$ each is a hydrogen atom or a substituent, and Z is an amino group.

The electron-withdrawing group includes an electron-withdrawing group conventional in the field of organic electronics or the like, for example, a fluorenyl group, an organic sulfoxide group, a cyano group, a nitro group, an ester group, a carbonyl group, an amido group, a pyridyl group and the like.

The organic sulfoxide group includes the structure represented by the following Formula (6).

$$Ar—SO_2 \quad (4)$$

wherein At represents a substituent, which is preferably an aryl group. Specific examples thereof include phenyl, tolyl, naphthyl and the like. Ar has 6 to 18, preferably 6 to 12, carbon atoms.

The substituent includes an alkyl group having preferably 1 to 12 carbon atoms, and more preferably 1 to 6 carbon atoms; a cycloalkyl group having preferably 5 to 10 carbon atoms, and more preferably 6 to 8 carbon atoms an aryl group having preferably 6 to 14 carbon atoms, and more preferably 6 to 10 carbon atoms; an arylalkyl group having preferably 7 to 15 carbon atoms, and more preferably 7 to 11 carbon atoms; and the like. Specific examples thereof include methyl, ethyl, propyl, butyl, cyclohexyl, phenyl, tolyl, naphthyl, benzyl, phenethyl, naphthylmethyl and the like.

The amino group includes an unsubstituted amino group and a substituted amino group. The substituted amino group includes a monosubstituted am in group and a disubstituted amino group. This amino group can be represented by the following Formula (7).

(7)

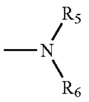

wherein, $R_5$ and $R_6$ represent each a hydrogen atom or a substituent. The substituent has preferably 1 to 18, and more preferably 6 to 12, carbon atoms. This substituent includes an alkyl group, a cycloalkyl group, an aryl group and an arylalkyl group. The alkyl group may be exemplified by particularly those having preferably 1 to 12 carbon atoms, and more preferably 2 to 6 carbon atoms, for example, ethyl, propyl, butyl, hexyl or the like. The cycloalkyl group may be exemplified by those having 5 to 10 carbon atoms, and more preferably 6 to 8 carbon atoms, for example, cyclohexyl, cyclooctyl or the like. The aryl group may be exemplified by those having preferably 6 to 14 carbon atoms, and more preferably 6 to 10 carbon atoms, for example, phenyl, tolyl, naphthyl or the like. The arylalkyl group may be exemplified by those having preferably 7 to 15 carbon atoms, and more preferably 7 to 11 carbon atoms, for example, benzyl, phenethyl, naphthylmethyl or the like. The alkyl group, cycloalkyl group, aryl group and arylalkyl group may have substituents. In the case, the substituent include an amino group, an alkoxy group, an alkoxycarbonyl group, an acyl group, an acyloxy group, a hydroxyl group and the like.

In the amino group of Formula (7), R5 and R6 can be joined to form a ring containing nitrogen. In this case, the nitrogen-containing ring has preferably 3 to 12, and more preferably 5 to 8, ring member atoms. This nitrogen-containing ring may also contain a plurality of heteroatoms (N, O, S, etc.) as the ring member atoms.

According to the invention, preferred amino group may be exemplified by the group of the following Formula (8).

(8)

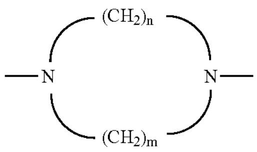

wherein n and m each represent a number preferably between 1 and 6, and more preferably between 2 and 4. n+m is preferably between 4 and 12, and more preferably between 4 and 8. R7 represents a hydrogen atom as well as a substituent such as a hydrocarbon group, a hydrocarbyloxy group, an acyl group or the like, and it may be a residual group of a urethane-based compound having the base amplifying function. The hydrocarbon group, the hydrocarbon group exemplified by hydrocarbyloxy group, and the hydrocarbon group exemplified by acyl group have preferably 1 to 12 carbon atoms, and more preferably 1 to 8 carbon atoms This hydrocarbon group includes alkyl, cycloalkyl, aryl and arylakyl.

The urethane-based compound used as the base amplifier may contain two or more urethane bonds. Such urethane-based compound may exemplified by those represented by the following Formulae (9) and (10).

(9)

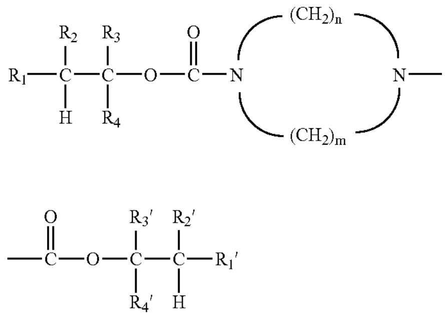

(10)

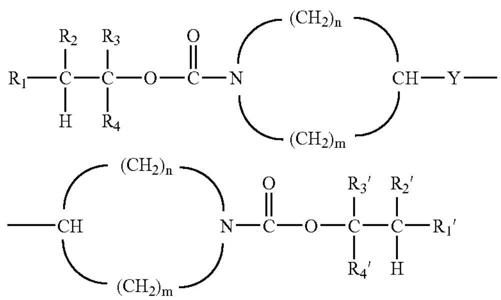

In Formula (9), $R_1$ and $R_2$ each is a hydrogen atom, a substituent or an electron-withdrawing group, and at least one of them is an electron-withdrawing group. $R_3$ and $R_4$ each is a hydrogen atom or a substituent. $R_1$' and $R_2$' each is a hydrogen atom, a substituent or an electron-withdrawing group, and at least one of then is an electron-withdrawing group. $R_3$' and $R_4$' each is a hydrogen atom or a substituent. n and m each represent a number preferably between 1 and 6, and more preferably between 2 and 4. n+m is preferably between 4 and 12, and more preferably between 4 and 8.

In Formula (10), $R_1$ and $R_2$ each is a hydrogen atom, a substituent or an electron-withdrawing group, and at least one of them is an electron-withdrawing group. $R_3$ and $R_4$ each is a hydrogen atom or a substituent. $R_1$' and $R_2$' each is a hydrogen atom, a substituent or an electron-withdrawing group, and at least one of them is an electron-withdrawing group. $R_3$' and $R_4$' each is a hydrogen atom or a substituent. Y is an alkylene group having preferably 1 to 8, and more preferably 2 to 6, carbon atoms. n and m each represent a number preferably between 1 and 6, and more preferably between 2 and 4. n+m is preferably between 4 and 12, and more preferably between 4 and 8. p and q each represent a number preferably between 1 and 6, and more preferably between 2 and 4. p+q is preferably between 4 and 12, and more preferably between 4 and 8.

Specific examples of the electron-withdrawing group and substituent include those mentioned in regard to Formula (7) in the above.

The above-described base amplifier contains an urethane bond, and to a carbon atom adjacent to the carbon atom having this urethane group (carbamoyl group), an electron-withdrawing group and a hydrogen atom are attached. Therefore, such structural feature allows that the hydrogen atom attached to the carbon atom, to which the electron-withdrawing group is attached, is acidic in nature and thus can be abstracted by the action of base. According to the mechanism of the base amplifying reaction involving the above-described base amplifier, first there occurs abstraction of the hydrogen atom under the action of base, and then carbamic acid leaves, which is in turn further degraded to generate a base and carbon dioxide. Here, thus generated base acts on another base amplifier molecule and degrades this molecule to generate a base. In this way, the base amplifier undergoes degradation in a manner similar to chain reaction, and eventually generates a large quantity of base using a small quantity of base. Such base amplifying reaction can be represented by the following chemical equation talking an example of the urethane-based compound of the above-mentioned Formula (7).

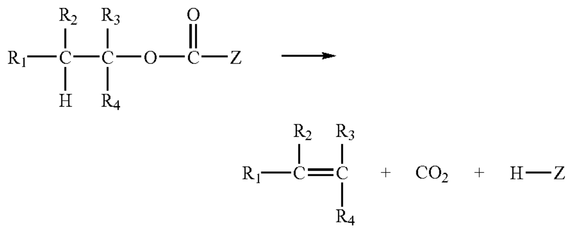

In the equation, H-Z represents the base derived from the amino group attached with a urethane bond. This base is ammonia, or preferably an amine. In the process for preparation of the base amplifier, an alcohol may be reacted with a chloroformic acid ester to produce an asymmetrical carboxylic diester, which is in turn reacted with a base.

Specific examples of the base amplifier preferably used in the invention are presented below.

1-1
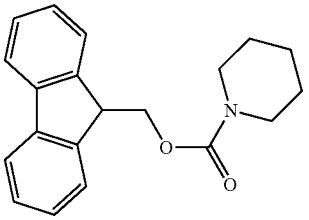
1-2
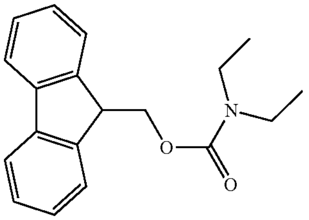
1-3
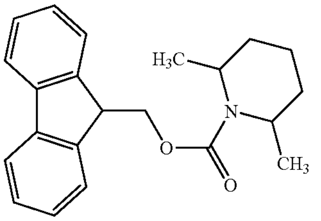
1-4
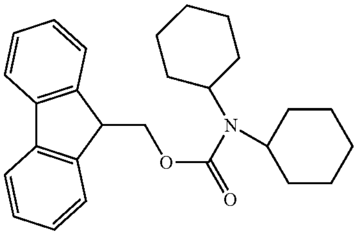
1-5
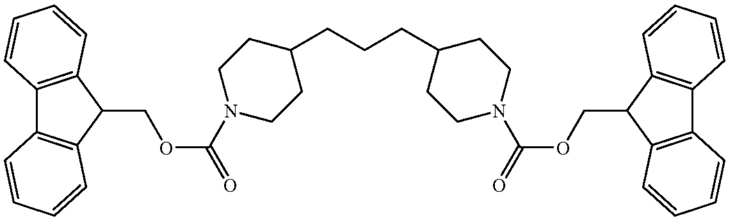
1-6
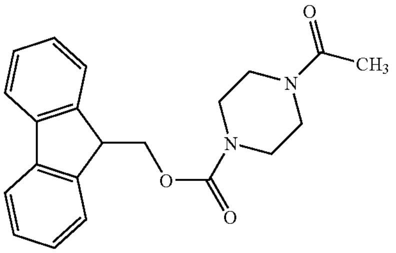
1-7
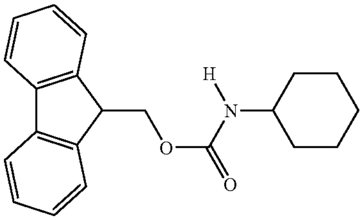
1-8
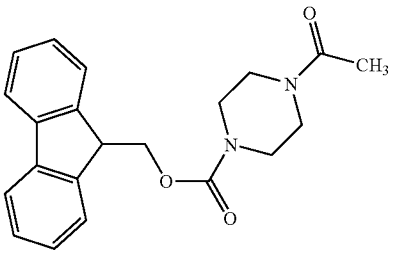
1-9
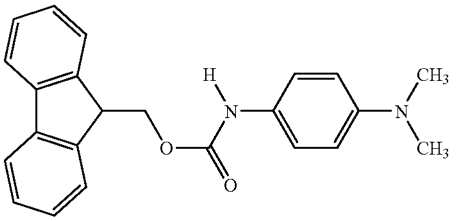
1-10
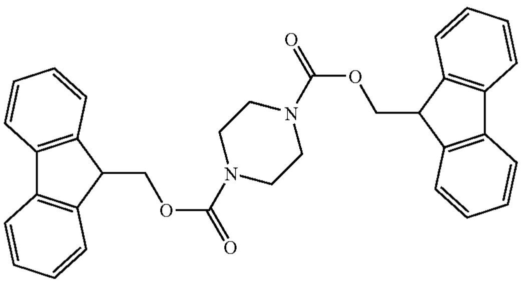
1-11
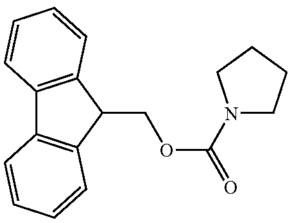

-continued 2-1

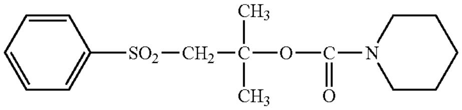

2-2

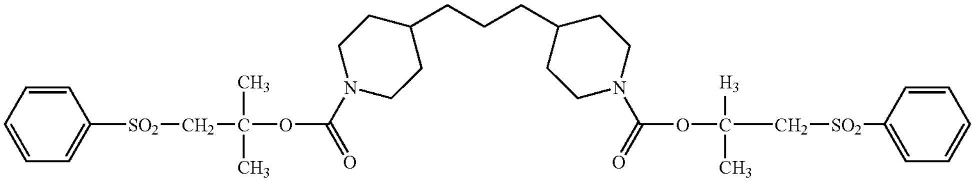

2-3

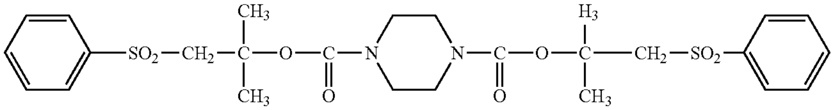

2-4

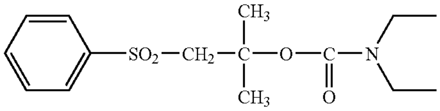

(P-4)

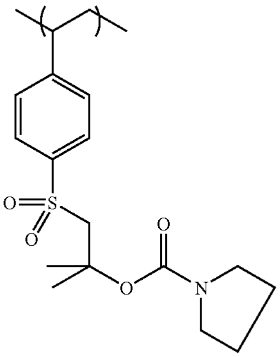

The compounds of Nos. 1-1 to 1-11 represent the examples of a fluorene-based base amplifier to which a fluorenyl group is bonded as the electron-withdrawing group, and they generate amines in an amplifying manner On the other hand, the compounds of Nos. 2-1 to 2-4 represent the examples of a sulfone-based base amplifier to which an organic sulfoxide group is bonded as the electron-withdrawing group, and they generate amines in an amplifying manner.

The above-described base amplifier is thermally stable at room temperature and can be stored for a long period of time. When this base amplifier is dissolved in an organic solvent and reacted under heating with a small amount of a base which brings On the initial catalytic reaction, degradation takes place rapidly from a certain point of the reaction time, and procession of the base amplifying reaction can be confirmed therefrom.

The amount of the base amplifier to be added is preferably from 100 to 10,000 parts by weight, and more preferably from 200 to 9,000 parts by weight, relative to 100 parts by weight of the base generator, from the viewpoint of visibility in the exposed area.

[Base Discoloring Agent]

As for the base discoloring agent used in the invention, any compound undergoing coloration, decoloration or discoloration under the action of base can be used appropriately.

Among such base discoloring agent, examples of the compound undergoing decoloration or discoloration by the action of base include a polymethine dye such as a cyanine dye and the like. Preferred examples of such compound include STAINS-ALL, sulfopropylsulfopropyl-naphthothiazoylidene methylbutynylnaphthothiazole, 3,3'-diethylselenacarbocyanine iodide, 2-{4-(diethylamino)styryl}-1-methylquinolinium iodide, Quinalidine Red, Thiazole Orange, 1,1'-diethyl-2,2'-cyanine iodide, 1,1'-diethyl-2,4'-cyanine iodide, 1,1'-diethyl-4,4'-cyanine iodide, pinacyanol chloride, pinacyanol bromide, 1,1'-diethyl-2,2'-carbocyanine iodide, 1,1'-diethyl-4,4'-carbocyanine iodide, 1,1'-diethyl-2,2'-dicarbocyanine iodide, 1,1'-diethyl-4,4'-dicarbocyanine iodide, Astazon Orange G, 1,1',3,3,3',3'-hexamethylindodicarbocyanine, New Indocyanine Green, 5-cyano-2-{3-(5-cyano-1,3-diethyl-1,3-dihydro-2H-benzimidazol-2-ylidene)-1-propenyl}-ethyl-3-(4-sulfobutyl)-1H-benzimidazolium hydroxide inner salt, 3,3'-dimethyloxacarbocyanine iodide 449, 3,3'-diethyloxacarbocyanine iodide, 3,3'-dipropyloxacarbocyanine iodide, 3,3'-dihexyloxacarbocyanine iodide, sodium salt of 5-phenyl-2-{2-(5-phenyl-3-(3-sulfopropyl)-2(3H)-benzoxazolidene)methyl}-1-butenyl)-3-(3-sulfobutyl)-benzoxazolium hydroxide inner salt, 5-phenyl-2-{2-(5-phenyl-3-(4-sulfobutyl)-2(3H)-benzoxazolidene)methyl}-1-butenyl)-3-(4-sulfobutyl)-benzoxazolium hydroxide inner salt 3,3'-diethyloxadicarbocyanine iodide, sodium salt of 5-chloro-9-ethyl-5'-phenyl-3,3'-bis(sulfopropyl)oxacarbocyanine hydroxide inner salt, 3,3'-diethylthiacyanine iodide, 3,3'-diethylthiacarbocyanine iodide, 3,3'-dipropylthiacarbocyanine iodide, 3,3'-diethyl-9-methylthiacarbocyanine iodide, ethylbenzothiazolidene methylpropenylsulfoxybutyl benzothiazolium, 2-{2-(3-(carboxymethyl)-5-methyl-2(3H)-benzothiazolidenemethyl)-1-butenyl}-3-ethyl-5-methylbenzothiazolium hydroxide inner salt, 3,3'-diethylthiadicarbocyanine iodide, 3,3'-dipropylthiadicarbocyanine iodide, triethylammonium salt of 5-(-3-sulfopropyl)-2-{3-(3-sulfopropyl)-2(3H)- benzothiaolidene}methyl)naphtho(1,2-dithiazolium hydroxide inner salt, ethylmethylbenzothiazolidene methylbutenylsulfopropylnaphthothiazolium, or the like.

The compound undergoing decoloration or discoloration under the action of base may also include the compounds described in page 5, upper right column, line 8 to page 6, upper left column, line 1 of JP-A No. 2-166450, and specifically the following spectroscopic sensitizing dyes.

The spectroscopic sensitizing dye is a compound which undergoes decoloration under the action of base and may be exemplified by the compounds resulting from coloration of a triarylmethane-based compound, a diphenylmethane-based compound, a xanthene-based compound, a thiazine-based compound, a spirolane-based compound or the like using an acidic compound, for example, an inorganic acid such as hydrochloric acid, sulfuric acid, phosphoric acid, hydrobromic acid, hydrogen iodide, perchloric acid or the like, acetic acid, alkylsulfonic acid, aklylbenzenesulfonic acid, naphthalenesulfonic acid, perfluoroalkylsulfonic acid, a phenolic compound or a salicylic acid derivative and polyvalent metal salts thereof.

Specifically, for example, the dyes obtained from coloration of the following compounds can be used. For example, mention may be made of the compounds described in JP-A No. 55-227253, and specifically for example, as the triarylmethane-based compound, 3,3-bis(p-dimethylaminophenyl)-6-dimethylaminophthalide, 3,3-bis(p-dimethylaminophenyl)phthalide, 3-(p-dimethylaminophenyl)-3-(1,3-dimethylindol-3-yl)phthalide, 3-(p-dimethylaminophenyl)-3-(2-methylindol-3-yl)phthalide, 3,3-bis(1-octyl-2-methylindol-3-yl)phthalide or the like. Further, mention may be also made of, as the diphenylmethane-based compound, 4,4'-bisdimethylaminobenzhydryl benzyl ether, N-halophenyl leuco auraamine, N-2,4,5-trichlorophenyl leuco auramine or the like; as the xanthene-based compound, rhodamine-5-anilinolactam, rhodamine-6-(p-nitroanilino) lactam, 2-(dibenzylamino)-6-diethylaminofluoran, 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-chlor-6-diethylaminofluoran, 2-anilino-3-methyl-6-N-ethyl-N-isobutylaminofluoran, 2-anilino-dibutylaminofluoran, 2-anilino-3-methyl-6-N-methyl-N-tetrahydrofurfurylaminofluoran, 2-anilino-3-methyl-6-piperidinoaminofluoran, 2-(o-chloroanilino)-6-diethylaminofluoran, 2-(3,4-chloroanilino)-6-diethylaminofluoran or the like. As the thiazine-based compound, Benzoyl Leuco Methylene Blue, p-nitrobenzoyl Leuco Methylene Blue or the like may be mentioned. As the spiro-based compound, 3-methyl-spiro-di-α-naphthopyrane, 3-ethyl-spiro-di-α-naphthopyrane, 3,3'-dichloro-spiro-di-α-naphthopyrane, 3-benzyl-spiro-di-α-naphthopyrane, 3-methyl-spiro-α-naphtho(3-methoxy-α-benzo)pyrane, 3-propyl-spiro-dibenzopyrane or the like.

Meanwhile, as for the compound undergoing coloration under the action of base, preferred are the base-induced color-expressing dyes having the function of expressing color by the action of base, and particularly preferred are the dyes which have a (thio)lactone or sulfolactone skeleton in the structure, have a hydrogen ion concentration in the region of pH 3 or higher, and particularly preferably pH 5 or higher, and express color upon ring-opening of the (thio)lactone or sulfolactone skeleton of the dye. Specifically, the compounds described in [0021] to [0029] of JP-A No. 11-143076 may be mentioned.

According to the invention, the mixing ratio of the base discoloring agent is preferably from 0.01 to 100 parts by weight, and more preferably from 0.1 to 10 parts by weight, relative to 100 parts by weight of the base generator, from the viewpoint of visibility in the exposed area.

(3) Discoloring Material Including a Radical Discoloring Agent and a Thermodegradable Radical Generator Precursor

[Radical Discoloring Agent]

As for the radical discoloring agent of the invention, use can be made of any compound that undergoes coloration, decoloration or discoloration by interacting with a radical. Examples of such radical discoloring agent include those leuco dyes conventionally known in the art Specific examples of such leuco dye include aminotriarylmethanes such as bis(4-dimethylaminophenyl)phenylmethane, bis(4-diethylamino-o-tolyl)(p-chlorophenyl)methane, tris(4-diethylamino-o-tolyl)methane, tris(p-dimethylaminophenyl)methane, tris(p-dihexylaminophenyl)methane, bis(4-diethylamino-o-tolyl)(3,4-dimethoxyphenyl)methane, bis(4-diethylamino-o-tolyl)(p-benzylthiophenyl)methane, bis(p-dimethylamino-o-tolyl)(p-α-methoxyacetamide)methane or the like; aminoxanthenes such as 3,6-bis(diethylamino)-9-phenylxanthene, 3-amino-6-dimethylamino-2-methyl-9-(o-chlorophenyl)xanthene or the like; aminothioxanthenes such as 3,6-bis(diethylamino)-9-(o-ethoxycarbonylphenyl)thioxanthene, 3,6-bis(dimethylamino)thioxanthene or the like; amino-9,10-dihydroacridines such as 3,6-bis(diethylamino)-9,10-dihydro-9-phenylacridine, 3,6-bis(benzylamino)-9,10-dihydro-9-methylacridine or the like; aminophenoxazines such as 3,7-bis(diethylamino)phenoxazine or the like; aminophenothiazines such as 3,7-bis(ethylamino)phenothiazine or the like; aminodihydrophenazines such as 3,7-bis(diethylamino)-5-hexyl-5,10-dihydrophenazine or the like; aminodiphenylmethanes such as bis(p-dimethylaminophenyl)anilinomethane or the like; leuco-indamines such as 4-amino-4'-dimethylaminodiphenylamine or the like; aminohydrocinnamic acids such as 4-amino-α,β-dicyanohydrocinnamic methyl ester or the like; hydrazines such as 1-(2-naphthyl)-2-phenylhydrazine or the like; amino-2,3-dihydroanthraquinones such as 1,4-bis(ethylamino)-2,3-dihydroanthraquinone or the like; and phenethylanilines such as N,N-diethyl-p-phenethylaniline or the like.

Among such leuco dyes, preferred are aminotriarylmethanes, more preferred are those in which at least two of the aryl groups have amino groups at the para-position with respect to the bond to the methane carbon atom are more preferred, and still more preferred are those in which all three have amino groups at the para-position. Also, aminotriarylmethanes having an alkyl group, an alkoxy group or a halogen atom at the ortho-position of the aryl groups are preferred because of their excellent storage stability.

The content of the radical discoloring agent of the invention is preferably from 0.1 to 25% by weight, more preferably from 1 to 20% by weight, and even more preferably from 5 to 15% by weight, relative to the solids content of the photosensitive-thermosensitive layer. Further, the ratio of the radical discoloring agent and the thermodegradable radical generator precursor, [radical discoloring agent]/[thermodegradable radical generator precursor] is, in terms of moles, in the range of preferably from 0.1 to 2.5, more preferably from 0.4 to 2.0, and even more preferably from 0.8 to 1.5.

According to the invention, when the radical discoloring agent used has an amino group or a substituted amino group in the chemical structure, like aminotriarylmethanes, coloration is promoted by addition of an acid substance which can form an ammonium salt, such as mineral acid, organic acid or so-called Lewis acid. Representative acidic substances include, for example, hydrochloric acid, hydrobromic acid, sulfuric acid, phosphoric acid, acetic acid, oxalic acid, sulfonic acids such as p-toluene sulfonic acid, trichloroacetic acid, trifluoroacetic acid, halogen-substituted carboxylic acids such as perfluoroheptanoic acid, zinc chloride, zinc bromide, iron chloride and the like. The amount of use of such acidic substance is typically in the range of preferably from 0.1 to 2.0 moles, and more preferably from 0.5 to 1.5 moles, per 1 mole of amino group,

[Thermodegradable Radical Generator Precursor]

The thermodegradable radical generator precursor according to the invention is a compound which forms a compound generating a radical upon thermal degradation induced by photo-irradiation. Any compound in the class of the foregoing compound can be suitably used, but preferred compounds are vinyldioxolane derivatives of known photoradical generators.

Specific examples of known photoradical generator include an acetophenone-based compound such as 2,2-dimethoxy-2-phenylacetophenone, 2-methyl-1-[4-methylthio)phenyl]-2-morpholinopropan-1-one and 2-benzyl-2-N,N-dimethylamino-1-(4-morpholinophenyl)-1-butanone; a thioxantone-based compound such as isopropylthioxantone and the like; a 1,2-diketo compound such as camphorquinone, a benzophenone-based compound such as [4-(4-methylphenylthio)phenyl]phenyl ketone, 4-phenylbenzophenone and Michler's ketone; an anthraquinone-based compound such as 2-ethylanthraquinone; a fluoran-based compound such as diiodobutoxyfluoran; and the like, but the invention is not limited to these. The vinyldioxolane derivatives of such photoradical generator are the compounds having the ketone group present in the photoradical generator replaced with vinyldioxolane. Specific examples of acetophenone will be set forth below.

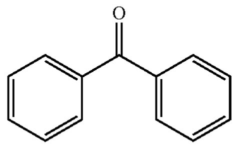

Acetophenone

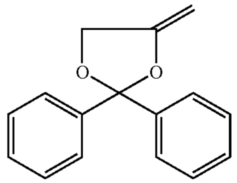

Vinyldioxolane derivative

The mechanism of forming colored image induced by the radical discoloring agent and the thermodegradable radical generator precursor of the invention is as follows.

A vinyloxolane derivative is degraded by the heat generated upon exposure to an infrared laser and produces a photoradical generator. Thus produced photoradical generator is photo-irradiated to generate a radical, and this radical interacts with a radical discoloring agent, thereby color change taking place in the infrared laser-exposed area and the unexposed area.

The thermodegradable radical generator precursor of the invention is contained in an amount of preferably from 0.1 to 10% by weight, and more preferably from 0.5 to 5% by weight, relative to the total weight of the photosensitive-thermosensitive layer.

[Other Components of the Discoloring Material]

The discoloring material using a radical discoloring agent may contain an acid generator which accelerates thermodegradation of the thermodegradable radical generator precursor. As for such acid generator, the above-described acid generators can be used. The amount of the acid generator to be used is typically from 0.1 to 30% by weight, and more preferably from 1 to 15% by weight, relative to the total solids content of the photosensitive-thermosensitive layer. Within these ranges, good sensitivity and good image strength can be obtained.

<Elements for Formation of Printed Image>

The photosensitive-thermosensitive layer or other layers preferably contain elements for formation of printed image, and as for the element that can be used, at least one of (a) the image-forming element utilizing radical polymerization and (b) the image-forming element utilizing thermal fusion or thermal reaction of a hydrophobization precursor can be used. The use of the element of (a) results in a photosensitive-thermosensitive layer of the radical polymerization type, whereas the use of the element of (b) results in a photosensitive-thermosensitive layer of the hydrophobization precursor type. Hereinafter, these elements will be explained, with further description on other components that are added for the respective cases of using the elements.

(a) Image-forming Element Utilizing Radical Polymerization

Since the radical polymerization type element has high sensitivity for image formation, the energy of exposure can be effectively distributed to the formation of printout images, and it is suitable for obtaining printout images with good visibility.

The radical polymerization type element is basically composed of a radical-polymerizable compound and a radical polymerization initiator.

[Radical-polymerizable Compound]

The radical-polymerizable compound hereinafter, simply referred to as polymerizable compound) that can be used in the invention is an addition-polymerizable compound having at least one ethylenic unsaturated double bond, and is selected from the compounds having at least one, and preferably two or more, ethylenic unsaturated bonds. The family of such compounds is well known in the pertinent industrial field, and they can be used in the invention without particular limitation. Also, according to the invention, the "radical-polymerizable compound" means not only monomer but also prepolymer, namely, dimer, trimer and oligomer, or mixtures thereof and copolymers thereof. Examples of the monomer and copolymer thereof include unsaturated carboxylic acids (e.g., acrylic acid, methacrylic acid, itaconic acid, crotonic acid, isocrotonic acid, maleic acid, etc.), or esters and amides thereof. Preferably, use is made of esters of an unsaturated carboxylic acid and an aliphatic polyhydric alcohol compound, and amides of an unsaturated carboxylic acid and an aliphatic polyhydric amine compound. Further, the addition products of unsaturated carboxylic acid esters or amides having a nucleophilic substituent such as a hydroxyl group, an amino group or a mercapto group, with monofunctional or polyfunctional isocyanates or epoxies, and the dehydration-condensation products thereof with monofunctional or polyfunctional carboxylic acids are also suitably used. Furthermore, the addition products of unsaturated carboxylic acid esters or amides having an eletrophilic substituent such as an isocyanate group or an epoxy group, with monofunctional or polyfunctional alcohols, amines, or thiols, and the substitution products of unsaturated carboxylic acid esters or amides having a leaving group substituent such as a halogen group or a tosyloxy group, with monofunctional or polyfunctional alcohols, amines or thiols are also suitable. For another example, the compounds substituted with unsaturated phosphonic acid, styrene, vinyl ether or the like instead of the above-described unsaturated carboxylic acid, can be also used.

Specific examples of the monomeric ester of an aliphatic polyhydric alcohol compound and an unsaturated carboxylic acid include, as the acrylic acid ester, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanate, polyester acrylate oligomer, isocyanuric acid EO-modified triacrylate and the like.

As the methacrylic acid ester, mention may be made of tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis-[p-(3-methacryloxy-2-hydroxypropoxy)phenyl]dimethylmethane, bis-[(methacryloxyethoxy)phenyl]dimethylmethane and the like.

As the itaconic acid ester, mention may be made of ethylene glycol diitaconate, propylene glycol diitaconate, 1,3-butanediol diitaconate, 1,4-butanediol itaconate, tetramethylene glycol diitaconate, pentaerythritol diitaconate, sorbitol tetraitaconate and the like. As the crotonic acid ester, ethylene glycol dicrotonate, tetramethylene glycol dicrotonate, pentaerythritol dicrotonate, sorbitol tetradicrotonate and the like may be mentioned. As the isocrotonic acid ester, ethylene glycol diisocrotonate, pentaerythritol diisocrotonate, sorbitol tetraisocrotonate and the like may be mentioned. As the maleic acid ester, ethylene glycol dimaleate, triethylene glycol dimaleate, pentaerythritol dimaleate, sorbitol tetramaleate and the like may be mentioned.

Examples of esters other than those include the aliphatic alcohol-based esters as described in JP-B No. 51-47334 and JP-A No. 57-196231, those having aromatic skeleton as described in JP-A No. 59-5240, JP-A No. 59-5241 and JP-A No. 2-226149, those having an amino group as described in JP-A No. 1-165613, and the like are also suitably used. Further, the above-described ester monomers can be used as mixtures.

Furthermore, specific examples of the amide monomer of an aliphatic polyhydric amine compound and an unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylenebisacrylamide, xylenebismethacrylamide and the like. Examples of other preferred amide-based monomer include the cyclohexylene structure described in JP-B No. 54-21726.

Further, the urethane-based addition-polymerizable compounds prepared by the addition reaction of an isocyante and a hydroxyl group are also suitable. Specific examples thereof include, for example, the vinyl urethane compound containing two or more polymerizable vinyl groups per molecule, which is prepared by adding a vinyl monomer containing a hydroxyl group as represented by the following Formula (a), to a polyisocyanate compound having two or more isocyanate groups per molecule described in JP-B No. 48-41708.

$$CH_2{=}C(R_4)COOCH_2CH(R_5)OH \quad (a)$$

(provided that $R_4$ and $R_5$ each represent H or $CH_3$).

In addition, also suitable are the urethane acrylates as described in JP-A No. 51-37193, and JP-B Nos. 2-32293 and 2-16765, and the urethane compounds having ethylene oxide-based skeleton as described in JP-B Nos. 58-49860, 56-17654, 62-39417 and 62-39418. Moreover, by using the addition-polymerizable compounds having an amino structure or sulfide structure in the molecule as described in JP-A Nos. 63-277653, 63-260909 and 1-105238, a photopolymerizable composition having excellent photosensitization speed can be obtained.

Examples other than the above include polyfunctional acrylates or methacrylates such as the polyester acrylates, the epoxyacrylates resulting from reaction between epoxy resins and (meth)acrylic acid, or the like as described in JP-A No. 48-64183, JP-B NO. 49-43191 and JP-B 52-30490. Further, the specific unsaturated compounds as described in JP-B No. 46-43946, JP-B 1-40337 and JP-B No. 1-40336, or the vinyl phosphonic acid-based compounds as described in JP-A 2-25493 may be mentioned. Also, in some cases, the structure containing a perflouroalkyl group as described in JP-A No. 61-22048 can be suitably used. Those introduced as photo-curable monomers and oligomers in the Journal of Japan Adhesive Society, vol. 20, No. 7, pp. 300-308 (1984) can be also used.

For such addition-polymerizable compound, details in the usage such as the structure, individual or combined use, amount of addition or the like can be arbitrarily set according to the performance design of the final lithographic printing plate precursor. For example, they are selected from the following aspects.

In the aspect of sensitivity, a structure having a large content of unsaturated group around one molecule is preferred, and in many cases, bifunctionality or higher is preferred. Also, in order to increase the strength of the image area, that is, the cured film, trifunctionality or higher is good, and it is also effective to balance between the sensitivity and the strength by combining different functionalities and different polymerizable groups (e.g., acrylic acid ester, methacrylic acid ester, styrene-based compound, vinyl ether-based compound).

Further, in the aspects of the compatibility with other components (e.g., binder polymer, initiator, coloring agent, etc.) in the photosensitive-thermosensitive layer and dispersibility, too, the selection and usage of the addition polymerization compound are important factors, and for example, use of a low-purity compound or combined use of two or more species can improve the compatibility. Also, a certain structure can be selected under the purpose of enhance the adherence of the substrate or the protective layer described later.

The polymerizable compounds are used in an amount ranging preferably from 5 to 80% by weight, and more preferably from 25 to 75% by weight, relative to the total solids content of the layer to which the compound is added. Also, these compounds may be used individually or in combination of two or more species. In addition to that, as for the usage of the addition-polymerizable compounds, appropriate structure, mixing ratio and amount of addition can be arbitrarily selected from the perspectives of the extent of inhibition of oxygen against polymerization, resolution, coverage, change in refractive index, surface adhesiveness and the like, and in some cases, layer-constructing coating methods such as undercoating, overcoating or the like can be optionally carried out.

<Radical Polymerization Initiator>

The radical polymerization initiator used in the invention indicates a compound which generates a radical under the action of light, heat or both forms of energy, and initiates and accelerates polymerization of a polymerizable compound having an unsaturated group. As the radical polymerizable initiator that can be used in the invention, mention may be made of known thermal polymerization initiators, compounds having bonds with small bond dissociation energy, photopolymerization initiators, or even photo-oxidizing agent or known radical generators also called as printout agents. Among these, the radical polymerization initiator that is suitably used in the invention is a compound generating a radical under the action of heat energy.

Hereinafter, the radical polymerization initiator used in the invention will be specifically explained. This radical polymerization initiator can be used individually or in combination of two or more species.

As for such radical polymerization initiator, for example, organic halogenated compounds, carbonyl compounds, organic peroxides, azo-based compounds, azide compounds, metallocene compounds, hexaarylbiimidazole compounds, organic boron compounds, disulfone compounds, oxime ester compounds, onium salt compounds may be mentioned.

As for the organic halogenated compound, mention may be made specifically of the compounds as described in Wakabayashi, et al, "Bull Chem. Soc Japan" 42,2924 (1969), U.S. Pat. No. 3,905,815, JP-B No. 46-4605, JP-A Nos. 48-36281, 53-133428, 55-32070, 60-239736, 61-169835, 61-169837, 62-58241, 62-212401, 63-70243, 63-298339, and M. P. Hutt "Journal of Heterocyclic Chemistry" 1 (No. 3) (1970). Among these, oxazole compounds having a trihalomethyl group substituted, and S-triazine compounds are suitable.

More appropriately, mention may be made of s-triazine derivatives in which at least one mono-, di- or trihalogen-substituted methyl group is bonded to s-triazine ring, and specifically for example, 2,4,6-tris(monochloromethyl)-s-triazine, 2,4,6-tris(dichloromethyl)-s-triazine, 2,4,6-tris (trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-naphthoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine and the like.

As for the carbonyl compound, mention may be made of benzophenone derivatives such as benzophenone, Michler's ketone, 2-methylbenzophenone, 3-methylbenzophenone, 4-methylbenzophenone, 2-chlorobenzophenone, 4-bromobenzophenone, 2-carboxybenzophenone or the like; acetophenone derivatives such as 2,2-dimethoxy-2-phenylacetophenone, 2,2-diethoxyacetophenone, 1-hydroxycyclohexyl phenyl ketone, α-hydroxy-2-methylphenylpropanone, 1-hydroxy-1-methylethyl-(p-isopropylphenyl) ketone, 1-hydroxy-1-(p-dodecylphenyl)ketone, 2-methyl-(4'-(methylthio)phenyl)-2-morpholino-1-propanone, 1,1,1-trichloromethyl(p-butylphenyl)ketone or the like; thioxantone derivatives such as thioxantone, 2-ethylthioxantone, 2-isopropylthioxantone, 2-chlorothioxantone, 2,4-dimethylthioxantone, 2,4-diethylthioxantone, 2,4-diisopropylthioxantone or the like; and benzoic acid ester derivatives such as ethyl p-dimethylaminobenzoate, ethyl t-diethylaminobenzoate or the like.

As for the azo-based compound, for example, the azo compounds as described in JP-A No. 8-108621 can be used.

As for the organic peroxide, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,3,3-tetramethylbutyl hydroperoxide, tert-butylcumyl peroxide, dicumyl peroxide, 2,5 dimethyl-2,5-di(tert-butylperoxy)hexane, 2,5-oxanoyl peroxide, peroxysuccinic acid, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, tosyl carbonate, 3,3',4,4'-tetra-(t-butylperoxycarbonyl)benzophenone, 3,3',4,4'-tetra-(t-hexylperoxydicarbonyl)benzophenone, 3,3',4,4'-tetra-(p-isopropylcumylperoxycarbonyl)benzophenone, carbonyl di(t-butylperoxy dihydrogen naphthalate), carbonyl di(t-hexylperoxy dihydrogen naphthalate) or the like may be mentioned.

As for the metallocene compound, mention maybe made of various titanocene compounds as described in JP-A No. 59-152396, JP-A No. 61-151197, JP-A No. 63-41484, JP-A No. 2-249, JP-A No. 2-4705 and JP-A No. 5-83588, and for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifiluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, the iron-arene complexes as described in JP-A No. 1-304453 and JP-A No. 1-152109, or the like.

As for the hexaarylbiimidazole compound, mention may be made of for example, various compounds as described in JP-B No. 6-29285, U.S. Pat. Nos. 3,479,185, 4,311,783 and 4,622,286, and specifically 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole or the like.

As for the organic boron compound, mention may be made of, for example, the organic boric acid salts as described in JP-A No. 62-143044, JP-A No. 62-150242, JP-A No. 9-188685, JP-A No. 9-188686, JP-A No. 9-188710, JP-A No.

2000-131837, JP-A No. 2002-107916, Japanese Patent No. 2764769, JP-A No. 2002-116539 and Kunz, Martin, “Rad Tech ’98. Proceeding Apr. 19-22, 1998, Chicago” or the like; the organic boron-sulfonium complexes or organic boron-oxosulfonium complexes as described in JP-A No. 6-157623, JP-A No. 6-175564 and JP-A No. 6-175561; the organic boron-iodonium complexes as described in JP-A No. 6-175554 and JP-A No. 6-175553; the organic boron-phosphonium complexes as described in JP-A No. 9-188710; and the organic boron-transition metal coordinate complexes as described in JP-A No. 6-348011, JP-A No. 7-128785, JP-A No. 7-140589, JP-A No. 7-306527, JP-A No. 7-292014 or the like.

As for the disulfone compound, the compounds as described in JP-A No. 61-166544, JP-A No. 2002-328465 or the like may be mentioned.

As for the oxime ester compound, the compounds as described in J. C. S. Perkin II (1979) 1653-1660, J. C. S. Perkin II (1979) 156-162, Journal of Photopolymer Science and Technology (1995) 202-232, and JP-A Nos. 2000-66385 and 2000-80068, and specifically the compound represented by the following structural formula may be mentioned.

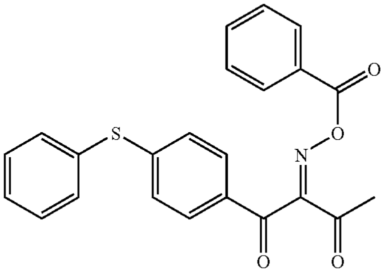

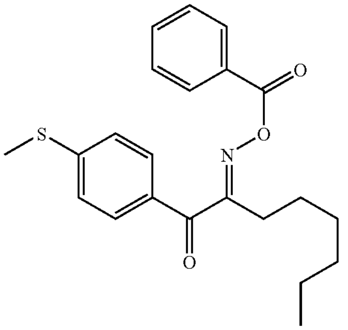

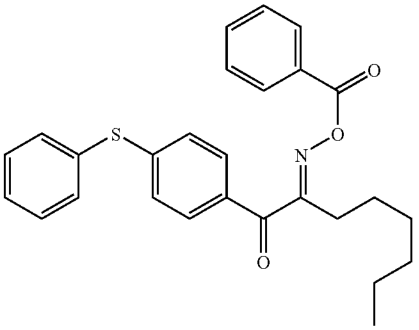

-continued

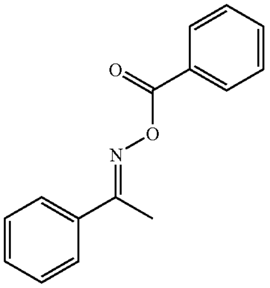

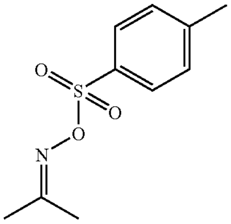

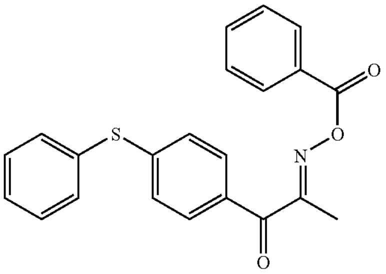

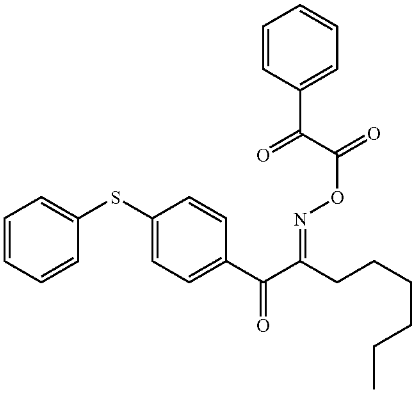

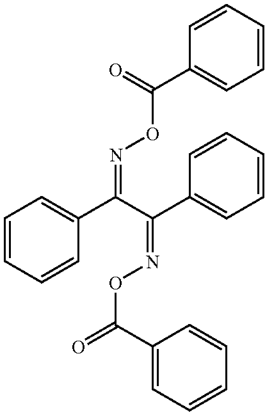

-continued
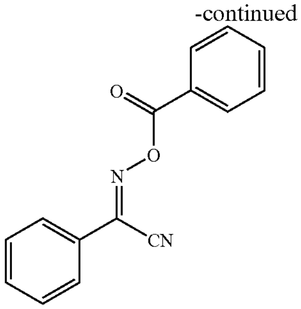
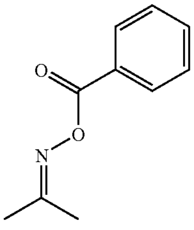
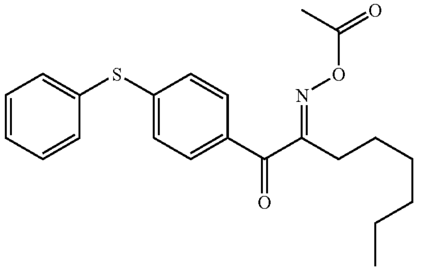
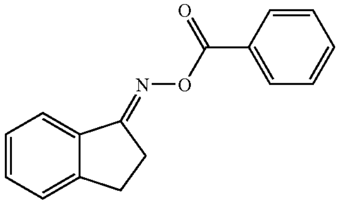
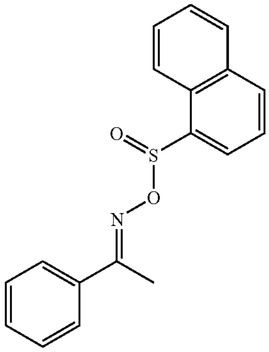
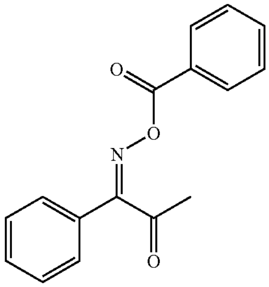
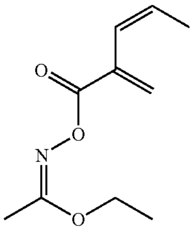
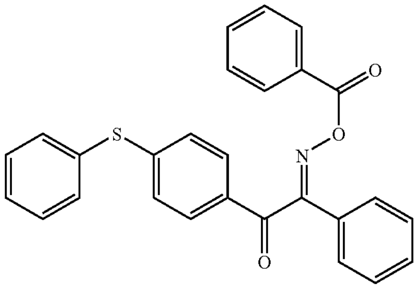
-continued
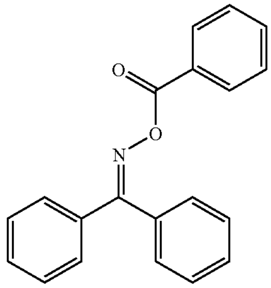
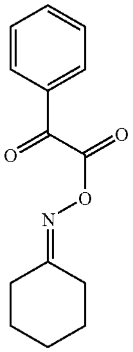
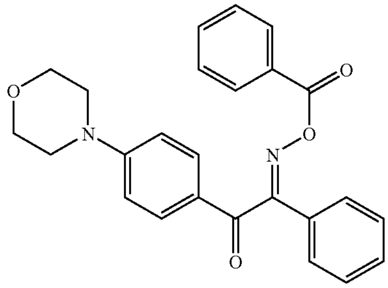
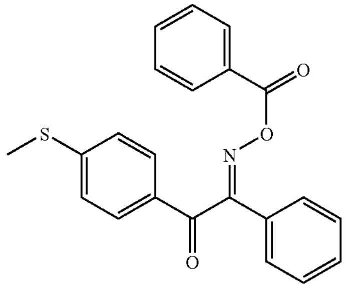
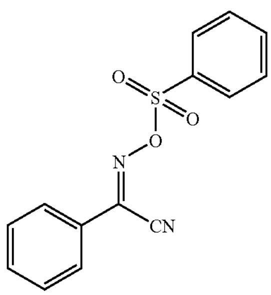

-continued

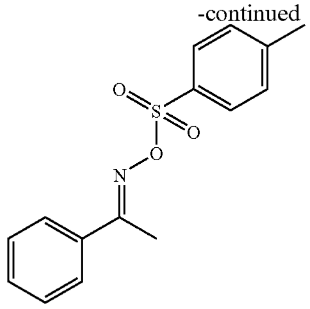

As for the onium salt compound, mention may be made of onium salts such as, for example, the diazonium salts as described in S. I. Schlesinger, Photogr. Sci. Eng., 18,387 (1974), T. S. Bal et al, Polymer, 21,423 (1980); the ammonium salts as described in the specification of U.S. Pat. No. 4,069,055, the publication of JP-A No. 4-365049 or the like; the phosphonium salts as described in the specifications of U.S. Pat. Nos. 4,069,055 and 4,069,056; the iodonium salts as described in the specifications of EP No. 104,143, U.S. Pat. Nos. 339,049 and 410,201, and the publications of JP-A Nos. 2-150848 and 2-296514; the sulfonium salts as described in the specifications of EP Nos. 370,693, 390,214, 233,567, 297,443 and 297,442, U.S. Pat. Nos. 4,933,377, 161,811, 410,201, 339,049, 4,760,013, 4,734,444 and 2,833,827, DE Nos. 2,904,626, 3,604,580 and 3,604,581; the selenonium salts as described in J. V. Crivello et al, Macromolecules, 10(6), 1307 (1977) and J. V. Crivello et al, J. Polymer Sci., Polymer Chem. Ed., 17, 1047 (1979); the arsonium salts as described in C. S. Wen et al. Teh, Proc. Conf. ad. Curing ASIA, p 478 Tokyo, October (1988); or the like.

Especially in the aspects of reactivity and stability, the oxime ester compounds or onium salts (diazonium salts, iodonium salts or sulfonium salts) can be mentioned to be suitable.

The onium salts that can be used suitably in the invention are the onium salts represented by the following Formulae (RI-I) to (RI-III).

(RI-I)

(RI-II)

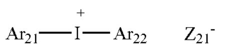

(RI-III)

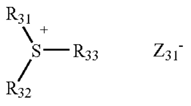

In Formula (RI-I), $Ar_{11}$ represents an aryl group having 20 carbon atoms or less and optionally having 1 to 6 substituents, and preferred substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamido group or arylamido group having 1 to 12 carbon atoms, a carbonyl group, a carboxyl group, a cyano group, a sulfonyl group, a thioalkyl group having 1 to 12 carbon atoms, and a thioaryl group having to 12 carbon atoms. $Z_{11}^-$ represents a monovalent anion and specifically includes a halogen ion, a perchlorate ion, a hexafluorophosphate ion, a tetrafluoroborate ion, a sulfonate ion, a sulfinate ion, a thiosulfonate ion and a sulfate ion. Among these, preferred are the perchlorate ion, hexafluorophosphate ion, tetrafluoroborate ion, sulfonate ion and sulfinate ion in the aspect of stability.

In Formula (RI-II), $Ar_{21}$ and $Ar_{22}$ each independently represent an aryl group having 20 carbon atoms or less and optionally having 1 to 6 substituents, and preferred substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamido group or arylamido group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{21}^-$ represents a monovalent anion and may be exemplified specifically by a halogen ion, a perchlorate ion, a hexafluorophosphate ion, a tetrafluoroborate ion, a sulfonate ion, a sulfinate ion, a thiosulfonate ion, and a sulfate ion. Among these, preferred are the perchlorate ion, hexafluorophosphate ion, tetrafluoroborate ion, sulfonate ion, sulfinate ion and carbonate ion in the aspects of stability and reactivity.

In Formula (RI-III), $R_{31}$, $R_{32}$ and $R_{33}$ each independently represent an aryl group, alkyl group, alkenyl group or alkynyl group having 20 carbon atoms or less and optionally having 1 to 6 substituents. Among these, preferred is the aryl group in the aspects of reactivity and stability. The substituents include an alkyl group having 1 to 12 carbon atoms, an alkenyl group having 1 to 12 carbon atoms, an alkynyl group having 1 to 12 carbon atoms, an aryl group having 1 to 12 carbon atoms, an alkoxy group having 1 to 12 carbon atoms, an aryloxy group having 1 to 12 carbon atoms, a halogen atom, an alkylamino group having 1 to 12 carbon atoms, a dialkylamino group having 1 to 12 carbon atoms, an alkylamido group or arylamido group having 1 to 12 carbon atoms, a carbonyl group, a carboxyl group, a cyano group, a sulfonyl group, a thioalkyl group having 1 to 12 carbon atoms, and a thioaryl group having 1 to 12 carbon atoms. $Z_{31}^-$ represents a monovalent anion and may be exemplified specifically by a halogen ion, a perchlorate ion, a hexafluorophosphate ion, a tetrafluoroborate ion, a sulfonate ion, a sulfinate ion, a thiosulfonate ion, and a sulfate ion. Among these, preferred are a perchlorate ion, a hexafluorophosphate ion, a tetrafluoroborate ion, a sulfinate ion, a sulfinate ion and a carbonate ion, in the aspects of stability and reactivity. More preferred is the carbonate ion as described in the publication of JP-A No. 2000-343742, and particularly preferred is the carbonate ion as described in the publication of JP-A No. 2002-148790.

Specific examples of the onium salts represented by the above Formulae (RI-I) to (RI-III) will be given below, but they are not intended to limit the invention in any way.

(N-1)
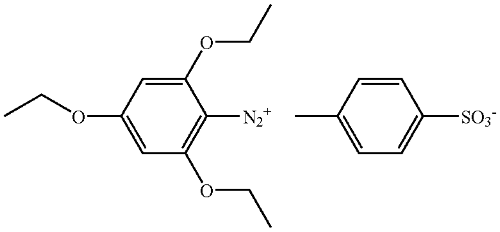
(N-2)
$PF_6^-$
(N-3)
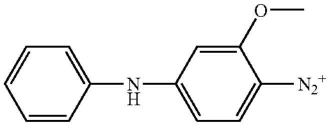
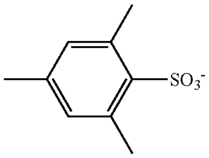
(N-4)
$ClO_4^-$
(N-5)
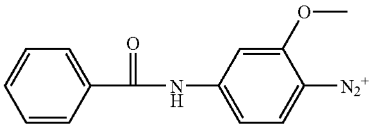 $CF_3SO_3^-$
(N-6)
$BF_4^-$
(N-7)
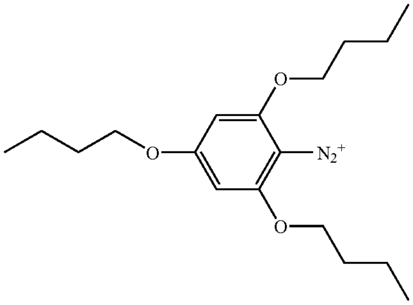
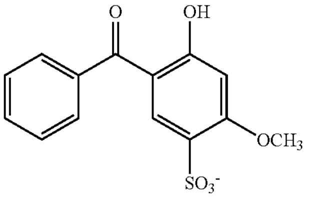
(N-8)
$ClO_4^-$
(N-9)
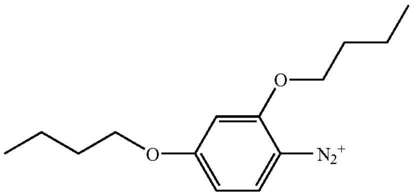
-continued
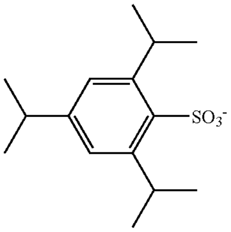
(N-10)
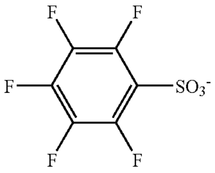
(N-11)
$PF_6^-$
(N-12)
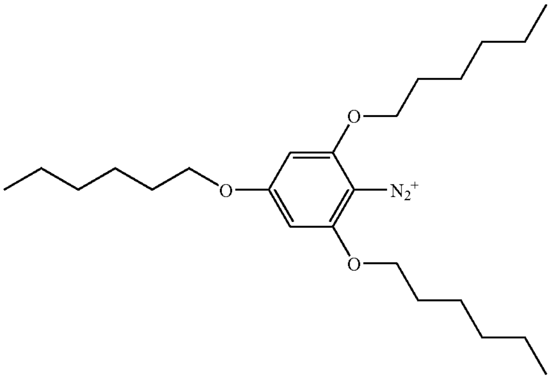
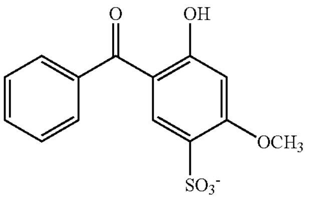
(N-13)
$ClO_4^-$
(N-14)
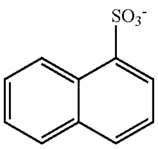
(I-1)
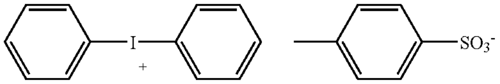
(I-2)
$PF_6^-$
(I-3)
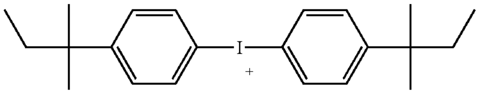
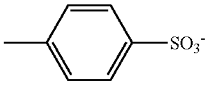

-continued
(I-4)
$ClO_4^-$
(I-5)
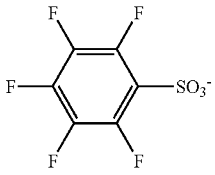
(I-6)
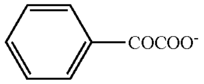
(I-7)
$CF_3SO_3^-$
(I-8)
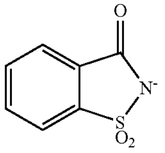
(I-9)
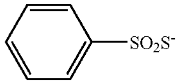
(I-10)
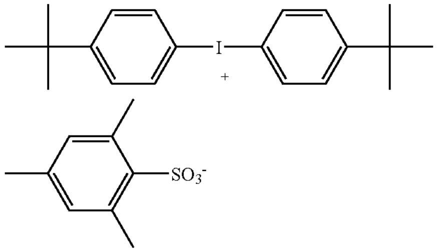
(I-11)
$ClO_4^-$
(I-12)
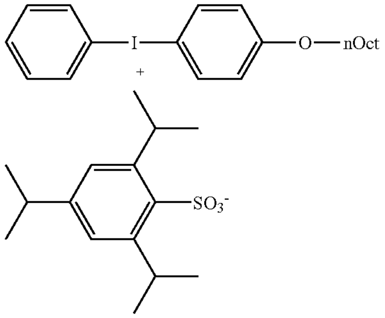
(I-13)
$CF_3COO^-$
(I-14)
$CF_3SO_3^-$
(I-15)
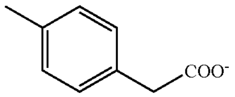
(I-16)
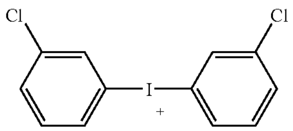
$BF_4^-$
-continued
(I-17)
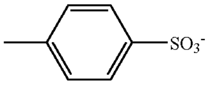
(I-18)
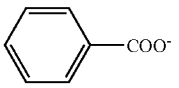
(S-1)
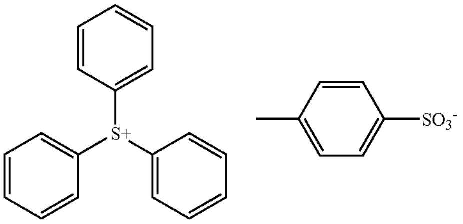
(S-2)
$PF_6^-$
(S-3)
$ClO_4^-$
(S-4)
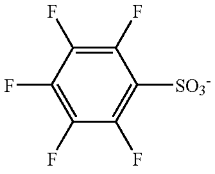
(S-5)
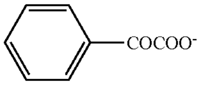
(S-6)
$CF_3SO_3^-$
(S-7)
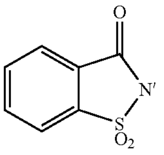
(S-8)
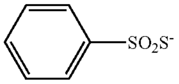
(S-9)
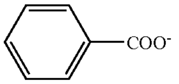
(S-10)
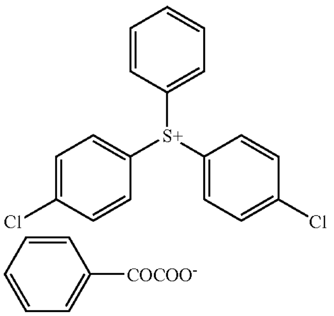
(S-11)
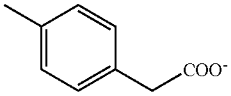

-continued (S-12)

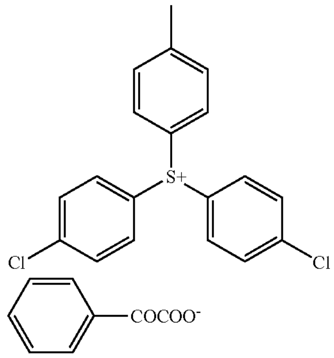

(S-13)

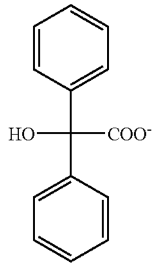

(S-14)

$BF_4^-$ (S-15)

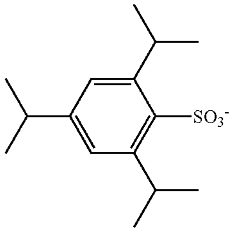

Such radical polymerization initiator can be added in a proportion of from 0.1 to 50% by weight, preferably from 0.5 to 30% by weight, and more preferably from 1 to 20% by weight, relative to the total solids content constituting the layer to which the initiator is added. Within these ranges, press life is ether improved. Such radical polymerization initiator may be used individually or in combination of two or more thereof. Also, this radical polymerization initiator may be added to the same layer with other components, or may be added to a different layer provided separately.

[Other Components of the Photosensitive-thermosensitive Layer]

The photosensitive-thermosensitive layer of the invention can contain, in addition to the above-described components, an additive such as a binder polymer, a surfactant, a coloring agent, a polymerization inhibitor, a higher fatty acid derivative, a plasticizer, an inorganic fine particle, a low-molecular-weight hydrophilic compound or the like, if necessary. These components will be explained below.

[Binder Polymer]

The above-described photosensitive-thermosensitive layer can contain a binder polymer. As for the binder polymer which can be used in the invention, conventionally known binder polymers can be used without limitation, and a linear organic polymer having the film property is preferred. Examples of such binder polymer include acrylic resins, polyvinyl acetal resins, polyurethane resins, polyurea resins, polyimide resins, polyamide resins, epoxy resins, methacrylic resins, polystyrene-based resins, novolac type phenol-typed resins, polyester resins, synthetic rubbers and natural rubbers.

The binder polymer preferably has crosslinkability in order to improve the film strength in the image area. In order to impart crosslinkability to the binder polymer, it is preferable to introduce a crosslinkable functional group such as an ethylenically unsaturated bond and the like into the main chain or the side chain of the polymer. The crosslinkable functional group may be also introduced by copolymerization.

Examples of the polymer having ethylenically unsaturated bonds in the main chain of the molecule include poly-1,4-butadiene, poly-1,4-isoprene and the like.

Examples of the polymer having ethylenically unsaturated bonds in the side chin of the molecule are polymers which are a polymer of acrylic or methacrylic acid ester or amide and in which the ester or amide residue (R in —COOR or CONHR) has an ethylenically unsaturated bond.

Examples of the residue (R in the above) having ethylenically unsaturated bonds, include $-(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^1{=}CR^2R^3$ and $(CH_2CH_2O)_2-X$, wherein $R^1$ to $R^3$ each represent a hydrogen atom, a halogen atom or an alkyl group, an aryl group, an alkoxy group or an aryloxy group respectively having 1 to 20 carbon atoms, and $R^1$ and $R^2$ or $R^3$ may combine with each other to form a ring; n represents an integer of 1 to 10; and X represents a dicyclopentadienyl residue.

Specific examples of the ester residue include $-CH_2CH{=}CH_2$ (described in the publication of JP-B No. 7-21633), $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2-NHCOO-CH_2CH{=}CH_2$ and $CH_2CH_2O-X$, wherein X represents a dicyclopentadienyl residue.

Specific examples of the amide residue include $-CH_2CH{=}CH_2$, $-CH_2CH_2-Y$, wherein Y represents a cyclohexene residue, and $-CH_2CH_2-OCO-CH{=}CH_2$.

As for the crosslinkable binder polymer, for example, a free radical (the polymerization-initiating radical or the growing radical in the course of polymerization of the polymerizable compound) is added to the crosslinkable functional group, addition polymerization is effected directly between polymers or via the polymer chains of the polymerizable compounds, and thereby crosslinking is achieved between polymeric molecules to finally cure the system. Alternatively, an atom in the polymer (for example, a hydrogen atom on a carbon atom adjacent to the functional crosslinking group) is abstracted by a free radical, subsequently polymeric radicals are generated and joined together, and thereby crosslinking is achieved between polymeric molecules to finally cure the system.

The content of the crosslinkable group in the binder polymer (the content of the radical-polymerizable, unsaturated double bond as measured by iodine titration) is preferably from 0.1 to 10.0 mmol, more preferably from 1.0 to 7.0 mmol, and most preferably from 2.0 to 5.5 mmol, relative to 1 g of the binder polymer. Within these ranges, good sensitivity and good stability on storage are obtained.

Also, from the viewpoint of improvement of the on-press developability, the binder polymer preferably has high solubility or dispersibility in the ink and/or fountain solution.

In order to improve the solubility or dispersibility in ink, the binder polymer is preferably oleophilic, whereas in order to improve the solubility or dispersibility in fountain solution, the binder polymer is preferably hydrophilic. For this reason, it is effective for the invention to use a combination of an oleophilic binder polymer and a hydrophilic binder polymer.

As the hydrophilic binder polymer, mention may be favorably made of, for example, those having a hydrophilic group such as a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group, a phosphoric acid group and the like.

Specific examples may include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a degree of hydrolysis of 60 mol % or greater, and preferably 80 mol % or greater, polyvinyl formal, polyvinyl butyral, polyvinyl pyrrolidone, homopolymers and copolymers of acrylamide, homopolymers and copolymers of methacrylamide, homopolymers and copolymers of N-methylol acrylamide, polyvinyl pyrrolidone, alcohol-soluble nylon, polyether of 2,2-bis-(4-hydroxyphenyl)propane and of epichlorohydrin, or the like.

The binder polymer preferably has a weight-average molecular weight of 5,000 or greater, and more preferably of from 10,000 to 300,000, and has a number-average molecular weight of 1,000 or greater, and more preferably of from 2,000 to 250,000. The polydispersity (weight-average molecular weight/number-average molecular weight) is preferably from 1.1 to 10.

The binder polymer is preferably any one of a random polymer, a block polymer and a graft polymer, a random polymer being more preferred. The binder polymer may be used individually or in combination of two or more species.

The binder polymer can be synthesized by the methods known in prior art. As the solvent used for the synthesis, for example, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-methyl acetamide, toluene, ethyl acetate, methyl lactate, ethyl lactate, dimethyl sulfoxide and water may be mentioned. These are used either alone or in a mixture of two or more species.

As for the radical polymerization initiator used for the synthesis of the binder polymer, known compounds such as azo-based initiators, peroxide initiators or the like may be used.

The content of the binder polymer is preferably from 10 to 90% by weight, more preferably from 20 to 80% by weight, and even more preferably from 30 to 70% by weight, relative to the total solids content of the photosensitive-thermosensitive layer. Within these ranges, it is possible to obtain good strength in the image area and good image formability.

Further, it is preferable to use the polymerizable compound and the binder polymer in such amounts that are at a weight proportion of from 1/9 to 7/3.

[Surfactant]

According to the invention, surfactants are preferably used in the photosensitive-thermosensitive layer in order to promote the on-press developability at the initiation of printing and to improve the state of the film source. For such surfactants, nonionic surfactants, anionic surfactants, cationic su ants, amphoteric surfactants, fluorosurfactants or the like may be mentioned. The surfactants may be used either individually or in combination of two or more species.

The nonionic surfactants used in the invention are not particularly limited, and those known in prior art can be used. For example, mention may be made of polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethyleneated castor oils, polyoxyethylene glycerin fatty acid partial esters, fatty acid diethanol amides, N,N-bis-2-hydroxyalkylamines, polyoxyethylene alkylamine, triethanolamine fatty acid esters, trialkylamine oxides, polyethylene glycol, and copolymers of polyethylene glycol and polypropylene glycol.

The anionic surfactants used in the invention are not particularly limited, and those known in prior art can be used. For example, mention may be made of fatty acid salts, abietates, hydroxyalkane sulfonates, alkane sulfonates, dialkylsulfosuccinic ester salts, linear alkylbenzene sulfonates, branched alkylbenzene sulfonates, alkylnaphthalene sulfonates, alkylphenoxy polyoxyethylene propylsulfonates, polyoxyethylene alkylsulfophenyl ether salts, sodium N-methyl-N-oleyltaurate, disodium N-alkylsulfosuccinic acid monoamide, petroleum sulfonates, sulfated beef tallow oils, sulfuric ester salts of fatty acid alkyl esters, alkyl sulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkyl phosphoric ester salts, polyoxyethylene alkyl ether phosphoric ester salts, polyoxyethylene alkyl phenyl ether phosphoric ester salts, partial saponification products of styrene/maleic anhydride copolymers, partial saponification products of olefin/maleic anhydride copolymers, and naphthalene sulfonate formalin condensates.

The cationic surfactants used in the invention are not particularly limited, and those known in prior art can be used. For example, mention may be made of alkylamine salts, quaternary ammonium salts, polyoxyethylene alkylamine salts, and polyethylene polyamine derivatives.

The amphoteric surfactants used in the invention are not particularly limited, and those known in prior art can be used. For example, carboxybetaines, aminocarboxylic acids, sulfobetaines, aminosulfuric esters and imidazolines may be mentioned.

In addition, among the above-described surfactants, those involving "polyoxyethylene" may be also read as "polyoxyalkylene" such as polyoxymethylene, polyoxypropylene, polyoxybutylene or the like, and the invention can also make use of those surfactants.

For more preferred surfactants, fluorosurfactants containing a perfluoroalkyl group in the molecule may be mentioned. Such fluorosurfactants may include, for example, the anionic type such as perfluoroalkyl carboxylates, perfluoroalkyl sulfonates, perfluoroalkyl phosphoric esters or the like; the amphoteric type such as perfluoroalkyl betaine or the like, the cationic type such as perfluoroalkyl trimethyl ammonium salts or the like; the nonionic type such as perfluoroalkylamine oxides, perfluoroalkyl ethylene oxide adducts, oligomers containing a perfluoroalkyl group and a hydrophilic group, oligomers containing a perfluoroalkyl group and lipophilic group, oligomers containing a perfluoroalkyl group, a hydrophilic group and a lipophilic group, urethanes containing a perfluoroalkyl group and a lipophilic group, or the like Further, the fluorosurfactants as described in the publications of JP-A Nos. 62-170950, 62-226143 and 60-168144 are also preferred.

Surfactants can be used either individually or in combination of two or more species.

The content of surfactants is preferably from 0.001 to 10% by weight, and more preferably from 0.01 to 7% by weight, relative to the total solids content of the photosensitive-thermosensitive layer.

[Coloring Agent]

According to the invention, a variety of compounds other than the above compounds may be added, if necessary. For example, a dye exhibiting large absorption in the visible region can be used as the coloring agent for an image. Specifically, Oil Yellow #101, Oil Yellow #103, Oil Pink #312, Oil Green BC Oil Blue BOS, Oil Blue #603, Oil Black BY, Oil Black BS, and Oil Black T-505 (all manufactured by Orient Chemical Industries Ltd.); Victoria Pure Blue, Crystal Violet (CI42555), Methyl Violet (CI42535), Ethyl Violet, Rhodamine B (CI145170B), Malachite Green (CI42000), and Methylene Blue (CI52015); and dyes described in JP-A No. 62-293247. Pigments such as phthalocyanine-based pigments, azo-type pigments, carbon black and titanium oxide may be suitably used.

These coloring agents are preferably added because the agents are useful to readily distinguish between image areas and non-image areas after images are formed. The amount of addition thereof is from 0.01 to 10% by weight relative to the total solids content of the photosensitive-thermosensitive layer.

[Polymerization Inhibitor]

A small amount of thermal polymerization inhibitor is preferably added to the photosensitive-thermosensitive layer, in order to prevent unnecessary thermal polymerization of the (C) radical-polymerizable monomer during the preparation or storage of the photosensitive-thermosensitive layer.

Examples of such thermal polymerization inhibitor may be mentioned favorably of hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and the aluminum salt of N-nitroso-N-phenylhydroxylamine.

The amount of the thermal polymerization inhibitor to be added is preferably from about 0.01% to about 5% by weight relative to the total solids content of the photosensitive-thermosensitive layer.

[Higher Fatty Acid Derivative, Etc.]

In the photosensitive-thermosensitive layer, a higher fatty acid derivative such as behenic acid or behenic acid amide or the like may be added and localized at the surface of the photosensitive-thermosensitive layer in the process of drying after coating, in order to prevent the polymerization hindrance due to oxygen. The amount of higher fatty acid derivatives to be added is preferably from about 0.1 to about 10% by weight relative to the total solids content of the photosensitive-thermosensitive layer.

[Plasticizer]

The photosensitive-thermosensitive layer may contain a plasticizer in order to improve the on-press developability.

As for the plasticizer, mention may be made favorably of, for example, phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diaryl phthalate or the like; glycolic esters such as dimethyl glycol phthalate, ethylphthalylethyl glycolate, methylphthalylethyl glycolate, butylphthalylbutyl glycolate, triethylene glycol dicaprylic ester or the like, phosphoric acid esters such as tricresyl phosphate, triphenyl phosphate or the like; aliphatic dibasic acid esters such as diisobutyl adipate, dioctyl adipate, dimethyl sebacate, dibutyl sebacate, dioctyl azelate, dibutyl maleate or the like; polyglycidyl methacrylate, triethyl citrate, glycerin triacetyl ester, butyl laurate or the like.

The content of the plasticizer is preferably about less than or equal to about 30% by weight relative to the total solids content of the photosensitive-thermosensitive layer.

[Inorganic Fine Particle]

The photosensitive-thermosensitive layer may contain inorganic fine particles for the improvement of the cured film strength of the image area and the improvement of the on-press developability of the non-image area.

As for the inorganic fine particles, mention may be made favorably of, for example, silica, alumina, magnesium oxide, titanium oxide, magnesium carbonate, calcium alginate or mixtures thereof. Even though they may not have a light-to-heat converting property, the fine particles can be used for strengthening of the film, intensification of the interface-adhesion by means of surface roughening, or the like.

Inorganic fine particles have an average particle size of preferably from 5 nm to 10 μm, and more preferably from 0.5 to 3 μm. In these ranges, they can be stably dispersed within the photosensitive-thermosensitive layer to sufficiently maintain the film strength of the photosensitive-thermosensitive layer, and can form a non-image area which has excellent hydrophilicity, thus making the area resistant to contamination upon printing.

Such inorganic fine particles as described in the above are easily available as commercial products such as colloidal silica dispersions or the like.

The content of the inorganic fine particles is preferably 20% by weight or less, and more preferably 10% by weight or less, relative to the total solids content of the photosensitive-thermosensitive layer.

[Low-molecular-weight Hydrophilic Compound]

The photosensitive-thermosensitive layer may contain a hydrophilic low-molecular-weight compound for improving the on-press developability. Examples of the hydrophilic low-molecular-weight compound may include, as the water-soluble organic compound, glycols such as ethylene glycol, diethylene glycol, triethylene glycol, propylene glycol, dipropylene glycol, tripropylene glycol or the like and ether or ester derivatives thereof; polyhydroxies such as glycerin, pentaerythritol or the like; organic amines such as triethanolamine, diethanolamine, monoethanolamine or the like and salts thereof; organic sulfonates such as toluene sulfonate, benzene sulfonate or the like and salts thereof, organic phosphonates such as phenyl phosphonate or the like and salts thereof, and organic carboxylic acids such as tartaric acid, oxalic acid, citric acid, malic acid, lactic acid, gluconic acid, amino acids or the like and salts thereof.

<Formation of the Radical Polymerization Type Photosensitive-thermosensitive Layer>

According to the invention, several embodiments can be used as the method of incorporating the above-mentioned constituents of the photosensitive-thermosensitive layer into the photosensitive-thermosensitive layer. One is an embodiment of dissolving the constituents in a suitable solvent and applying the solution as described in, for example, the publication of JP-A No. 2002-287334. Another is an embodiment of encapsulating the constituents of the photosensitive-thermosensitive layer in microcapsules and incorporating the microcapsules into the photosensitive-thermosensitive layer (microcapsule type photosensitive-thermosensitive layer) as described in, for example, the publications of JP-A Nos. 2001-277740 and 2001-277742. In the microcapsule type photosensitive-thermosensitive layer, the constituents may be also incorporated outside the microcapsules. In a preferred embodiment of the microcapsule type photosensitive-thermosensitive layer, hydrophobic constituents are encapsulated inside the microcapsules and hydrophilic constituents are incorporated outside the microcapsules.

In a more preferred embodiment, the infrared absorbent with the acid generator, acid amplifier and acid discoloring agent, or with the base generator, base amplifier and base discoloring agent among the constituents of the photosensitive-thermosensitive layer are microencapsulated, since separation of the printout image-forming reaction system from the printing image-forming reaction system allows to avoid from the reactions interrupting each other.

As the method of microencapsulating the aforementioned constituents of the photosensitive-thermosensitive layer, any known method can be employed. For example, as the method of preparing microcapsules, the method of utilizing coacervation as described in the specifications of U.S. Pat. Nos. 2,800,457 and 2,800,458; the interracial polymerization method as described in the specification of U.S. Pat. No. 3,287,154, and the publications of JP-B Nos. 38-19574 and 42-446; the method of polymer precipitation as described in the specifications of U.S. Pat. Nos. 3,418,250 and 3,660,304; the method of using the isocyanate polyol wall material as described in the specification of U.S. Pat. No. 3,796,669; the method of using the isocyanate wall material as described in the specification of U.S. Pat. No. 3,914,511; the method of using the wall-forming materials of the urea-formaldehyde system or the urea-formaldehyde-resorcinol system as described respectively in the specifications of U.S. Pat. Nos. 4,001,140, 4,087,376 and 4,089,802; the method of using the wall materials such as melamine-formaldehyde resin, hydroxycellulose or the like as described in the specification of U.S. Pat. No. 4,025,445; the in situ monomer polymerization method as described respectively in the publications of JP-B Nos. 36-9163 and 51-9079; the method of spray-drying as described in the specifications of GBP No. 930422 and U.S Pat. No. 3,111,407; the method of electrolytic dispersion cooling as described in the specifications of GBP Nos. 952807 and 967407; or the like may be mentioned, without being limited to these.

The wall of the microcapsules used in the invention preferably has a three-dimensional crosslinked structure and the property of swelling in a solvent. From this point of view, the wall material for the microcapsules is preferably polyurea, polyurethane, polyester, polycarbonate, polyamide and mixtures thereof, polyurea and polyurethane being particularly preferred. Also, a compound having a crosslinkable functional group such as an ethylenically unsaturated bond which can be introduced to the above-mentioned binder polymer may be introduced to the microcapsule wall.

The average particle size of the microcapsule is preferably from 0.01 to 3.0 μm, more preferably from 0.05 to 2.0 μm, and particularly preferably from 0.10 to 1.0 μm, Within these ranges, good resolution and stability over time can be obtained.

Further, in an embodiment of the invention, each component of the above-described photosensitive-thermosensitive layer, particularly preferably each of the infrared absorbent, the acid generator, the acid amplifier and the acid discoloring agent, or each of the infrared absorbent, the base generator, the base amplifier and the base discoloring agent may be individually encapsulated in a resin fine particle.

This embodiment can be achieved by using a resin fine particle dispersion prepared by dissolving each component in a solvent and mixing with a polymer solution (preferably, an aqueous polymer solution) by means of a homogenizer or the like.

The solvent which can be used in this case may include ethyl acetate, methyl ethyl ketone (MEK), diisopropyl ether, dichloromethane, chloroform, toluene, dichloroethane, and mixtures thereof.

Also, the foregoing polymer may include polyvinyl alcohol (PVA), polyacrylic acid, sodium polyacrylate, polyacrylamide, polymethacrylic acid, sodium polymethacrylate, polymethacrylamide, polystyrene sulfonic acid, sodium polystyrene sulfonate, acrylic acid-methyl acrylate copolymer, methacrylic acid-methyl methacrylate copolymer, styrene-sodium styrene sulfonate copolymer and the like.

The photosensitive-thermosensitive layer is coated with a coating solution prepared by dispersing or dissolving each of the necessary components in a solvent. For the solvent used herein, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl acetamide, N,N-dimethyl formamide, tetradimethylurea, N-methylpyrrolidone, dimethyl sulfoxide, sulfolane, γ-butyrolactone, toluene, water or the like may be mentioned, without being limited to these: These solvents may be used either individually or as mixtures. The concentration of the solids in the coating solution is preferably from 1 to 50% by weight. The photosensitive-thermosensitive layer can be also formed by preparing a plurality of coating solutions in which the same or different components are dispersed or dissolved in the same or different solvents and repeating the process of applying and drying of the solutions multiple times.

Furthermore, the amount of coating of the photosensitive-thermosensitive layer (the solids content) on the support that can be obtained after coating and drying varies depending on the use, but in general it is preferably from 0.3 to 3.0 $g/m^2$. Within this range, good sensitivity and good film properties of the photosensitive-thermosensitive layer may be obtained.

For the method of coating, various methods can be used. For example, bar-coater coating, rotary coating, spray coating, curtain coating, dip coating, air knife coating, blade coating, roll coating or the like may be mentioned.

(b) Hydrophobization Precursor Type Image-forming Element

<Hydrophobization Precursor>

The hydrophobization precursor of the invention means a fine particle that can convert the hydrophilic photosensitive-thermosensitive layer to hydrophobic upon application of heat. This fine particle is preferably at least one fine particle selected from a thermoplastic polymer fine particle and a thermoreactive polymer fine particle. Also, it may be a microcapsule encapsulating a compound having a thermoreactive group.

As for the thermoplastic polymer fine particle used in the photosensitive-thermosensitive layer, mention may be made favorably of the thermoplastic polymer fine particles as described in Research Disclosure No. 33303, January 1992, the publications of JP-A Nos. 9-123387, 9-131850, 9-171249, 9-171250 and the specification of EP No. 931647. Specific examples of the polymer constituting the polymer fine particle include homopolymers or copolymers of monomers such as ethylene, styrene, vinyl chloride, methyl acrylate, ethyl acrylate, methyl methacrylate, ethyl methacrylate, vinylidene chloride, acrylonitrile, vinyl carbazole or the like, or mixtures thereof. Among them, more preferred are polystyrene and polymethyl methacrylate.

The average particle size of the thermoplastic polymer fine particles used in the invention is preferably from 0.01 to 2.0 μm. The method for synthesis of such thermoplastic polymer fine particles includes, in addition to the emulsion polymerization method and suspension polymerization method, the method of dissolving those compounds in a non-aqueous organic solvent, mixing and emulsifying the resulting solution with an aqueous solution containing a dispersant, and solidifying the mixture into a microparticulate form while evaporating the organic solvent by applying more beat (dissolution dispersion method).

The thermoreactive polymer fine particle used in the invention may be exemplified by a thermocurable polymer fine particle and a polymer fine particle having a thermoreactive group.

The thermocurable polymer may be exemplified by resins having the phenolic skeleton, urea-based resins (e.g., a urea derivative such as urea or methoxymethylated urea resinified by an aldehyde such as formaldehyde), melamine-based resins ((e.g., melamine or its derivative resinified by an aldehyde such as formaldehyde), alkyd resins, unsaturated polyester resins, polyurethane resins, epoxy resins or the like. Among them, particularly preferred are the resins having the phenolic skeleton, melamine resins, urea resins and epoxy resins.

As for the resin having an appropriate phenolic skeleton, for example, the phenolic resins obtained by resinifying phenol, cresol or the like by an aldehyde such as formaldehyde, hydroxystyrene resins, and the polymer or copolymer of methacrylamide, acrylamide, methacrylate or acrylate having the phenolic skeleton, such as N-(p-hydroxyphenyl)methacrylamide, p-hydroxyphenyl methacrylate or the like.

The average particle size of the thermocurable polymer fine particle used in the invention is preferably from 0.01 to 2.0 μm. Such thermocurable polymer fine particles can be obtained by the dissolution dispersion method, but it is also possible to carry out microparticulation during the synthesis of the thermocurable polymer. However, the method is not limited to this.

As for the thermoreactive group of the polymer fine particle having a thermoreactive group as used in the invention, it may be any functional group undergoing any reaction as long as a chemical bond is to be formed, but mention may be favorably made of an ethylenically unsaturated group undergoing a radical polymerization reaction (e.g., an acryloyl group, a methacryloyl group, a vinyl group, an allyl group, etc.), a cationic polymerizable group (e.g., a vinyl group, a vinyloxy group, etc.), an isocyanate group undergoing an addition reaction or its block form, an epoxy group, a vinyloxy group and the functional group having an active hydrogen atom which is the counterpart in the reaction involving the above functional groups (e.g., an amino group, a hydroxyl group, a carboxyl group, etc.), a carboxyl group undergoing a condensation reaction and its counterpart hydroxyl group or amino group, an acid anhydride undergoing a ring-opening addition reaction and its counterpart amino group or hydroxyl group, and the like.

Incorporation of such functional group into the polymer fine particle may be carried out during polymerization or after polymerization via a polymeric reaction.

In the case of incorporating during polymerization, it is preferable to subject the monomer having the foregoing functional group to emulsion polymerization or suspension polymerization. Specific examples of the monomer having the foregoing functional group include aryl methacrylite, aryl acrylate, vinyl methacrylate, vinyl acrylate, 2-(vinyloxy) ethyl methacrylate, p-vinyloxystyrene, p-{2-(vinyloxy) ethyl}styrene, glycidyl methacrylate, glycidyl acrylate, 2-isocyanatoethyl methacrylate or its block isocyanate with an alcohol or the like, 2-isocyanatoethyl acrylate or its block isocyanate with an alcohol or the like, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, bifunctional methacrylate and the like, without being limited to these.

According to the invention, a copolymer of such a monomer with a monomer having no thermoreactive group, which is copolymerizable with such a monomer, ran be also used. The copolymerizable monomer having no thermoreactive group may be exemplified by styrene, alkyl acrylate, alkyl methacrylate, acrylonitrile, vinyl acetate or the like. However, the monomer is not limited to these as long as it has no thermoreactive group.

As for the polymeric reaction used in the case of incorporating a thermoreactive group after polymerization, for example, the polymeric reaction as described in the pamphlet of International Publication No. 96/34316 may be mentioned.

Among the polymer fine particle having such a thermoreactive group, those undergoing interparticular coalescence of polymer fine particles under heat are preferred, and those having a hydrophilic surface and dispersing in water are particularly preferred. It is preferable that the contact angle (aerial water droplet) of a film prepared by applying only the polymer fine particles and drying them at a temperature lower then the coagulation temperature, is smaller than the contact angle (aerial water droplet) of a film prepared by drying at a temperature higher than the coagulation temperature. As such, if it is desired to make the surface of the polymer fine particle hydrophilic, a hydrophilic polymer such as polyvinyl alcohol, polyethylene glycol or the like, or an oligomer or a hydrophilic low-molecular-weight compound may be adsorbed on the surface of the polymer fine particle. However, the surface-hydrophilization method is not limited thereto.

The coagulation temperature of the polymer fine particle having such a thermoreactive group is preferably 70° C. or higher, and in view of the stability over time, more preferably 100° C. or higher. The average particle size of the polymer fine particle is preferably from 0.01 to 2.0 μm more preferably from 0.05 to 2.0 μm, and most preferably from 0.1 to 1.0 μm. Within these ranges, good resolution and stability over time can be obtained.

As for the thermoreactive group in the microcapsule encapsulating the compound having a thermoreactive group as used in the invention, mention may be made favorably of the same thermoreactive groups as those used in the above-described polymer fine particle having a thermoreactive group. Hereinafter, the compound having a thermoreactive group will be illustrated.

As for the compound having a radical-polymerizable unsaturated group, the same compounds as those described for the radical polymerization type microcapsules can be suitably used.

As for the compound having a vinyloxy group suitable for use in the invention, the compounds described in the publication of JP-A No. 2002-29162 may be mentioned. Specific examples thereof include tetramethylene glycol divinyl ether, trimethylolpropane trivinyl ether, tetraethylene glycol divinyl ether, pentaerythritol divinyl ether, pentaerythritol trivinyl ether, pentaerythritol tetravinyl ether, 1,4-bis{2-(vinyloxy)ethyloxy}benzene, 1,2-bis{2-(vinyloxy)ethyloxy}benzene, 1,3-bis{2-(vinyloxy)ethyloxy}benzene, 1,3,5-tris{2-(vinyloxy)ethyloxy}benzene, 4,4'-bis{2-(vinyloxy)ethyloxy}biphenyl, 4,4'-bis{2-(vinyloxy)ethyloxy}diphenyl ether, 4,4'-bis{2-(vinyloxy)ethyloxy}diphenylmethane, 1,4-bis{2-(vinyloxy)ethyloxy}naphthalene, 2,5-bis{2-(vinyloxy)ethyloxy}furan, 2,5-bis{2-(vinyloxy)ethyloxy}thiophene, 2,5-bis{2-(vinyloxy)ethyloxy}imidazole, 2,2-bis[4-{2-(vinyloxy)ethyloxy}phenyl]propane {bis(vinyloxyethyl)ether of bisphenol A}, 2,2-bis{4-vinyloxymethyloxy)phenyl}propane, 2,2-bis{4-(vinyloxy)phenyl}propane or the like, without being limited to these.

The compound having an epoxy group suitable for use in the invention is preferably a compound having two or more epoxy groups, and examples thereof include glycidyl ether compounds and prepolymers thereof, which can be obtained by a reaction of polyhydric alcohol or polyvalent phenol with epichlorohydrin, and also polymers or copolymers of glycidyl acrylate or glycidyl methacrylate.

Specific examples thereof include propylene glycol diglycidyl ether, tripropylene glycol diglycidyl ether, polypropylene glycol diglycidyl ether, neopentyl glycol diglycidyl ether, trimethylolpropane triglycidyl ether, diglycidyl ether of hydrogenated bisphenol A, hydroquinone diglycidyl ether, resorcinol diglycidyl ether, diglycidyl ether or epichlorohydrin adduct of bisphenol A, diglycidyl ether or epichlorohydrin adduct of bisphenol F, diglycidyl ether or epichlorohydrin adduct of halogenated bisphenol A, diglycidyl ether or epichlorohydrin adduct of biphenyl type bisphenol, glycidyl etherified product of novolak resin, methyl methacrylate/glycidyl methacrylate copolymer, ethyl methacrylate/glycidyl methacrylate copolymer, and the like.

Examples of the commercially available product of this compound include Epikote 1001 (molecular weight: about 900, epoxy equivalent: from 450 to 500), Epikote 1002 (molecular weight: about 1,600, epoxy equivalent: from 600 to 700), Epikote 1004 (molecular weight: about 1,060, epoxy equivalent: from 875 to 975), Epikote 1007 (molecular weight: about 2,900, epoxy equivalent: 2,000), Epikote 1009 (molecular weight: about 3,750, epoxy equivalent: 3,000), Epikote 1010 (molecular weight: about 5,500, epoxy equivalent: 4,000), Epikote 1100L (epoxy equivalent: 4,000), Epikote YX31575 (epoxy equivalent: 1,200), all manufactured by Japan Epoxy Resin Co., Ltd., Sumiepoxy ESCN-195XHT, ESCN-195XL, ESCN-195XF, all manufactured by Sumitomo Chemical Co., Ltd., and the like.

As for the isocyanate compound suitable for the invention, mention may be made of tolylene diisocyanate, diphenylmethane diisocyanate, polymethylene polyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, and compounds resulting from blocking of these compounds with an alcohol or an amine.

The amine compound suitable for the invention may be exemplified by ethylenediamine, diethylenetriamine, triethylenetetramine, hexamethylenediamine, propylenediamine, polyethyleneimine or the like.

The compound having a hydroxy group suitable for the invention may be exemplified by compounds having a terminal methylol group, polyhydric alcohols such as pentaerythritol, bisphenol-polyphenols, or the like.

The compound having a carboxy group suitable for the invention includes aromatic polyvalent carboxylic acids such as pyromellitic acid, trimellitic acid and phthalic acid, and aliphatic polyvalent carboxylic acids such as adipic acid. The acid anhydride suitable for the invention includes pyromellitic anhydride, benzophenonetetracarboxylic anhydride and the like.

The microencapsulation of the compound having a thermoreactive group can be performed by the known method described above in regard to the radical polymerization type.

<Other Components of the Photosensitive-thermosensitive Layer>

The photosensitive-thermosensitive layer may contain a hydrophilic resin in order to enhance the on-press developability or the film strength of the photosensitive-thermosensitive layer itself. The hydrophilic resin is preferably a resin having a hydrophilic group such as a hydroxyl group, an amino group, a carboxyl group, a phosphoric acid group, a sulfonic acid group and an amido group.

The hydrophilic resin preferably has a group undergoing a reaction with a thermoreactive group, since the resin is crosslinked by reacting with the thermal reactive group of the hydrophobization precursor, thus the image strength being increased and the press life being improved. For example, when the hydrophobization precursor has a vinyloxy group or an epoxy group, the hydrophilic resins having a hydroxyl group, a carboxyl group, a phosphoric acid group, a sulfonic acid group or the like are preferred Among these, the hydrophilic resins having a hydroxyl group or a carboxyl group are more preferred.

Specific examples of the hydrophilic resin include gum arabic, casein, gelatin, starch derivatives, soybean glue, hydroxypropyl cellulose, methyl cellulose, carboxymethyl cellulose and sodium salts thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate having a degree of hydrolysis of 60 mol % or greater, preferably 80 mol % or greater, polyvinyl formal, polyvinylpyrrolidone, homopolymers and copolymers of acrylamide, homopolymers and copolymers of methacrylamide, homopolymers and copolymers of N-methylolacrylamide, homopolymers and copolymers of 2-acrylamide-2-methyl-1-propanesulfonic acid, homopolymers and copolymers of 2-methacryloyloxyethylphosphonic acid, and the like.

The amount of the hydrophilic resin to be added to the photosensitive-thermosensitive layer is preferably 20% by weight or less, more preferably 10% by weight or less.

The hydrophilic resin may be used after being crosslinked to such a degree that the unexposed area can be on-press developed on a printing press. Examples of the crosslinking agent include aldehydes such as glyoxal, melamine formaldehyde resin and urea formaldehyde resin; methylol compounds such as N-methylolurea, N-methylolmelamine and methylolated polyamide resin; active vinyl compounds such as divinylsulfone and bis(β-hydroxyethylsulfonic acid); epoxy compounds such as epichlorohydrin, polyethylene glycol diglycidyl ether, polyamide, polyamine, an epichlorohydrin adduct and a polyamide epichlorohydrin resin; ester compounds such as monochloroacetic acid ester and thioglycolic acid ester, polycarboxylic acids such as polyacrylic acid and methyl vinyl ether/maleic acid copolymer; inorganic crosslinking agents such as boric acid, titanyl sulfate, Cu, Al, Sn, V and Cr salt; and modified polyamideimide resins. In addition, a crosslinking catalyst such as ammonium chloride, silane coupling agent and titanate coupling agent can be used in combination.

The photosensitive-thermosensitive layer may contain a reaction accelerator which initiates or accelerates the reaction of the aforementioned thermoreactive group. As for such reaction accelerator, mention may be made favorably of the above-described radical polymerization initiators.

The reaction accelerators can be used in combination of two or more species. Also, the addition of the reaction accelerator to the photosensitive-thermosensitive layer may be direct addition to the coating solution for the photosensitive-thermosensitive layer, or addition in the form of being contained in polymer fine particles. The content of the reaction accelerator in the photosensitive-thermosensitive layer is preferably from 0.01 to 20% by weight, and more preferably from 0.1 to 10% by weight, relative to the total solids content of the photosensitive-thermosensitive layer. Within these ranges, good reaction initiating or accelerating effect can be obtained without impairing the on-press developability.

In the case of the hydrophobization precursor type photosensitive-thermosensitive layer, a polyfunctional monomer may be added to the photosensitive-thermosensitive layer matrix in order to further improve the press life, Examples of the polyfunctional monomer include those described above as polymerizable compounds. Among these monomers, preferred are trimethylolpropane triacrylate, pentaerythritol triacrylate and the like.

In addition, the above-described hydrophobization precursor type photosensitive-thermosensitive layer may contain, if necessary, additives such as a surfactant, a coloring agent, a polymerization inhibitor, a higher fatty acid derivative, a plasticizer, an inorganic fine particle, a low-molecular-weight hydrophilic compound or the like which are described above in <Other components of the photosensitive-thermosensitive layer> of the polymerization type photosensitive-thermosensitive layer.

<Formation of the Hydrophobization Precursor Type Photosensitive-thermosensitive Layer>

The above-mentioned hydrophobization precursor type photosensitive-thermosensitive layer is formed, in the same way as in the above-described radical polymerization type photosensitive-thermosensitive layer, by dispersing or dissolving necessary components in a solvent to prepare a coating solution, and applying and drying it on a support.

The amount (solids content) of coating of the photosensitive-thermosensitive layer obtained on the support after applying and drying varies depending on use, but in general, it is preferably from 0.5 to 5.0 g/$m^2$.

When the hydrophobization precursor type photosensitive-thermosensitive layer is used, a lithographic printing plate precursor which is capable of on-press development can be produced.

Meanwhile, when the hydrophobization precursor type photosensitive-thermosensitive layer is formed as a "hydrophilic layer having a crosslinked structure" with sufficient press life even when unexposed, the lithographic printing plate precursor of the invention is applicable to the non-processing (non-development) type lithographic printing plate precursor.

It is a preferred embodiment that the hydrophilic layer having a crosslinked structure contains at lest one selected from a hydrophilic resin having a crosslinked structure formed therein, and an inorganic hydrophilic binding resin formed by sol-gel transition. Of these, the hydrophilic resin will be described first. Addition of the hydrophilic resin is advantageous in that the affinity to hydrophilic components in the emulsion ink is enhanced, and the film strength of the photosensitive-thermosensitive layer itself is improved. Preferred examples of the hydrophilic resin include those having a hydrophilic group such as hydroxyl, carboxyl, hydroxyethyl, hydroxypropyl, amino, aminoethyl, aminopropyl, carboxymethyl or the like.

Specific examples of the hydrophilic resin include gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and salts thereof polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a degree of hydrolysis of at least 60 mol %, and preferably at least 80 mol %, polyvinyl formal, polyvinyl butyral, polyvinylpyrrolidone, homopolymers and copolymers of acrylamide, homopolymers and polymers of methacrylamide, homopolymers and copolymers of N-methylolacrylamide, and the like.

In the case of using this hydrophilic resin for the photosensitive-thermosensitive layer according to the invention, the hydrophilic resin may be used after crosslinking it. As for the crosslinking agent used for forming the crosslinking structure, those described above are used.

In a preferred embodiment for the non-processing (non-development) type photosensitive-thermosensitive layer, the layer contains an inorganic hydrophilic binding resin formed by sol-gel transition. The sol-gel transition type binding resin is suitably a polymer product in which the bonding groups from polyvalent elements form a network structure, that is, a three-dimensional crosslinked structure, via oxygen atoms, and at the same time, polyvalent metals also have non-bonded hydroxyl groups and alkoxy groups which are present randomly to form a resinous structure. In a stage where many alkoxy groups and hydroxyl groups are present, the resin is in a sol state, and while the dehydration condensation proceeds, the network resin structure is stiffened. The polyvalent bonding elements of the compound having a hydroxyl group or an alkoxy group and undergoing sol-gel transition are aluminum, silicon, titanium, zirconium and the like, and they all can be used in the invention. Among these, more preferred is a sol-gel transition system using silicon, and a system containing a silane compound having at least one silanol group and capable of undergoing sol-gel transition is particularly preferred. The sol-gel transition system using silicon is described below, but the sol-gel transition system using aluminum, titanium or zirconium can be effected by replacing silicon described below with each of the elements.

The sol-gel transition type binding resin is preferably a resin having a siloxane bond and a silanol group. This resin is incorporated into the photosensitive-thermosensitive layer through a process in which a coating solution that is a sol system containing a compound having at least one silanol group is used so that gelation occurs with the progress of condensation of the silanol group during application and drying, and thereby a siloxane skeleton structure is formed.

In the photosensitive-thermosensitive layer containing the sol-gel transition type binding resin, the above-described hydrophilic resin or crosslinking agent may be also used in combination for the purpose of improving physical performance such as film strength and flexibility of film, or the coating property.

The siloxane resin forming a gel structure is represented by the following Formula (III), and the silane compound having at least one silanol group is represented by the following Formula (IV). The material system added to the photosensitive-thermosensitive layer is not necessarily the silane compound represented by Formula (IV) alone, and in general, it may be an oligomer resulting from partial condensation of a silane compound or a mixture of the silane compound of Formula (IV) and the oligomer.

Formula (III)

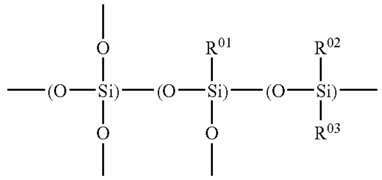

The siloxane resin represented by Formula (III) is formed by sol-gel transition from a liquid dispersion containing at least one silane compound represented by Formula (IV). In formula (III), at least one of $R^{01}$ to $R^{03}$ represents a hydroxyl group, and the remaining represents an organic residue selected from $R^0$ and Y in Formula (IV).

$(R^0)_nSi(Y)_{4-n}$ Formula (IV)

wherein $R^0$ represents a hydroxyl group, a hydrocarbon group or a heterocyclic group; Y represents a hydrogen atom, a halogen atom, —$OR^1$, —$OCOR^2$ or —$N(R^3)(R^4)$; $R^1$ and $R^2$ each represents a hydrocarbon group; $R^3$ and $R^4$ may be identical or different and each represents a hydrocarbon group or a hydrogen atom; and n represents 0, 1, 2 or 3.

The hydrocarbon group or heterocyclic group of $R^0$ represents, for example, an optionally substituted linear or branched alkyl group having 1 to 12 carbon atoms (e.g., methyl, ethyl, propyl, butyl, pentyl, hexyl, heptyl, octyl, nonyl, decyl, dodecyl or the like. Examples of the group substituted to these groups include a halogen atom (e.g., chlorine, fluorine, bromine), a hydroxyl group, a thiol group, a carboxyl group, a sulfo group, a cyano group, an epoxy group, an —OR' group (R' represents a methyl group, an ethyl group, a propyl group, a butyl group, a heptyl group, a hexyl group, an octyl group, a decyl group, a propenyl group, a butenyl group, a hexenyl group, an octenyl group, a 2-hydroxyethyl group, a 3-chloropropyl group, a 2-cyanoethyl group, an N,N-dimethylaminoethyl group, a 2-bromoethyl group, a 2-(2-methoxyethyl)oxyethyl group, a 2-methoxycarbonylethyl group, a 3-carboxyethyl group, a 3-carboxypropyl group or a benzyl group); an —OCOR" group (R" has the same meaning as R'), a —COOR" group, a —COR" group, an —N(R''')(R''') group (R''' represents a hydrogen atom or has the same meaning as R', and R'''s may be identical or different), an —NHCONH" group, an —NHCOOR" group, an —$Si(R")_3$ group, a —CONHR" group or the like. A plurality of these substituents may be substituted in the alkyl group; an optionally substituted linear or branched alkenyl group having 2 to 12 carbon atoms (e.g., vinyl, propenyl, butenyl, pentenyl, hexenyl, octenyl, decenyl, dodecenyl or the like. Examples of the group substituted to these groups are the same as those groups substituted to the foregoing alkyl group); an optionally substituted aralkyl group having 7 to 14 carbon atoms (e.g., benzyl, phenethyl, 3-phenylpropyl, naphthylmethyl, 2-naphthylethyl or the like. Examples of the group substituted to these groups are the same as those groups substituted to the alkyl group, and a plurality of these substituents may be substituted); an optionally substituted alicyclic group having 5 to 10 carbon atoms (e.g., cyclopentyl, cyclohexyl, 2-cyclohexylethyl, norbornyl, adamantly or the like. Examples of the group substituted to these groups are the same as those groups substituted to the alkyl group, and a plurality of these substituents may be substituted); an optionally substituted aryl group having 6 to 12 carbon atoms (e.g., phenyl, naphthyl or the like. Examples of the substituent are the same as those groups substituted to the alkyl group, and a plurality of these substituents may be substituted), or an optionally annelated heterocyclic group containing at least one atom selected from a nitrogen atom, an oxygen atom and a sulfur atom (e.g., pyran, furan, thiophene, morpholine, pyrrole, thiazole, oxazole, pyridine, piperidine, pyrrolidone, benzothiazole, benzoxazole, quinoline, tetrahydrofuran or the like. These rings each may have a substituent, and examples of the substituent are the same as those groups substituted to the alkyl group. A plurality of substituents may be substituted).

The substituent in the —$OR^1$ group, —$OCOR^2$ group or —$N(R^3(R^4)$ group for Y of Formula (IV) represents, for example, the following substituents. In the —$OR^1$ group, $R^1$ represents an optionally substituted aliphatic group having 1 to 10 carbon atoms [e.g., methyl, ethyl, propyl, butyl, heptyl, hexyl, pentyl, octyl, nonyl, decyl, propenyl, butenyl, heptenyl, hexenyl octenyl, decenyl, 2-hydroxyethyl, 2-hydroxypropyl, 2-methoxyethyl, 2-(2-methoxyethyl)oxyethyl, 2-(N,N-dimethylamino)ethyl, 2-methoxypropyl, 2-cyanoethyl, 3-methyloxypropyl, 2-chloroethyl, cyclohexyl, cyclopentyl, cyclooctyl, chlorocyclohexyl, methoxycyclohexyl, benzyl, phenethyl, dimethoxybenzyl, methylbenzyl bromobenzyl or the like].

In the —$OCOR^2$ group, $R^2$ represents an aliphatic group having the same meaning as $R^1$ or an optionally substituted aromatic group having 6 to 12 carbon atoms (examples of the aromatic group are the same as those described for the aryl group of R). Also, in the —$N(R^3)(R^4)$ group, $R^3$ and $R^4$ may be identical or different, and each represents a hydrogen atom or an optionally substituted aliphatic group having 1 to 10 carbon atoms (examples of the aliphatic group are the same as those described for $R^1$ of the —$OR^1$ group). More preferably, the total number of carbon atoms in $R^3$ and $R^4$ is 16 or less. Specific examples of the silane compound represented by Formula (IV) include, but not limited to, the following compounds:

tetrachlorosilane, tetramethoxysilane, tetraethoxysilane, tetraisopropoxysilane, tetra-n-propylsilane, methyltrichlorosilane, methyltrimethoxysilane, methyltriethoxysilane, ethyltrichlorosilane, ethyltrimethoxysilane, ethyltriethoxysilane, n-propyltrichlorosilane, n-propyltrimethoxysilane, n-hexyltrimethoxysilane, n-decyltrimethoxysilane, phenyltrichlorosilane, phenyltrimethoxysilane, dimethoxyditriethoxysilane, dimethyldichlorosilane, dimethyldimethoxysilane, diphenyldimethoxysilane, phenylmethyldimethoxysilane, triethoxyhydrosilane, trimethoxyhydrosilane, vinyltrichlorosilane, vinyltrimethoxysilane, trifluoropropyltrimethoxysilane, glycidoxypropylmethyldimethoxysilane, γ-glycidoxypropylmethyldimethoxysilane, γ-glycidoxypropyltriethoxysilane, γ-methacryloxypropyltrimethoxysilane, γ-aminopropylmethyldimethoxysilane, γ-aminopropyltriethoxysilane, γ-mercaptopropylmethyldimethoxysilane, γ-mercaptopropyltrimethoxysilane, γ-mercaptopropyltriethoxysilane, β-(3,4-epoxycyclohexyl)ethyltrimethoxysilane and the like.

In the photosensitive-thermosensitive layer, together with the silane compound of Formula (IV), a metal compound capable of bonding to the resin upon sol-gel transition and forming a film, such as Ti, Zn, Sn, Zr, Al or the like, can be used in combination. Examples of the metal compound used here include $Ti(OR'')_4$, $TiCl_4$, $Zn(OR'')_2$, $Zn(CH_3COCHCOCH_3)_2$, $Sn(OR'')_4$, $Sn(CH_3COCHCOCH_3)_4$, $Sn(OCOR'')_4$, $SnCl_4$, $Zr(OR'')_4$, $Zr(CH_3COCHCOCH_3)_4$, $(NH_4)_2ZrO(CO_3)_2$, $Al(OR'')_3$ and $Al(CH_3COCHCOCH_3)_3$, wherein R" represents a methyl group, an ethyl group, a propyl group, a butyl group, a pentyl group or a hexyl group.

Further, in order to accelerate the hydrolysis and polycondensation reaction of the compound represented by Formula (IV) and the metal compound used in combination, an acidic catalyst or a basic catalyst is preferably used in combination. As for the catalyst, an acidic or basic compound may be used as it is or may be used after dissolving it in water or a solvent such as alcohol (hereinafter referred to as an acidic catalyst or a basic catalyst, respectively). At this time, the concentration is not particularly limited, but when the concentration is high, the rates of the hydrolysis and polycondensation reaction tend to increase.

However, if a basic catalyst at a high concentration is used, a precipitate may be produced in the sol solution Therefore, the concentration of the basic catalyst is preferably 1N (concentration calculated in terms of an aqueous solution) or less.

Specific examples of the acidic catalyst include hydrogen halides such as hydrochloric acid, nitric acid, sulfuric acid, sulfurous acid, hydrogen sulfide, perchloric acid, hydrogen peroxide, carbonic acid, carboxylic acids such as formic acid and acetic acid, and sulfonic acids such as benzenesulfonic acid, and specific examples of the basic catalyst include ammoniacal bases such as aqueous ammonia, and amines such as ethylamine and aniline. However, the invention is not limited thereto.

The photosensitive-thermosensitive layer produced by using the above-described sol-gel method is particularly preferred for the constitution of the photosensitive-thermosensitive layer according to the invention. The sol-gel method is described in detail, for example, in Sumio Sakka, "Science of Sol-Gel Method", Agne Shofu-Sha (1988), Seki Hirashima, "Preparation Technique of Functional Thin Film by the Latest Sol-Gel Method", Sogo Gijutsu Center (1992) or the like.

The amount of the hydrophilic resin to be added in the photosensitive-thermosensitive layer having a crosslinked structure is preferably from 5 to 70% by weight, and more preferably from 5 to 50% by weight, relative to the solids content of the photosensitive-thermosensitive layer.

The thickness of the photosensitive-thermosensitive layer is preferably from 0.1 to 10 μm and more preferably from 0.5 to 5 μm, in the aspect of press life.

(Support)

The support used in the lithographic printing plate precursor of the invention is preferably a hydrophilic support. This hydrophilic support (hereinafter, simply referred to as "support") is not particularly limited and may be sufficient with a dimensionally stable plate-shaped article. For example, mention may be made of paper, paper laminated with plastic (e.g., polyethylene, polypropylene, polystyrene, etc.), metal sheet (e.g., aluminum, zinc, copper, etc.), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), paper or plastic film laminated or vapor-deposited thereon with the above-described metal, or the like. Preferred supports include polyester film and aluminum sheet. Of them, preferred is aluminum sheet which is dimensionally stable and relatively inexpensive.

The aluminum sheet is a pure aluminum sheet, an alloy sheet containing aluminum as the main component and also containing trace heteroelements, or an aluminum or aluminum alloy thin film laminated with a plastic. Examples of the heteroelement contained in the aluminum include silicon, iron, manganese, copper, magnesium, chromium, zinc, bismuth, nickel and titanium. The content of the heteroelement in the alloy is preferably 10% by weight or less. According to the invention, a pure aluminum sheet is preferred, but since it is difficult to produce perfectly pure aluminum in view of refining technique, an aluminum sheet containing trace heteroelements may be used. The composition of the aluminum sheet is not particularly specified, and materials conventionally known and commonly employed can be appropriately used.

The thickness of the support is preferably from 0.1 to 0.6 mm, more preferably from 0.15 to 0.4 mm, and even more preferably from 0.2 to 0.3 mm.

In advance of using the aluminum sheet it is preferable to subject the aluminum sheet to a surface treatment such as surface roughening, formation of hydrophilic film or the like. This surface treatment facilitates improvement of hydrophilicity and securing of adhesion between the photosensitive-thermosensitive layer and the support. Prior to the surface-roughening of the aluminum sheet, degreasing treatment for removing the rolling oil on the surface can be performed, if desired, by using a surfactant, an organic solvent, an alkaline aqueous solution or the like.

<Surface-roughening Treatment>

The surface-roughening treatment of the aluminum sheet surface is performed by various methods, and examples thereof include mechanical surface-roughening treatment, electrochemical surface-roughening treatment (surface-roughening treatment of electrochemically dissolving the surface) and chemical surface-roughening treatment (surface-roughening treatment of chemically and selectively dissolving the surface).

As for the mechanical surface-roughening treatment, use can be made of known methods such as ball polishing, brush polishing, blast polishing, buff polishing and the like.

The method for the electrochemical surface-roughening treatment may be exemplified by a method of passing an alternating current or direct current in an electrolytic solution containing an acid such as hydrochloric acid, nitric acid or the like. Also, the method of using a mixed acid as described in the publication of JP-A No. 54-63902 may be used.

<Formation of Hydrophilic Film>

The aluminum sheet subjected to the surface-roughening treatment and, if desired, to other treatments as described above is then subjected to a treatment for providing a hydrophilic film having a low thermal conductivity. The thermal conductivity in the thickness direction of the hydrophilic film is 0.05 W/mK or greater, preferably 0.08 W/mK or greater, and 0.5 W/mK or less, preferably 0.3 W/mK or less, and more preferably 0.2 W/mK or less. When the thermal conductivity in the film thickness direction is from 0.05 to 0.5 W/mK, the heat generated in the photosensitive-thermosensitive layer upon exposure to a laser light can be prevented from diffusing into the support. As a result, in the case of using the lithographic printing plate precursor of the invention as the on-press development type or the non-processing type, since the heat generated upon laser exposure can be effectively used, the sensitivity is enhanced, and image formation and printout image formation can be satisfactorily attained.

The thermal conductivity in the thickness direction of the hydrophilic film as defined in the invention is described below. As for the method of measuring thermal conductivity of thin film, various methods have been heretofore reported. In 1986, ONO et al. reported thermal conductivity in the plane direction of thin film determined by using a thermograph. Also, attempts to apply an alternating current heating method to the measurement of thermal properties of thin film have been reported. The history of the AC heating method can be traced even to the report of 1863. In recent years, various measuring methods induced by development of heating methods using a laser and combination with Fourier transform have been proposed. In practice, devices using the laser angstrom method are commercially available. These methods are all to determine the thermal conductivity in the plane direction (in-plane direction) of thin film.

However, in consideration of the thermal conduction of thin film, the important factor is rather the thermal diffusion in the depth direction.

As reported in various papers, the thermal conductivity of thin film is said to be not isotropic and particularly, in the cases similar to the invention, it is very important to directly measure the thermal conductivity in the film thickness direction. From such a standpoint, a method using a thermal comparator has been reported in the paper by Lambropoulos et al. (J. Appl. Phys., 66 (9) (Nov. 1, 1989)) and the paper by Henager et al. (APPLIED OPTICS, Vol. 32, No. 1 (Jan. 1, 1993)) with an attempt to measure the thermal properties in the thickness direction of thin film. Furthermore, a method of measuring the thermal diffusivity of polymer thin film by means of temperature wave thermal analysis to which Fourier analysis is applied has been recently reported by Hashimoto et al. (Netsu Sokutei, 27 (3) (2000)).

The thermal conductivity in the thickness direction of hydrophilic film as defined in the invention is measured by the above-described method of using a thermal comparator. This method will be specifically described below, but its fundamental principles are described in detail in the paper by Lambropoulos et al. and the paper by Henager et al. According to the invention, the thermal conductivity is measured by the method described in the publication of JP-A No. 2003-103951 using the thermal comparator shown in FIG. 3 of the same patent publication.

The relationship between each temperature and thermal conductivity of film can be expressed by the following Equation (1):

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \quad (1)$$

provided that the symbols in Equation (1) are as follows:

$T_t$: temperature at the front end of tip, $T_b$: heat sink temperature, $T_r$: reservoir temperature, $K_{tf}$: thermal conductivity of film, $K_1$: thermal conductivity of reservoir, $K_2$: thermal conductivity at the tip (in the case of oxygen-free copper, 400 W/mK), $K_4$: thermal conductivity of metallic gas (when film is not provided thereon), $r_1$: radius of curvature at the front end of tip, $A_2$: Contact area between reservoir and tip, $A_3$: contact area between tip and film, t: film thickness, $t_2$: contact thickness (≈0).

By changing the film thickness (t) and measuring and plotting respective temperatures ($T_t$, $T_b$ and $T_r$), the gradient of Equation (1) is determined, whereby the thermal conductivity of film ($K_{tf}$) can be determined. That is, as apparent from Equation (1), this gradient is a value determined by the thermal conductivity of reservoir ($K_1$), the radius of curvature at the front end of tip ($r_1$), the thermal conductivity of film ($K_{tf}$) and the contact area between tip and film ($A_3$), and since $K_1$, $r_1$ and $A_3$ are known values, the value of $K_{tf}$ can be determined from the gradient.

The inventors determined the thermal conductivity of a hydrophilic film (anodic oxide film $Al_2O_3$) provided on an aluminum substrate by using the above-described measuring method The temperatures were measured by changing the film thickness, and the thermal conductivity of $Al_2O_3$ determined from the gradient of the resulting graph was 0.69 W/mK. This reveals good agreement with the results in the paper by Lambropoulos et al. This result also reveals that the thermal property values of thin film differ from the thermal property values of bulk (the thermal conductivity of bulk $Al_2O_3$ is 28 W/mK).

When the above-described method is used for the measurement of the thermal conductivity in the thickness direction of the hydrophilic film on the lithographic printing plate precursor of the invention, by using a tip with fine front end and keeping the pressing load constant, results with no deviations can be obtained even on the surface roughened for use as a lithographic printing plate, and thus this method is desirable. The thermal conductivity value is preferably determined as an average value by measuring the thermal conductivity at different multiple points on a sample, for example, at 5 points.

The thickness of the hydrophilic film is preferably 0.1 μm or more, more preferably 0.3 μm or more, and particularly preferably 0.6 μm or more in view of scratch resistance and press life. Also, from the standpoint of production costs, since a large amount of energy is required in providing a thick film, the film thickness is preferably 5 μm or less, more preferably 3 μm or less, and particularly preferably 2 μm or less.

From the perspectives of effect on beat insulation, film strength and contamination during printing, the hydrophilic film preferably has a density of 1,000 to 3,200 $kg/m^3$.

As for the method of measuring the density, for example, from the weight measured by Mason's method (method of measuring anodic oxide film weight by dissolution in a chromic acid/phosphoric acid mixed solution) and the film thickness determined by observing the cross section through SEM, the density can be calculated according to the following equation:

Density($kg/m^3$)=(weight of hydrophilic film per unit area/film thickness)

The method of providing the hydrophilic film is not particularly limited and, for example, anodization, vapor deposition, CVD, sol-gel method, sputtering, ion plating, diffusion method or the like can be appropriately used. Also, a method of coating a solution obtained by mixing hollow particles in the hydrophilic resin or sol-gel solution can be used.

Among these, a treatment of producing an oxide by anodization, that is, an anodization treatment, is most preferred. The anodization treatment can be performed by a method conventionally employed in this field. Specifically, when DC or AC is passed to an aluminum sheet in an aqueous or non-aqueous solution comprising sulfuric acid, phosphoric acid, chromic acid, oxalic acid, sulfuric acid, benzenesulfonic acid or the like individually or in combination of two or more species, an anodic oxide film which is a hydrophilic film can be formed on the surface of the aluminum sheet. The conditions for the anodization treatment vary according to the electrolytic solution used and cannot be definitely determined, but in general, suitable conditions are such that the electrolytic solution concentration is from 1 to 80% by weight, the liquid temperature is from 5 to 70° C., the current density is from 0.5 to 60 $A/dm^2$, the voltage is from 1 to 200 V and the electrolysis time is from 1 to 1,000 seconds. Among such anodization treatments, preferred are the method of performing the anodization treatment in a sulfuric acid electrolytic solution at a high current density as described in the specification of GBP No. 1,412,768 and the method of performing the anodization treatment by using phosphoric acid in the electrolytic bath as described in the specification of U.S. Pat. No. 3,511,661. Also, a multistage anodization treatment of performing the anodization treatment in sulfuric acid and again in phosphoric acid may be employed.

According to the invention, in the aspects of scratch resistance and press life, the anodic oxide film is preferably 0.1 $g/m^2$ or more, more preferably $0.3/m^2$ or more, particularly preferably 2 $g/m^2$ or more, and still more preferably 3.2 $g/m^2$ or more. Further, since a large amount of energy is required in providing a thick film, it is preferably 100 $g/m^2$ or less, more preferably 40 $g/m^2$ or less, and particularly preferably 20 $g/m^2$ or less.

The anodic oxide film has minute concaves called micropores that are formed and uniformly distributed on the surface. The density of micropores present in the anodic oxide film can be adjusted by appropriately selecting the treatment conditions. By increasing the density of micropores, the thermal conductivity in the thickness direction of the anodic oxide film can be made to 0.05 to 0.5 W/mK. The micropore size can be also adjusted by appropriately selecting the treatment conditions. By enlarging the micropore size, the thermal conductivity in the thickness direction of the anodic oxide film can be made to 0.05 to 0.5 W/mK. The micropore size can also be adjusted by appropriately selecting the treatment conditions. By enlarging the micropore size, the thermal conductivity in the thickness direction of the anodic oxide film can be made to 0.05 to 0.5 W/mK.

According to the invention, it is preferable to carry out a pore widening treatment of enlarging the pore size of micropores for the purpose of decreasing the thermal conductivity. In this pore widening treatment, the aluminum substrate having an anodic oxide film formed thereon is immersed in an aqueous acid solution or an aqueous alkali solution to dissolve the anodic oxide film and to enlarge the pore size of the micropores. The pore widening treatment is performed such that the amount of the anodic oxide film dissolved is in the range of from 0.01 to 20 $g/m^2$, more preferably from 0.1 to 5 $g/m^2$, and particularly preferably from 0.2 to 4 $g/m^2$.

In the case of using an aqueous acid solution for the pore widening treatment, an aqueous solution of an inorganic acid such as sulfuric acid, phosphoric acid, nitric acid or hydrochloric acid, or a mixture thereof is preferably used. The concentration of the aqueous acid solution is preferably from 10 to 1,000 g/L, and more preferably from 20 to 500 g/L. The temperature of the aqueous acid solution is preferably from 10 to 90° C., and more preferably from 30 to 70° C. The time for immersion in the aqueous acid solution is preferably from 1 to 300 seconds, and more preferably from 2 to 100 seconds. On the other hand, in the case of using an aqueous alkali solution for the pore widening treatment, an aqueous solution of at least one alkali selected from the group consisting of sodium hydroxide, potassium hydroxide and lithium hydroxide is preferably used. The pH of the aqueous alkali solution is preferably from 10 to 13, and more preferably from 11.5 to 13.0. The temperature of the aqueous alkali solution is preferably from 10 to 90° C., and more preferably from 30 to 50° C. The time for immersion in the aqueous alkali solution is preferably from 1 to 500 seconds, and more preferably from 2 to 100 seconds. However, if the mircopore size at the outermost surface is excessively enlarged, the anti-contamination performance upon printing becomes poor, and thus the micropore size at the outermost surface is made to preferably 40 nm or less, more preferably 20 nm or less, and most preferably 10 nm or less. Therefore, both the heat insulating property and anti-contamination performance are assured. In a more preferred form of the anodic oxide film, the micropore size at the surface is from 0 to 40 nm, and the micropore size at the inner part is from 20 to 300 nm. For example, it is known that with the same kind of electrolytic solution, the pore size of the pores produced by electrolysis is proportional to the electrolytic voltage during electrolysis. By utilizing this property, a method of gradually increasing the electrolytic voltage and thereby producing enlarged pores at the lower part can be used. It is also known that when the kind of the electrolytic solution is changed, the pore size changes, and the pore size becomes larger in the order of sulfuric acid, oxalic acid and phosphoric acid. Accordingly, a method of performing anodization using sulfuric acid for the electrolytic solution in the first stage and using phosphoric acid in the second stage can be used. Also, the support obtainable through the anodization treatment and/or the pore widening treatment may be subjected to a pore-sealing treatment that will be described later.

Apart from the above-described anodic oxide film, the hydrophilic film may be also an inorganic film provided by sputtering, CVD or the like. Examples of the compound constituting the inorganic film include an oxide, a nitride, a silicide, a boride and a carbide. The inorganic film may comprise only a single compound or may comprise a mixture of compounds. Specific examples of the compound constituting the inorganic film include aluminum oxide, silicon oxide, titanium oxide, zirconium oxide, hafnium oxide, vanadium oxide, niobium oxide, tantalum oxide, molybdenum oxide, tungsten oxide, chromium oxide; aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride, boron nitride; titanium silicide, zirconium silicide, hafnium silicide, vanadium silicide, niobium silicide, tantalum silicide, molybdenum silicide, tungsten silicide, chromium silicide; titanium boride, zirconium boride, hafnium boride, vanadium boride, niobium boride, tantalum boride, molybdenum boride, tungsten boride, chromium boride; aluminum carbide, silicon carbide, titanium carbide, zirconium carbide, hafnium carbide, vanadium carbide, niobium carbide, tantalum carbide, molybdenum carbide, tungsten carbide, and chromium carbide.

<Pore-sealing Treatment>

According to the invention, the hydrophilic support that could be obtained by providing a hydrophilic film as described above may be subjected to a pore-sealing treatment. Examples of the pore-sealing treatment for use in the invention include the pore-sealing treatment of an anodic oxide film by means of pressurized steam or hot water as described in the publications of JP-A Nos. 4-176690 and 11-301135. Also, this treatment may be performed by using a known method such as silicate treatment, aqueous bichromate solution treatment, nitrite treatment, ammonium acetate treatment, electrodeposition pore-sealing treatment, triethanolamine treatment, barium carbonate treatment, treatment with hot water containing a trace amount of phosphate, or the like. The pore-sealed film is such that, for example, when electrodeposition pore-sealing treatment is applied, the film is formed from the bottom of a pore, and when steam pore-sealing treatment is applied, the film is formed from the top of a pore. Thus, depending on the method of the pore-sealing treatment, the pore-sealed film is formed in different fashion. In addition to this, the method of the treatment may also be exemplified by immersion in a solution, spraying, coating, vapor deposition, sputtering, ion plating thermal spraying, plating or the like, without being particularly limited. Inter alia, the pore-sealing treatment using particles having an average particle size of 8 to 800 nm as described in the publication of JP-A No. 2002-214764 is particularly preferred.

The pore-sealing treatment using particles is performed by using particles having an average particle size of from 8 to 800 nm, preferably from 10 to 500 nm, and more preferably from 10 to 150 nm. Within these ranges, the risk for the particles going inside the micropores present in the hydrophilic film is small, and sufficiently high effect of increasing the sensitivity can be obtained Further, sufficient adhesion to the photosensitive-thermosensitive layer and excellent press life are ensured. The thickness of the particle layer is preferably from 8 to 800 nm, and more preferably from 10 to 500 nm.

The particle used in the invention preferably has a thermal conductivity of 60 W/mK or less, more preferably 40 W/mK or less, and particularly preferably from 0.3 to 10 W/mK. When the thermal conductivity is 60 W/mK or less, the diffusion of heat into the aluminum substrate can be satisfactorily prevented, and a sufficiently high effect of increasing the sensitivity is obtained.

The method for providing the particle layer may be exemplified by, but are not limited to, immersion in a solution, spraying, coating, electrolysis, vapor deposition, sputtering, ion plating, thermal spraying, plating treatments or the like.

The electrolysis can be performed using an alternating current or direct current. The waveform of the alternating current used in the electrolysis may be sine wave, rectangular wave, triangular wave, trapezoidal wave or the like. The frequency of the alternating current is preferably from 30 to 200 Hz, and more preferably from 40 to 120 Hz, from the viewpoint of the cost for producing a power supply device. In the case of using a trapezoidal wave as the waveform of alternating current, the time tp for the current to reach the peak from 0 is preferably 0.1 to 2 msec, and more preferably from 0.3 to 1.5 msec, respectively. If this tp is less than 0.1 msec, the impedance of the power supply circuit may be affected, thereby to require a large power supply voltage at the initial rise of the current waveform, and in turn, the cost for installation of the power supply will be high.

As for the hydrophilic particle, $Al_2O_3$, $TiO_2$, $SiO_2$ and $ZrO_2$ are preferably used individually or in combination of two or more species. The electrolytic solution is obtained, for example, by suspending the hydrophilic particles in water or the like such that the content of the hydrophilic particle is from 0.01 to 20% by weight relative to the entirety. The electrolytic solution may be subjected to adjustment of pH, for example, by adding sulfuric acid in order to have plus or minus electric charge. The electrolysis is preformed, for example, by passing direct current, assigning an aluminum sheet to the cathode, and using the above-described electrolytic solution under the conditions such that the voltage is from 10 to 200 V and the treatment time is from 1 to 600 seconds. According to this method, the opening of the micropores present in the anodic oxide film can be easily sealed while leaving a void in the inside.

Furthermore, the pore-scaling treatment may be carried out by methods of providing by coating, for example, a layer including a compound having at least one amino group and at least one group selected from the group consisting of a carboxyl group or a salt thereof and a sulfo group or a salt thereof as described in the publication of JP-A No. 60-149491; a layer including a compound selected from compounds having at least one amino group and at least one hydroxyl group, and salts thereof as described in the publication of JP-A No. 60-232998; a layer containing a phosphate as described in the publication of JP-A No. 62-19494; or a layer including a polymeric compound containing at least one monomer unit having a sulfo group, as a repeating unit in the molecule as described in the publication of JP-A No. 59-101651.

In addition, the treatment may be also carried out by a method of providing a layer comprising a compound selected from carboxymethyl cellulose; dextrin; gum arabic; phosphonic acids having an amino group such as 2-aminoethylphosphonic acid; organic phosphonic acids such as phenylphosphonic acid, naphthylphosphoric acid, alkylphosphoric acid, glycerophosphoric acid, methylenediphosphoric acid or ethylenediphosphoric acid, each of which may be optionally substituted; organic phosphoric acid esters such as phenylphosphoric acid, naphthylphosphoric acid, alkylphosphoric acid or glycerophosphoric acid, each of which may be optionally substituted; organic phosphinic acids such as phenylphosphinic acid, naphthylphosphinic acid, alkylphosphinic acid or glycerophosphinic acid, each of which may be optionally substituted; amino acids such as glycine or β-alanine; hydrochloride salts of amines having a hydroxyl group, such as hydrochloride of triethanolamine; and the like.

The pore-sealing treatment may also be carried out by applying a silane coupling agent having an unsaturated group. Examples of the silane coupling agent include N-3-acryloxy-2-hydroxypropyl)-3-aminopropyltriethoxysilane, (3-acryloxypropyl)dimethylmethoxysilane, (3-acryloxypropyl)methyldimethoxysilane, (3-acryloxypropyl)trimethoxysilane, 3-(N-allylamino)propyltrimethoxysilane, allyldimethoxysilane, allyltriethoxysilane, allyltrimethoxysilane, 3-butenyltriethoxysilane, 2-(chloromethyl)allyltrimethoxysilane, methacrylamidopropyltriethoxysilane, N-(3-methacryloxy-2-hydroxypropyl)-3-aminopropyltriethoxysilane, (methacryloxymethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris (methoxyethoxy)silane, methoxydimethylvinylsilane, 1-methoxy-3-(trimethylsiloxy)butadiene, styrylethyltrimethoxysilane, 3-(N-styrylmethyl-2-aminoethylamino)-propyltrimethoxysilane hydrochloride, vinyldimethylethoxysilane, vinyldiphenylethoxysilane, vinylmethyldiethoxysilane, vinylmethyldimethoxysilane, o-(vinyloxyethyl)-N-(triethoxysilylpropyl)urethane, vinyltriethoxysilane, vinyltrimethoxysilane, vinyltri-t-butoxysilane, vinyltriisopropoxysilane, vinyltriphenoxysilane, vinyltris(2-methoxyethoxy)silane and diallylaminopropylmethoxysilane. Among these, preferred are silane coupling agents having a methacryloyl group or an acryloyl group, which have rapidly reacting unsaturated group.

In addition to these, mention may be made of the sol-gel coating treatment as described in the publication of JP-A No. 5-50779, the treatment of coating phosphonic acids as described in the publication of JP-A No. 5-246171, the treatment of coating a material for backcoating as described in the publications of JP-A Nos. 6-234284, 6-191173 and 6-230563, the treatment with phosphonic acids as described in the publication of JP-A No. 6-262872, the coating treatment as described in the publication of JP-A No. 6-297875, the anodization treatment as described in the publication of JP-A No. 10-109480, the immersion treatment as described in the publications of JP-A Nos. 2000-81704 and 2000-89466, or the like, and any of these methods may be used.

After forming a hydrophilic film, the aluminum sheet surface is subjected to hydrophilization treatment, if necessary.

The hydrophilization treatment includes the alkali metal silicate method as described in the specifications of U.S. Pat. Nos. 2,714,066, 3,181,461, 3,280,734 and 3,902,734. In this method, the support is subjected to immersion in an aqueous solution of sodium silicate or the like, or to electrolysis. Other examples include the method of performing the treatment with potassium fluorozirconate as described in the publication of JP-B No. 36-22063, the method of treating with polyvinylphosphonic acid as described in the specifications of U.S. Pat. Nos. 3,276,868, 4,153,461 and 4,689,272, or the like.

The support preferably has a centerline average roughness of from 0.10 to 1.2 μm. Within this range, good adhesion to the photosensitive-thermosensitive layer, good press life and good anti-contamination property can be obtained.

The color density of the support is preferably from 0.15 to 0.65 in terms of the reflection density value. Within this range, good image-forming property resulting from antihalation upon exposure of image and good plate inspectability after development can be obtained.

(Backcoat Layer)

After the support is subjected to surface treatment or formation of an undercoat layer, a backcoat may be provided on the backside of the support, if desired.

As for the backcoat, mention may be favorably made of, for example, a coating layer comprising a metal oxide which can be obtained by hydrolysis and polycondensation of the organic polymer compound as described in the publication of JP-A No. 5-45885, or the organic or inorganic metal compound as described in the publication of JP-A No. 6-35174. Among these, those using an alkoxy compound of silicon such as $Si(OCH_3)_4$, $Si(OC_2H_5)_4$, $Si(OC_3H_7)_4$ and $Si(OC_4H_9)_4$, are preferred because the raw material is inexpensive and easily available.

(Undercoat Layer)

In the lithographic printing plate precursor of the invention, if desired, an undercoat layer can be provided between the photosensitive-thermosensitive layer and the support. As the undercoat layer functions as a beat-insulating layer, the heat generated upon exposure to an infrared laser is prevented from diffusing into the support and can be efficiently utilized, and thus the sensitivity can be advantageously increased. Furthermore, in the unexposed area, the undercoat layer makes delamination of the photosensitive-thermosensitive layer from the support easy, and thus the on-press developability is enhanced.

Specific examples of the undercoat layer include the silane coupling agent having an addition-polymerizable ethylenic double bond reactive group as described in the publication of JP-A No. 10-282679, the phosphorus compound having an ethylenic double bond reactive group as described in the publication of JP-A No. 2-304441, and the like.

The amount of coating (solid content) of the undercoat layer is preferably from 0.1 to 100 $mg/m^2$, and more preferably from 1 to 30 $mg/m^2$.

(Protective Layer (Overcoat Layer))

In the lithographic printing plate precursor of the invention, a protective layer may be provided on the photosensitive-thermosensitive layer, if necessary, for the purpose of preventing generation of scratches or the like on the photosensitive-thermosensitive layer, blocking oxygen or preventing ablation upon exposure with a high-intensity laser.

According to the invention, the exposure is usually performed in the air, and the protective layer prevents low-molecular-weight compounds such as oxygen and basic substances present in the air, which inhibit the image-forming reaction occurring in the photosensitive-thermosensitive layer upon exposure, from being incorporated into the photosensitive-thermosensitive layer and thereby prevents the inhibition of the image-forming reaction upon exposure in the air. Accordingly, the properly required from the protective layer is low permeability to low-molecular-weight compounds such as oxygen. Further, preferred protective layer is highly transmissive to the light used for exposure, is excellent in adhesion to the photosensitive-thermosensitive layer, and is easily removable during on-press development after exposure. Various studies have been heretofore made on the protective layer having these properties, and such protective layers are described in detail, for example, in the specification of U.S. Pat. No. 3,458,311 and the publication of JP-A No. 55-49729.

As for the material used for the protective layer, for example, water-soluble polymer compounds having relatively excellent crystallinity may be mentioned. Specific examples thereof include water-soluble polymers such as polyvinyl alcohol, polyvinylpyrrolidone, acidic celluloses, gelatin, gum arabic, polyacrylic acid and the like. Among these, when polyvinyl alcohol (PVA) is used as the main component, the best results are obtained with respect to fundamental properties such as the oxygen-blocking property, development removability and the like. As long as the polyvinyl alcohol contains an unsubstituted vinyl alcohol unit which imparts the oxygen-blocking property and water solubility necessary for the protective layer, the polymer may be partially substituted by an ester an ether or an acetal or may have another copolymerization component in some proportion.

Specific examples of polyvinyl alcohol which can be suitably used include those having a degree of hydrolysis of 71 to 100 mol % and a degree of polymerization of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all manufactured by Kuraray Co., Ltd.

The components (selection of PVA, use of additives, etc.), amount of coating and the like of tie protective layer are appropriately selected by taking account of, in addition to the oxygen-blocking property and development removability, clouding, adhesion, scratch resistance and the like. In general, as PVA has a higher degree of hydrolysis (that is, as the content of the unsubstituted vinyl alcohol unit in the protective layer is higher), or as the layer thickness is greater, the oxygen-blocking property is enhanced, and this is preferred in view of sensitivity. Also, in order to prevent the generation of unnecessary polymerization reaction during preparation or storage, unnecessary clouding upon exposure of image, thickening of the image line or the like, it is preferred that the oxygen-blocking property is not excessively high. Accordingly, the oxygen permeability A at 25° C. and 1 atmosphere is preferably $0.2 \leqq A \leqq 20$ ($cm^3/m^2 \cdot day$).

As other components of the protective layer, glycerin, dipropylene glycol and the like may be added in an amount corresponding to several percent by weight relative to the water-soluble polymer compound so as to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in an amount of several percent by weight relative to the (co)polymer.

The thickness of the protective layer is suitably from 0.1 to 5 μm, and preferably from 0.2 to 2 μm.

The adhesion to the image area, scratch resistance and the like are also very important in view of handling of the lithographic printing plate precursor. That is, when a protective layer that is hydrophilic is laminated on the photosensitive-thermosensitive layer in order to incorporate a water-soluble polymeric compound in the case where the photosensitive-thermosensitive layer is oleophilic, the protective layer is susceptible to delamination due to insufficient adhesive strength, and at the delaminated parts, defects such as failure of film curing ascribable to polymerization inhibition by oxygen may occur.

In this regard, various proposals have been made in an attempt to improve the adhesiveness between the photosensitive-thermosensitive layer and the protective layer. For example, JP-A No. 49-70702 describes that sufficient adhesiveness can be obtained by mixing an acrylic emulsion, a water-insoluble vinylpyrrolidone-vinyl acetate copolymer or the like in a hydrophilic polymer mainly comprising polyvinyl alcohol at a ratio of from 20 to 60% by weight, and laminating the obtained solution on the photosensitive-thermosensitive layer. All of these known techniques can be used in the invention. The method for coating the protective layer is described in detail, for example, in the specification of U.S. Pat. No. 3,458,311 and the publication of JP-B No. 55-49729.

According to the invention, the protective layer may contain the aforementioned printout image-forming components (compound undergoing color change under the action of a radical, radical polymerization initiator and infrared absorbent). An embodiment in which these printout image-forming components are contained in the protective layer instead of the photosensitive-thermosensitive layer, is preferable since the printout image-forming reaction is separated from the polymerization reaction system in the photosensitive-thermosensitive layer, thus possibly avoiding inhibition of the reaction of each other. In another preferred embodiment, these printout image-forming components are encapsulated in microcapsules and contained in the protective layer. In the case of strengthening the printout image, the printout image-forming components may be contained in both the protective layer and the photosensitive-thermosensitive layer.

Furthermore, the protective layer may have other functions imparted, too. For example, with addition of a coloring agent (for example, water-soluble dye) which is highly transmissive to infrared ray used in exposure and is capable of efficiently absorbing light at other wavelengths, the aptitude for safelight can be enhanced without lowering the sensitivity.

EXAMPLES

Hereinafter, the invention will be described in detail by way of Examples, which are not intended to limit the invention in any means.

Example 1

(Preparation of Hydrophilic Support)

A 0.3 mm-thick aluminum sheet according to JIS-A-1050 was treated by carrying out the following steps (a) to (k) in this order.

(a) Mechanical Surface-roughening Treatment

A mechanical surface-roughening treatment was carried out using rotating roller type nylon brushes, while supplying to the surface of the aluminum sheet a suspension containing an abrasive (silica) and water with a specific gravity of 1.12 as an abrasive slurry liquid. The average particle size of the abrasive was 8 μm, and the maximum particle size was 50 μm. The material for the nylon brush was 6-10 nylon, and the nylon brush had a bristle length of 50 mm and a bristle diameter of 0.3 mm. The nylon brush was made by boring holes in a Φ300 mm stainless steel cylinder and densely implanting bristles therein. Three of such rotary brushes were used. The distance between two supporting rollers (Φ200 mm) at the lower part of the brush was 300 mm. The brush rollers were pressed until a load of a driving motor for rotating the brush reached plus 7 kW with respect to the load before the brush rollers were pressed to the aluminum plate. The rotating direction of the brushes was the same as the moving direction of the aluminum sheet. The rotating speed of the brushes was 200 rpm.

(b) Alkali Etching Treatment

Thus obtained aluminum sheet was subjected to an etching treatment by spraying an aqueous solution of NaOH (concentration: 26% by weight, aluminum ion concentration: 6.5% by weight) at a temperature of 70° C., thereby dissolving 6 $g/m^2$ of the aluminum sheet. Then, washing was carried out by spraying well water.

(c) Desmutting Treatment

The aluminum sheet was subjected to a desmutting treatment by spraying with a 1% by weight aqueous solution of nitric acid (containing 0.5% by weight of aluminum ions) at a temperature of 30° C., and then washed by spraying water. As for the aqueous solution of nitric acid used in the desmutting treatment, a waste liquid from the step of performing electrochemical surface-roughening using alternating current in an aqueous solution of nitric acid.

(d) Electrochemical Surface-roughening Treatment

An electrochemical surface-roughening treatment was carried out continuously using an alternating current voltage of 60 Hz. Electrolyte in this case was an aqueous solution containing 10.5 g of nitric acid per liter (containing 5 g of aluminum ions per liter) at a temperature of 50° C. The waveform of the alternating current supply was such that the time TP taken for a current value to reach the peak from zero was 0.8 msec, and the duty ratio was 1:1, and by using a current of a trapezoidal waveform, an electrochemical surface-roughening treatment was carried out, with a carbon electrode assigned to the counter electrode. A ferrite was used as an auxiliary anode. The electrolytic bath used was of the radial cell type. The current density was 30 $A/dm^2$ as the current peak value, and the quantity of electricity was 220 $C/dm^2$ in tents of the total quantity of electricity in the case of having an aluminum sheet as the anode. An amount equivalent to 5% of the current flowing from the power supply was shunted to the auxiliary anode. Subsequently, washing was carried out by spraying well water.

(e) Alkali Etching Treatment

The aluminum sheet was subjected to an etching treatment by spraying an aqueous solution containing 26% by weight of sodium hydroxide and 6.5% by weight of aluminum ions at 32° C., thus dissolving 0.20 g/m$^2$ of the aluminum sheet. A smut component mainly comprising aluminum hydroxide produced in the previous site of the electrochemical surface-roughening performed by using alternating current was removed, and the edge portions of formed pits were dissolved to be made smooth. Subsequently, washing was carried out by spraying well water. The etched amount was 3.5 g/m$^2$.

(f) Desmutting Treatment

The aluminum sheet was subjected to a desmutting treatment by spraying with a 15% by weight aqueous solution of nitric acid (containing 4.5% by weight of aluminum ions) at a temperature of 30° C., and then washed by spraying well water. As for the aqueous solution of nitric acid used in the desmutting treatment, a waste liquid from the step of performing electrochemical surface-roughening using alternating current in an aqueous solution of nitric acid.

(g) Electrochemical Surface-roughening Treatment

An electrochemical surface-roughening treatment was carried out continuously using an alternating current voltage of 60 Hz. Electrolyte in this case was an aqueous solution containing 7.5 g of hydrochloric acid per liter (containing 5 g of aluminum ions per liter) at a temperature of 35° C. The waveform of the alternating current supply was a rectangular wave, and an electrochemical surface-roughening treatment was carried out with a carbon electrode assigned to the counter electrode. A ferrite was used as an auxiliary anode. The electrolytic bath used was of the radial cell type. The current density was 25 A/dm$^2$ as the current peak value, and the quantity of electricity was 50 C/dm$^2$ in terms of the total quantity of electricity in the case of having an aluminum sheet as the anode. Subsequently, washing was carried out by spraying well water.

(h) Alkali Etching Treatment

The aluminum sheet was subjected to an etching treatment by spraying an aqueous solution containing 26% by weight of sodium hydroxide and 6.5% by weight of aluminum ions at 32° C., thus dissolving 0.10 g/m$^2$ of the aluminum sheet. A smut component mainly comprising aluminum hydroxide produced in the previous stage of the electrochemical surface-roughening performed by using alternating current was removed, and the edge portions of formed pits were dissolved to be made smooth. Subsequently, washing was carried out by spraying well water.

(i) Desmutting Treatment

The aluminum sheet was subjected to a desmutting treatment by spraying with a 25% by weight aqueous solution of sulfuric acid (containing 0.5% by weight of aluminum ions) at a temperature of 60° C., and then washed by spraying well water.

(j) Anodization Treatment

The electrolytic solution used was sulfuric acid. The electrolytic solution was all at a concentration of 170 g per liter (containing 0.5% by weight of aluminum ions) and at a temperature of 43° C. Subsequently, washing was carried out by splaying well water. The current density was in all cases about 30 A/dm$^2$, and the final amount of the oxide film was 2.7 g/m$^2$.

(k) Alkali Metal Silicate Treatment

Thus obtained aluminum sheet was subjected to an alkali metal silicate treatment (silicate treatment) by immersing the aluminum sheet in a treating layer containing 1% by weight aqueous solution of No. 3 sodium silicate at a temperature of 30° C. for 10 seconds. Subsequently, washing was carried out by spraying well water, and thus an aluminum support was prepared. The amount of adhesion of silicate was in all cases 3.6 mg/m$^2$.

(Preparation of Lithographic Printing Plate Precursor)

A lithographic printing plate precursor was prepared by applying on thus obtained hydrophilic support a coating solution for photosensitive-thermosensitive layer (1) of the following composition with a wire bar and drying at 80° C. for 60 seconds to form a photosensitive-thermosensitive layer. The amount of coating was 1.0 g/m$^2$.

| <Composition of coating solution for photosensitive-thermosensitive layer (I)> (pbw = parts by weight) | |
|---|---|
| Infrared absorbent (D-1) shown below | 2 pbw |
| Radical polymerization initiator (I-1) shown below | 10 pbw |
| Dipentaerythritol hexaacrylate (NK Ester A-DPH, Shin-Nakamura Chemical Corp.) | 55 pbw |
| Binder polymer (B-1) shown below | 37 pbw |
| Pentamethoxy Red as acid discoloring agent (Tokyo Chemical Industry Co., Ltd.) | 10 pbw |
| Acid generator (A-1) shown below | 2 pbw |
| Acid amplifier (P-1) shown below | 9 pbw |
| Fluorosurfactant (W-1) shown below | 6 pbw |
| Methyl ethyl ketone | 900 pbw |

(A-1

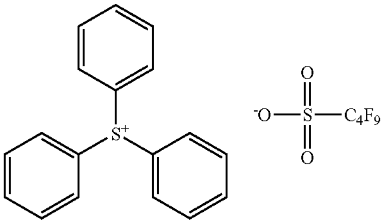

(P-1)

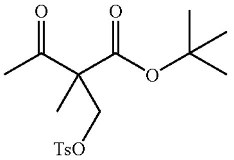

(Ts: p-toluenesulfonyl group)

Infrared Absorbent (D-1)

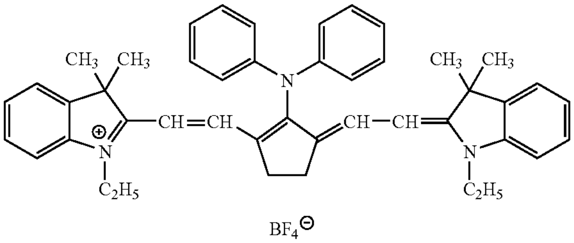

Initiator (I-1) Solubility in water: 40 or greater

-continued

<Composition of coating solution for photosensitive-thermosensitive layer (I)>
(pbw = parts by weight)

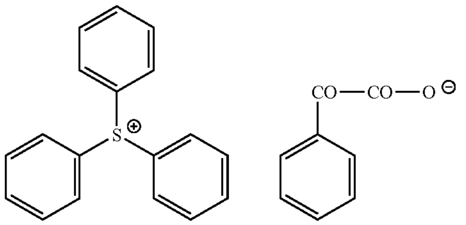

Binder Polymer (B-1)

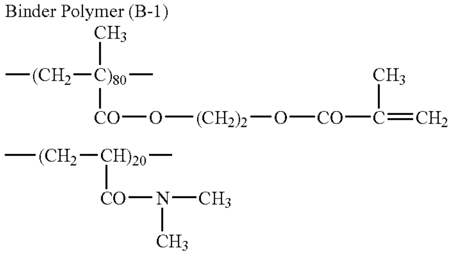

Weight average molecular weight: 65,000

Fluorosurfactant (W-1)

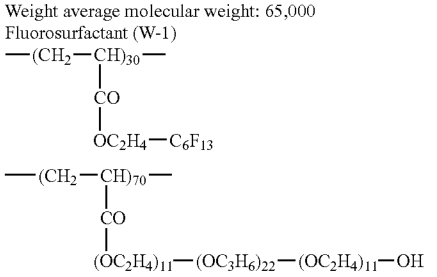

(Formation of Colored Image by Exposure and Heating of the Entire Plate, and Evaluation of Lithographic Printing Plate Precursor)

Thus obtained lithographic printing plate precursor was imagewise exposed to a testing pattern using a plate setter (Trendsetter 3244VX, manufactured by Creo) with beam intensity of 10.2 W and at a drum rotation speed of 150 rpm.

Then, this plate was heated for the entirety at 100° C. for 30 seconds, and the color difference ΔE of the image area and non-image area formed by exposure was measured. Without a development treatment, this plate was loaded on the cylinder of a printing press (SPRINT S26, manufactured by Komori Corporation), and printing was performed by supplying a 4% dilution of a stock fountain solution (IF-102, Fuji Photo Film Co., Ltd.) as the fountain solution, then supplying a black ink (Values-G (black), manufactured by Dainippon Ink & Chemicals Industry Co., Ltd.) and further supplying paper. The number of paper sheets required in obtaining good printouts (on-press developability) and the number of paper sheets that can be printed without contamination in the image (press life) were evaluated. The results are presented in Table 1.

Example 2

(Preparation of Microcapsule Dispersion (1))

In 16.5 parts by weight of ethyl acetate, 10 parts by weight of an adduct of trimethylolpropane and xylene diisocyanate at 1:3 (molar ratio) (Takenate D-110 N, manufactured by Mitsui-Takeda Chemical Co., Ltd., containing 25% by weight of ethyl acetate), 3 parts by weight of Crystal Violet Lactone as an acid discoloring agent 0.6 part by weight of the infrared absorbent (D-3) shown below, 1 part by weight of the acid generator (A-2) shown below, 2 parts by weight of the acid amplifier (P-1) described above, 1.5 parts by weight of tricresyl phosphate and 0.1 part by weight of an anionic surfactant (Pionin P-A41C, manufactured by Takemoto Oil & Fats Co., Ltd.) were dissolved to yield the oil phase.

Apart from this, 375 parts by weight of a 4% by weight aqueous solution of polyvinyl alcohol (PVA205, manufactured by Kuraray Co., Ltd.) was prepared as the aqueous phase.

The oil phase and the aqueous phase were mixed and emulsified using a homogenizer at 12,000 rpm for 10 minutes under water-cooling. To this emulsion, 24.5 parts by weight of water was added, and the mixture was stirred for 30 minutes at room temperature and for another 3 hours at 40° C. Subsequently, a microcapsule dispersion (1) was prepared by adding pure water so that the solids concentration of the dispersion was 15% by weight. The average particle size of the microcapsule was 0.30 μm.

(A-2)

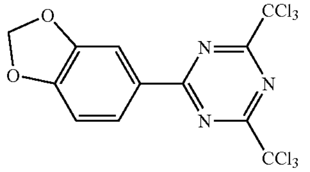

Infrared Absorbent (D-3)

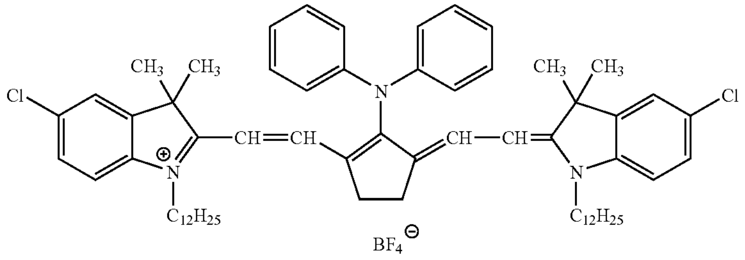

(Preparation and Evaluation of Lithographic Printing Plate Precursor)

A photosensitive-thermosensitive layer was formed by applying on the support prepared in Example 1 a coating solution for photosensitive-thermosensitive layer (3) of the following composition with a wire bar and drying at 80° C. for 60 seconds. The amount of coating was 1.0 g/$m^2$.

| <Composition of coating solution for photosensitive-thermosensitive layer (3)> (pbw = parts by weight) | |
|---|---|
| Infrared absorbent (D-1) | 2 pbw |
| Radical initiator (I-1) | 10 pbw |
| Dipentaerythritol hexaacrylate (NK Ester A-DPH, Shin-Nakamura Chemical Corp.) | 55 pbw |
| Binder polymer (B-1) | 37 pbw |
| Fluorosurfactant (W-1) | 1 pbw |
| Methyl ethyl ketone | 900 pbw |

Next, a coating solution for overcoat layer (2) of the following composition was applied on the photosensitive-thermosensitive layer with a wire bar such that the amount of coating after drying was 1.5 g/$m^2$ and dried at 100° C. for 90 seconds, and thus a lithographic printing plate precursor was prepared. The prepared lithographic printing plate precursor was subjected to the formation of colored image by exposure and heating of the entire plate as in Example 1, and was evaluated. The results are presented in Table 1.

| <Composition of water-soluble coating solution for overcoat layer (2)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Microcapsule dispersion (1) | 1000 pbw |
| Pure water | 2150 pbw |

Example 3

(Preparation and Evaluation of Lithographic Printing Plate Precursor)

A photosensitive-thermosensitive layer was formed by applying on the support prepared in Example 1 a coating solution for photosensitive-thermosensitive layer (4) of the following composition with a wire bar and drying at 80° C. for 60 seconds. The amount of coating was 1.0 g/$m^2$. The prepared lithographic printing plate precursor was subjected to the formation of colored image by exposure and heating of the entire plate as in Example 1, and was evaluated. The results are presented in Table 1.

| <Composition of coating solution for photosensitive-thermosensitive layer (4)> (pbw = parts by weight) | |
|---|---|
| Infrared absorbent (D-1) | 2 pbw |
| Radical initiator (I-1) | 10 pbw |
| Dipentaerythritol hexaacrylate (NK Ester A-DPH, Shin-Nakamura Chemical Corp.) | 40 pbw |
| Binder polymer (B-1) | 16 pbw |

-continued

| <Composition of coating solution for photosensitive-thermosensitive layer (4)> (pbw = parts by weight) | |
|---|---|
| Microcapsule dispersion (1) | 300 pbw |
| Fluorosurfactant (W-1) | 1 pbw |
| Methyl ethyl ketone | 100 pbw |
| 1-Methoxy-2-propanol | 850 pbw |
| Pure water | 200 pbw |

Example 4

(Preparation of Resin Fine Particle Dispersion (1)>

Six parts by weight of an acid amplifier polymer (P-3) of the following structure, 1.5 parts by weight of an infrared absorbent (I-33), 1 part by weight of an acid generator (A-3) and 3 parts by weight of Pentamethoxy Red as an acid discoloring agent were dissolved in 18.0 parts by weight of a solvent of ethyl acetate/MEK (4/1), then the resulting solution was mixed with 36 g of an aqueous solution of 4% PVA (manufactured by Kuraray Co., Ltd., 205), and the mixture was emulsified using a homogenizer at 10,000 rpm for 10 minutes. After then, while stirring the emulsion at 60° C. for 90 minutes, ethyl acetate and MEK were evaporated, and thereby fine particles having an average particle size of 0.2 μm were obtained. The concentration of solids was 15% by weight.

(P-3)

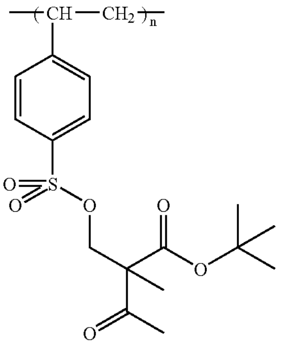

(A-3)

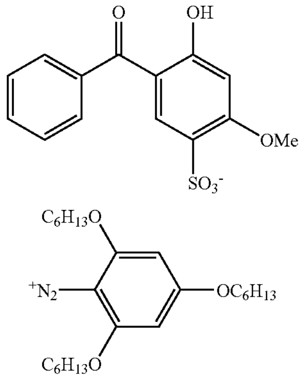

-continued (I-33)

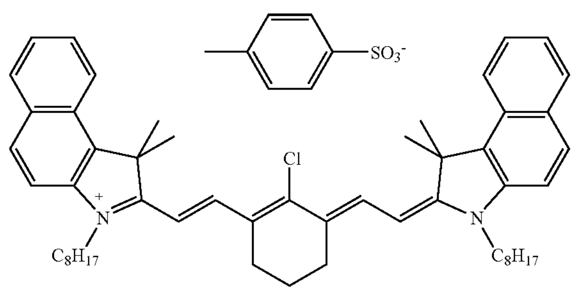

(Preparation and Evaluation of Lithographic Printing Plate Precursor)

A photosensitive-thermosensitive layer was formed by applying on the support prepared in Example 1 a coating solution for photosensitive-thermosensitive layer (5) of the following composition with a wire bar and drying at 80° C. for 60 seconds. The amount of coating was 1.0 g/$m^2$.

| <Composition of coating solution for photosensitive-thermosensitive layer (5)> (pbw = parts by weight) | |
|---|---|
| Infrared absorbent (D-1) | 2 pbw |
| Radical initiator (I-1) | 10 pbw |
| Dipentaerythritol hexaacrylate (NK Ester A-DPH, Shin-Nakamura Chemical Corp.) | 55 pbw |
| Binder polymer (B-1) | 37 pbw |
| Fluorosurfactant (W-1) | 1 pbw |
| Methyl ethyl ketone | 900 pbw |

Next, a coating solution for overcoat layer (3) of the following composition was applied on the photosensitive-thermosensitive layer with a wire bar such that the amount of coating after drying was 1.5 g/$m^2$ and dried at 100° C. for 90 seconds, and thus a lithographic printing plate precursor was prepared. The prepared lithographic printing plate precursor was subjected to the formation of colored image by exposure and beating of the entire plate as in Example 1, and was evaluated. The results are presented in Table 1.

| <Composition of water-soluble coating solution for overcoat layer (3)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Resin fine particle dispersion (1) | 1000 pbw |
| Pure water | 2150 pbw |

Example 5

(Preparation and Evaluation of Lithographic Printing Plate Precursor)

A photosensitive-thermosensitive layer was formed by applying on the support prepared in Example 1 a coating solution for photosensitive-thermosensitive layer (6) of the following composition with a wire bar and drying at 80° C. for 60 seconds. The amount of coating was 1.0 g/$m^2$. The prepared lithographic printing plate precursor was subjected to the formation of colored image by exposure and heating of the entire plate as in Example 1, and was evaluated. The results are presented in Table 1.

| <Composition of coating solution for photosensitive-thermosensitive layer (6)> (pbw = parts by weight) | |
|---|---|
| Infrared absorbent (D-1) shown above | 2 pbw |
| Radical initiator (I-1)shown above | 10 pbw |
| Dipentaerythritol hexaacrylate (NK Ester A-DPH, Shin-Nakamura Chemical Corp.) | 55 pbw |
| Binder polymer (B-1) shown above | 37 pbw |
| Base discoloring agent (C-11) shown below | 10 pbw |
| Base generator (A-11) shown below | 1 pbw |
| Base amplifier (P-11) shown below | 9 pbw |
| Fluorosurfactant (W-1) shown above | 6 pbw |
| Methyl ethyl ketone | 900 pbw |

Example 6

(Preparation of Microcapsule Dispersion (2))

In 16.5 parts by weight of ethyl acetate, 10 parts by weight of an adduct of trimethylolpropane and xylene diisocyanate at 1:3 (molar ratio) (Takenate D-110 N, manufactured by Mitsui-Takeda Chemical Co., Ltd., containing 2.5% by weight of ethyl acetate), 3 parts by weight of acid discoloring agent (C-11), 0.6 part by weight of the infrared absorbent (D-3) shown above, 1 part by weight of the acid generator (A-12) shown below, 2 parts by weight of the acid amplifier (P-11) described above, 1.5 parts by weight of tricresyl phosphate and 0.1 part by weight of an anionic surfactant (Pionin P-A41C, manufactured by Takemoto Oil & Fats Co., Ltd.) were dissolved to yield the oil phase.

Apart from this, 375 parts by weight of a 4% by weight aqueous solution of polyvinyl alcohol (PVA205, manufactured by Kuraray Co., Ltd.) was prepared as the aqueous phase.

The oil phase and the aqueous phase were mixed and emulsified using a homogenizer at 12,000 rpm for 10 minutes under water-cooling. To this emulsion, 24.5 parts by weight of water was added, and the mixture was stirred for 30 minutes at room temperature and for another 3 hours at 40° C. Subsequently, a microcapsule dispersion (2) was prepared by adding pure water so that the solids concentration of the dispersion was 15% by weight. The average particle size of the microcapsule was 0.30 μm.

(Preparation and Evaluation of Lithographic Printing Plate Precursor)

A photosensitive-thermosensitive layer was formed by applying on the support prepared in Example 1 a coating solution for photosensitive-thermosensitive layer (7) of the following composition with a wire bar and drying at 80° C. for 60 seconds. The amount of coating was 1.0 g/$m^2$.

| <Composition of coating solution for photosensitive-thermosensitive layer (7)> (pbw = parts by weight) | |
|---|---|
| Infrared absorbent (D-1) | 2 pbw |
| Radical initiator (I-1) | 10 pbw |

-continued

| <Composition of coating solution for photosensitive-thermosensitive layer (7)> (pbw = parts by weight) | |
|---|---|
| Dipentaerythritol hexaacrylate (NK Ester A-DPH, Shin-Nakamura Chemical Corp.) | 55 pbw |
| Binder polymer (B-1) | 37 pbw |
| Fluorosurfactant (W-1) | 1 pbw |
| Methyl ethyl ketone | 900 pbw |

Next, a coating solution for overcoat layer (4) of the following composition was applied on the photosensitive-thermosensitive layer with a wire bar such that the amount of coating after drying was 1.5 g/m$^2$ and dried at 100° C. for 90 seconds, and thus a lithographic printing plate precursor was prepared. The prepared lithographic printing plate precursor was subjected to the formation of colored image by exposure and heating of the entire plate as in Example 1, and was evaluated. The results are presented in Table 1.

| <Composition of water-soluble coating solution for overcoat layer (4)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Microcapsule dispersion (2) | 1000 pbw |
| Pure water | 2150 pbw |

Example 7

(Preparation and Evaluation of Lithographic Printing Plate Precursor)

A photosensitive-thermosensitive layer was formed by applying on the support prepared in Example 1 a coating solution for photosensitive-thermosensitive layer (7) of the composition described above with a wire bar and drying at 80° C. for 60 seconds. The amount of coating was 1.0 g/m$^2$. Net a coating solution for overcoat layer (5) of the following composition was applied on the photosensitive-thermosensitive layer with a wire bar such that the amount of coating after drying was 1.5 g/m$^2$ and dried at 100° C. for 90 seconds, and thus a lithographic printing plate precursor was prepared. The prepared lithographic printing plate precursor was subjected to the formation of colored image by exposure and beating of the entire plate as in Example 1, and was evaluated. The results are presented in Table 1.

| <Composition of coating solution for overcoat layer (5)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Base generator (A-12) | 1 pbw |
| Base discoloring agent (C-13) | 10 pbw |

-continued

| <Composition of coating solution for overcoat layer (5)> (pbw = parts by weight) | |
|---|---|
| Base amplifier (P-12) | 9 pbw |
| Pure water | 2150 pbw |

Example 8

(Preparation and Evaluation of Lithographic Printing Plate Precursor)

A photosensitive-thermosensitive layer was formed by applying on the support prepared in Example 1 a coating solution for photosensitive-thermosensitive layer (8) of the following composition with a wire bar and drying at 80° C. for 60 seconds. The amount of coating was 1.0 g/m$^2$. The prepared lithographic printing plate precursor was subjected to the formation of colored image by exposure and heating of the entire plate as in Example 1, and was evaluated. The results are presented in Table 1.

| <Composition of coating solution for photosensitive-thermosensitive layer (8)> (pbw = parts by weight) | |
|---|---|
| Infrared absorbent (D-1) | 2 pbw |
| Radical initiator (I-1) | 10 pbw |
| Dipentaerythritol hexaacrylate (NK Ester A-DPH, Shin-Nakamura Chemical Corp.) | 40 pbw |
| Binder polymer (B-1) | 16 pbw |
| Microcapsule dispersion (1) | 300 pbw |
| Fluorosurfactant (W-1) | 1 pbw |
| Methyl ethyl ketone | 100 pbw |
| 1-Methoxy-2-propanol | 850 pbw |
| Pure water | 200 pbw |

Example 9

(Preparation of Resin Fine Particle Dispersion (1))

Six parts by weight of a base amplifier polymer (P-14) of the following structure, 1.5 parts by weight of the infrared absorbent (I-33), 1 part by weight of a base generator (A-13) shown below and 3 parts by weight of a base discoloring agent (C-12) were dissolved in 18.0 parts by weight of a solvent of ethyl acetate/MEK (4/1), then the resulting solution was mixed with 36 g of an aqueous solution of 4% PVA (manufactured by Kuraray Co., Ltd., 205), and the mixture was emulsified using a homogenizer at 10,000 rpm for 10 minutes. After then, while stirring the emulsion at 60° C. for 90 minutes, ethyl acetate and MEK were evaporated, and thereby fine particles having an average particle size of 0.2 μm were obtained. The concentration of solids was 15% by weight.

(Preparation and Evaluation of Lithographic Printing Plate Precursor)

A photosensitive-thermosensitive layer was formed by applying on the support prepared in Example 1 a coating solution for photosensitive-thermosensitive layer (9) of the following composition with a wire bar and drying at 80° C. for 60 seconds. The amount of coating was 1.0 g/m$^2$.

| <Composition of coating solution for photosensitive-thermosensitive layer (9)> (pbw = parts by weight) | |
|---|---|
| Infrared absorbent (D-1) | 2 pbw |
| Radical initiator (I-1) | 10 pbw |
| Dipentaerythritol hexaacrylate (NK Ester A-DPH, Shin-Nakamura Chemical Corp.) | 55 pbw |
| Binder polymer (B-1) | 37 pbw |
| Fluorosurfactant (W-1) | 1 pbw |
| Methyl ethyl ketone | 900 pbw |

Next, a coating solution for overcoat layer (6) of the following composition was applied on the photosensitive-thermosensitive layer with a wire bar such that the amount of coating after drying was 1.5 g/$m^2$ and dried at 100° C. for 90 seconds, and thus a lithographic printing plate precursor was prepared The prepared lithographic printing plate precursor was subjected to the formation of colored image by exposure and heating of the entire plate as in Example 1, and was evaluated. The results are presented in Table 1.

| <Composition of water-soluble coating solution for overcoat layer (6)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Resin fine particle dispersion (2) | 1000 pbw |
| Pure water | 2150 pbw |

Comparative Example 1

(Preparation and Evaluation of Lithographic Printing Plate Precursor)

A lighotraphic printing plate precursor for Comparative Example 1 was obtained in the same manner as in example 1, except that a coating solution for photosensitive-thermosensitive layer (10) as described below was used. The amount of coating of the photosensitive-thermosensitive layer was 1.0 g/$m^2$. Thus obtained lithographic printing plate precursor was evaluated in the same manner as in Example 1. The results are presented in Table 1.

| <Composition of coating solution for photosensitive-thermosensitive layer (10)> (pbw = parts by weight) | |
|---|---|
| Infrared absorbent (D-1) | 2 pbw |
| Radical polymerization initiator (I-1) | 10 pbw |
| Dipentaerythritol hexaacrylate (NK Ester A-DPH, Shin-Nakamura Chemical Corp.) | 55 pbw |
| Binder polymer (B-1) | 37 pbw |
| Fluorosurfactant (W-1) | 6 pbw |
| Methyl ethyl ketone | 800 pbw |

TABLE 1

| Lithographic printing plate precursor | ΔE | Number of sheets for on-press development | Press life |
|---|---|---|---|
| Example 1 | 10 | 25 sheets | 11,000 sheets |
| Example 2 | 15 | 30 sheets | 13,000 shects |
| Example 3 | 13 | 25 sheets | 11,000 sheets |
| Example 4 | 19 | 25 sheets | 14,000 sheets |
| Example 5 | 9 | 25 sheets | 10,000 sheets |
| Example 6 | 12 | 25 sheets | 12,000 sheets |
| Example 7 | 11 | 30 sheets | 11,000 sheets |
| Example 8 | 9 | 25 sheets | 11,000 sheets |
| Example 9 | 14 | 25 sheets | 13,000 sheets |
| Comp. Ex. 1 | 4 | 25 sheets | 13,000 sheets |

(C-11)

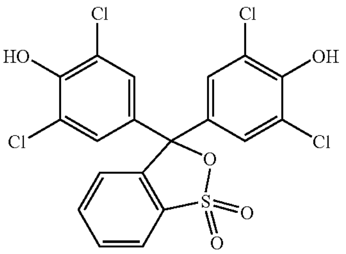

(C-12)

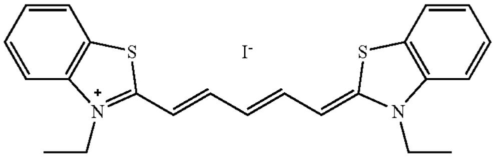

(C-13)

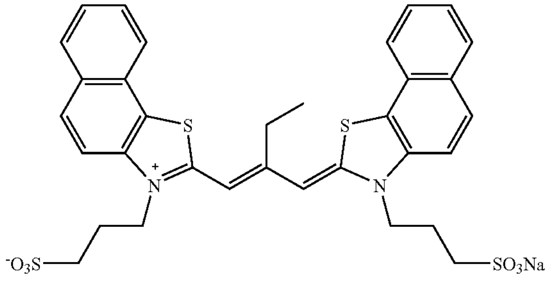

(A-11)

TABLE 1-continued

| Lithographic printing plate precursor | ΔE | Number of sheets for on-press development | Press life |
|---|---|---|---|
| 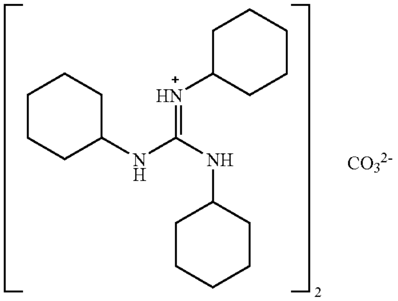 | | | |
| (A-12) 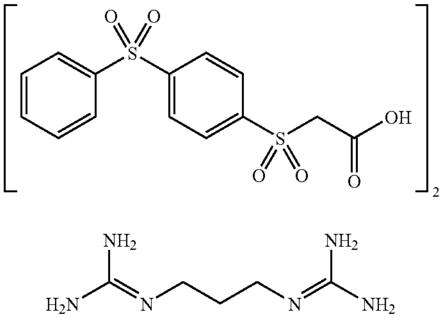 | | | |
| (A-13) 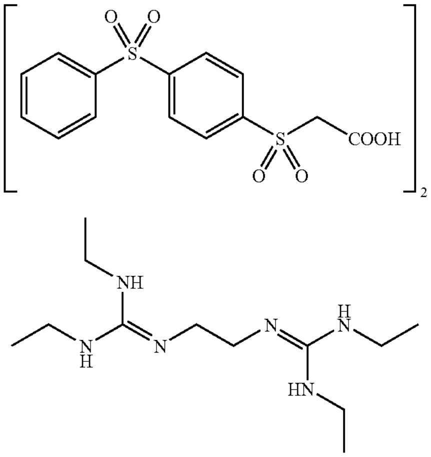 | | | |
| (P-11) 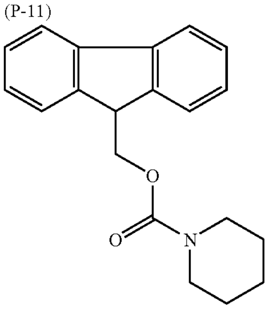 | | | |

TABLE 1-continued

| Lithographic printing plate precursor | ΔE | Number of sheets for on-press development | Press life |
|---|---|---|---|
| (P-12) 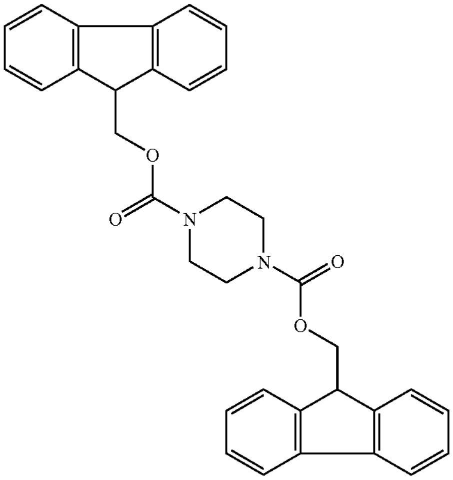 | | | |
| (P-13) 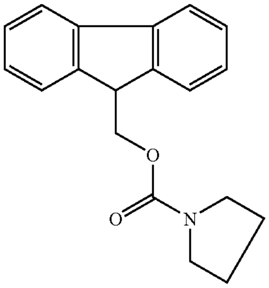 | | | |
| (P-14) 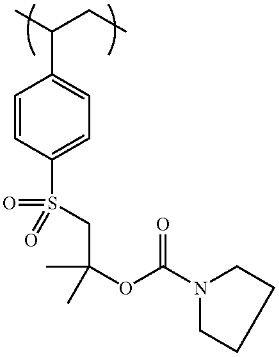 | | | |

Example 10

(Preparation of Lithographic Printing Plate Precursor)

A photosensitive-thermosensitive layer was formed by applying on the support prepared in Example 1 a coating solution for photosensitive-thermosensitive layer (11) of the following composition with a wire bar and drying at 80° C. for 60 seconds. The amount of coating was 1.0 g/m$^2$.

| <Composition of coating solution for photosensitive-thermosensitive layer (11)> (pbw = parts by weight) | |
|---|---|
| Infrared absorbent (D-1) | 2 pbw |
| Radical polymerization initiator (I-1) | 10 pbw |
| Dipentaerythritol hexaacrylate (NK Ester A-DPH, Shin-Nakamura Chemical Corp.) | 55 pbw |
| Binder polymer (B-1) | 37 pbw |
| Leuco Crystal Violet | 10 pbw |
| Thermodegradable radical generator precursor (1) shown below | 2 pbw |
| Fluorosurfactant (W-1) | 6 pbw |
| Methyl ethyl ketone | 900 pbw |

Thermodegradable radical generator precursor (I)

(1)

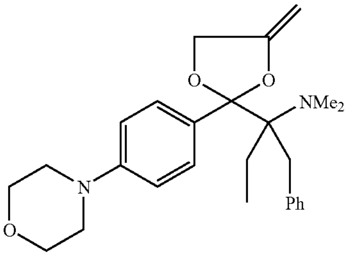

(Evaluation of Lithographic Printing Plate Precursor)

Thus obtained lithographic printing plate precursor was imagewise exposed to a testing pattern using a plate setter (Trendsetter 3244VX, manufactured by Creo) with beam intensity of 10.2 W and at a drum rotation speed of 150 rpm. Then, a 330 nm light was irradiated onto the entirety of this plate at 5 mW for 10 seconds, and the color-difference ΔE of the image area and non-image area formed by exposure was measured. Without a development treatment, this plate was loaded on the cylinder of a printing press (SPRINT S26, manufactured by Komori Corporation), and printing was performed by supplying a 4% dilution of a stock fountain solution (IF-102, Fuji Photo Film Co., Ltd.) as the fountain solution, then supplying a black ink (Values-G (black), manufactured by Dainippon Ink & Chemicals Industry Co., Ltd.) and further supplying paper. The number of paper sheets required in obtaining good printouts (on-press developability) and the number of paper sheets that can be printed without contamination in the image (press life) were evaluated. The results are presented in Table 2.

Example 11

(Preparation of Microcapsule Dispersion (3))

In 16.5 parts by weight of ethyl acetate, 10 parts by weight of an adduct of trimethylolpropane and xylene diisocyanate at 1:3 (molar ratio) (Takenate D-110 N, manufactured by Mitsui-Takeda Chemical Co., Ltd., containing 25% by weight of ethyl acetate), 5 parts by weight of Leuco Malachite Green, 0.6 part by weight of the infrared absorbent (D-3) shown above, 2 parts by weight of a thermodegradable radical generator precursor (2) shown below, 1.5 parts by weight of tricresyl phosphate and 0.1 part by weight of an anionic surfactant (Pionin P-A41C, manufactured by Takemoto Oil & Fats Co., Ltd.) were dissolved to yield the oil phase.

Apart from this, 375 parts by weight of a 4% by weight aqueous solution of polyvinyl alcohol (PVA205, manufactured by Kuraray Co., Ltd.) was prepared as the aqueous phase.

The oil phase and the aqueous phase were mixed and emulsified using a homogenizer at 12,000 rpm for 10 minutes wider water-cooling. To this emulsion, 24.5 parts by weight of water was added, and the mixture was stirred for 30 minutes at room temperature and for another 3 hours at 40° C. Subsequently, a microcapsule dispersion (3) was prepared by adding pure % water so that the solids concentration of the dispersion was 15% by weight. The average particle size of the microcapsule was 0.30 μm.

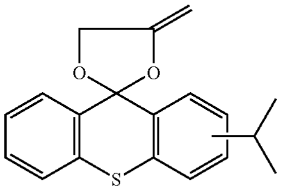

Thermodegradable radical generator pecursor (2)

(Preparation and Evaluation of Lithographic Printing Plate Precursor)

A photosensitive-thermosensitive layer was formed by applying on the support prepared in Example 1 a coating solution for photosensitive-thermosensitive layer (12) of the following composition with a wire bar and drying at 80° C. for 60 seconds. The amount of coating was 1.0 g/m$^2$.

| <Composition of coating solution for photosensitive-thermosensitive layer (12)> (pbw = parts by weight) | |
|---|---|
| Infrared absorbent (D-1) | 2 pbw |
| Radical polymerization initiator (I-1) | 10 pbw |
| Dipentaerythritol hexaacrylate (NK Ester A-DPH, Shin-Nakamura Chemical Corp.) | 55 pbw |
| Binder polymer (B-1) | 37 pbw |
| Fluorosurfactant (W-1) | 1 pbw |
| Methyl ethyl ketone | 900 pbw |

Next, a coating solution for water-soluble overcoat layer (7) of the following composition was applied on the above-described photosensitive-thermosensitive layer with a wire bar such that Be amount of coating after drying was 1.5 g/m$^2$ and dried at 100° C. for 90 seconds, and thus a lithographic printing plate precursor was prepared. The prepared lithographic printing plate precursor was evaluated in the same manner as in Example 10. The results are presented in Table 2.

| <Composition of coating solution for water-soluble overcoat layer (7)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Microcapsule dispersion (3) | 1000 pbw |
| Pure water | 2150 pbw |

Example 12

(Preparation and Evaluation of Lithographic Printing Plate Precursor)

A photosensitive-thermosensitive layer was formed by applying on the support prepared in Example 1 a coating solution for photosensitive-thermosensitive layer (13) of the following composition with a wire bar and drying at 80° C. for 60 seconds. The amount of coating was 1.0 g/$m^2$. The prepared lithographic printing plate precursor was evaluated in the same manner as in Example 10. The results are presented in Table 2.

| <Composition of coating solution for photosensitive-thermosensitive layer (13)> (pbw = parts by weight) | |
|---|---|
| Infrared absorbent (D-1) | 2 pbw |
| Radical polymerization initiator (I-1) | 10 pbw |
| Dipentaerythritol hexaacrylate | 40 pbw |
| (NK Ester A-DPH, Shin-Nakamura Chemical Corp.) | |
| Binder polymer (B-1) | 16 pbw |
| Microcapsule dispersion (3) | 300 pbw |
| Fluorosurfactant (W-1) | 1 pbw |
| Methyl ethyl ketone | 100 pbw |
| 1-Methoxy-2-propanol | 850 pbw |
| Pure water | 200 pbw |

Example 13

(Preparation of Microcapsule Dispersion (4))

In 16.5 parts by weight of ethyl acetate, 10 parts by weight of an addict of trimethylolpropane and xylene diisocyanate at 1:3 (molar ratio) (Takenate D-110 N, manufactured by Mitsui-Takeda Chemical Co., Ltd., containing 25% by weight of ethyl acetate), 5 parts by weight of Leuco Malachite Green, 0.6 part by weight of the infrared absorbent (D-3) shown above, 2 parts by weight of the thermodegradable radical generator precursor (2) shown above, 1 part by weight of the acid generator (A-1) shown below, 1.5 parts by weight of tricresyl phosphate and 0.1 part by weight of an anionic surfactant (Pionin P-A41C, manufactured by Takemoto Oil & Fats Co., Ltd.) were dissolved to yield the oil phase.

Apart from this, 375 parts by weight of a 4% by weight aqueous solution of polyvinyl alcohol (PVA205, manufactured by Kuraray Co., Ltd.) was prepared as the aqueous phase.

The oil phase and the aqueous phase were mixed and emulsified using a homogenizer at 12,000 rpm for 10 minutes under water-cooling. To this emulsion, 24.5 parts by weight of water was added, and the mixture was stirred for 30 minutes at room temperature and for another 3 hours at 40° C. Subsequently, a microcapsule dispersion (4) was prepared by adding pure water so that the solids concentration of the dispersion was 15% by weight. The average particle size of the microcapsule was 0.30 μm.

Acid generator (A-1)

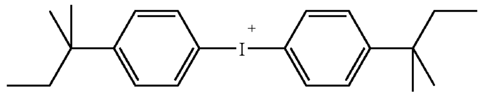

$PF_6^-$
(A-1)

(Preparation and Evaluation of Lithographic Printing Plate Precursor)

A photosensitive-thermosensitive layer was formed by applying on the support prepared in Example 1 the coating solution for photosensitive-thermosensitive layer (11) as described above with a wire bar and drying at 80° C. for 60 seconds. The amount of coating was 1.0 g/$m^2$.

Next, a coating solution for overcoat layer (8) of the following composition was applied on the photosensitive-thermosensitive layer with a wire bar such that the amount of coating after drying was 1.5 g/$m^2$ and dried at 100° C. for 90 seconds, and thus a lithographic printing plate precursor was prepared. The prepared lithographic printing plate precursor was evaluated in the same manner as in Example 10, and was evaluated. The results are presented in Table 2.

| <Composition of coating solution for water-soluble overcoat layer (8)> (pbw = parts by weight) | |
|---|---|
| Polyvinyl alcohol (degree of Saponification: 98 mol %, degree of polymerization: 500) | 95 pbw |
| Polyvinylpyrrolidone/vinyl acetate Copolymer (Luvitec VA 64W, BASF) | 4 pbw |
| Nonionic surfactant (EMALEX710, Nippon Emulsion Co., Ltd.) | 1 pbw |
| Microcapsule dispersion (4) | 1000 pbw |
| Pure water | 2150 pbw |

Comparative Example 2

The lithographic printing plate precursor prepared in Comparative Example 1 was evaluated in the same manner as in Example 10. The results are presented in Table 2.

TABLE 2

| Lithographic printing plate precursor | ΔE | Number of sheets for on-press development | Press life |
|---|---|---|---|
| Example 10 | 10 | 25 sheets | 11,000 sheets |
| Example 11 | 15 | 30 sheets | 13,000 sheets |
| Example 12 | 13 | 25 sheets | 11,000 sheets |
| Example 13 | 18 | 25 sheets | 13,000 sheets |
| Comp. Ex. 2 | 4 | 25 sheets | 13,000 sheets |

What is claimed is:

1. A method for colored image formation, which comprises:

exposing a lithographic printing plate precursor to laser light;

heating the entire lithographic printing plate to form a colored image;

on press printing without passing through a development processing step after recording the image, or on press printing after recording an image on press without passing through a development processing step;

wherein the lithographic printing precursor comprises a support and a photosensitive-thermosensitive layer capable of recording an image by exposure to an infrared laser, the photosensitive-thermosensitive layer containing an infrared absorbent and a discoloring material that undergoes color change upon exposure, and wherein the photosensitive-thermosensitive layer is capable of recording an image by exposure to an infrared laser.

2. A method for colored image formation, which comprises:

exposing a lithographic printing plate precursor to laser light;

exposing the entire lithographic printing plate to form a colored image;

on press printing without passing through a development processing step after recording the image, or on press printing after recording an image on press without passing through a development processing step;

wherein the lithographic printing precursor comprises a support and a photosensitive-thermosensitive layer capable of recording an image by exposure to an infrared laser, the photosensitive-thermosensitive layer containing an infrared absorbent and a discoloring material that undergoes color change upon exposure, and wherein the photosensitive-thermosensitive layer is capable of recording an image by exposure to an infrared laser.

3. The method for colored image formation according to claim 1, wherein the photosensitive-thermosensitive layer comprises a radical-polymerizable compound and a radical polymerization initiator.

4. The method for colored image formation according to claim 2, wherein the photosensitive-thermosensitive layer comprises a radical-polymerizable compound and a radical polymerization initiator.

5. The method for colored image formation according to claim 1, which comprises a radical-polymerizable compound and a radical polymerization initiator between the support and the photosensitive-thermosensitive layer.

6. The method for colored image formation according to claim 2, which comprises a radical-polymerizable compound and a radical polymerization initiator between the support and the photosensitive-thermosensitive layer.

7. The method for colored image formation according to claim 1, wherein the discoloring material contains an acid generator, an acid amplifier and an acid discoloring agent.

8. The method for colored image formation according to claim 1, wherein the discoloring material contains a base generator, a base amplifier and a base discoloring agent.

9. The method for colored image formation according to claim 2, wherein the discoloring material contains a radical discoloring agent and a thermodegradable radical generator precursor.

10. The method of claim 1, wherein exposing a lithographic printing plate precursor to a laser light is image-wise exposure.

11. The method of claim 1, further comprising printing by attaching a fountain solution to the surface of the support and attaching ink to the photosensitive-thermosensitive layer.

12. The method of claim 1, comprising the additional step of developing the product to expose the surface of the support.

13. The method of claim 2, wherein exposing a lithographic printing plate precursor to a laser light is image-wise exposure.

14. The method of claim 2, further comprising printing by attaching a fountain solution to the surface of the support and attaching ink to the photosensitive-thermosensitive layer.

15. The method of claim 2, comprising the additional step of developing the product to expose the surface of the support.

16. The method of claim 11, wherein the fountain solution is IF-102.

17. The method of claim 14, wherein the fountain solution is IF-102.

* * * * *